(12) United States Patent
Kim et al.

(10) Patent No.: US 11,229,128 B2
(45) Date of Patent: Jan. 18, 2022

(54) DISPLAY DEVICE

(71) Applicant: LG ELECTRONICS INC., Seoul (KR)

(72) Inventors: Hoyoung Kim, Seoul (KR); Haesuk Choi, Seoul (KR); Kyeongdong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/891,878

(22) Filed: Jun. 3, 2020

(65) Prior Publication Data

US 2020/0396850 A1 Dec. 17, 2020

(30) Foreign Application Priority Data

Jun. 14, 2019 (KR) .......................... 10-2019-0070939

(51) Int. Cl.
*H05K 7/02* (2006.01)
*H05K 7/04* (2006.01)
(Continued)

(52) U.S. Cl.
CPC .......... *H05K 5/0017* (2013.01); *H05K 5/0217* (2013.01)

(58) Field of Classification Search
USPC ........................................ 361/807, 809, 810
See application file for complete search history.

(56) References Cited

U.S. PATENT DOCUMENTS 8,376,581 B2  2/2013 Auld et al.
10,410,549 B1 *  9/2019 Kim ...................... G06F 1/1601
(Continued)

FOREIGN PATENT DOCUMENTS

EP          3339671       6/2018
JP        2010078684      4/2010
KR      1020190054430    5/2019

OTHER PUBLICATIONS

PCT International Application No. PCT/KR2020/006797, International Search Report dated Aug. 28, 2020, 3 pages.
(Continued)

*Primary Examiner* — Hung S. Bui
(74) *Attorney, Agent, or Firm* — Lee Hong Degerman Kang & Waimey

(57) ABSTRACT

A display device is provided. The display device includes a housing; a roller disposed inside the housing; a display unit configured to be rolled around the roller; a first arm and a second arm, wherein one end of the first arm is rotatably coupled to the display unit and another end of the first arm is rotatably coupled to the second arm; a lead screw disposed inside the housing; a slider configured to move along the lead screw according to a rotation of the lead screw; and a rod comprising one end rotatably coupled to the slider and another end rotatably coupled to the second arm such that the second arm is raised and lowered based on movement of the slider along the lead screw; wherein the rod and the second arm are rotatably coupled via at least a first connection member and a first intermediate member, wherein the first connection member is configured to pass through the second arm and the rod and the first intermediate member is configured to surround a portion of the first connection member which passes through the second arm.

12 Claims, 74 Drawing Sheets

(51) Int. Cl.
*H05K 5/00* (2006.01)
*H05K 5/02* (2006.01)

(56) References Cited

U.S. PATENT DOCUMENTS

| | | |
|---|---|---|
| 2012/0002357 A1 | 1/2012 | Auld et al. |
| 2016/0161983 A1 | 6/2016 | Lee et al. |
| 2018/0114471 A1* | 4/2018 | Park .................. G09G 3/3233 |
| 2018/0160554 A1 | 6/2018 | Kang et al. |

OTHER PUBLICATIONS

Intellectual Property Office of India Application Serial No. 202034023338, Office Action dated Nov. 25, 2021, 6 pages.

* cited by examiner

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2019-0070939, filed on Jun. 14, 2019, the contents of which are hereby incorporated by reference herein in its entirety.

BACKGROUND OF THE INVENTION

Field of the Invention

The present disclosure relates to a display device.

Description of the Related Art

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to the various demands for the display devices.

Among the various display devices, a display device using an organic light emitting diode (OLED) is advantageous in that it has better luminance characteristic and better viewing angle characteristic than a liquid crystal display, and has a ultra-thin profile because it does not require a backlight unit.

A flexible display can be bent or rolled on a roller. A display device rolled or unrolled from the roller using the flexible display can be implemented, if necessary or desired.

Recently, a structural study on the flexible display has been actively carried out.

SUMMARY OF THE INVENTION

An object of the present disclosure is to address the above-described and other problems.

Another object of the present disclosure is to reduce a noise that may occur when a display device is driven.

Another object of the present disclosure is to reduce a vibration that may occur when a display device is driven.

Another object of the present disclosure is to improve durability of a display device. To achieve the above-described and other objects, in one aspect of the present disclosure, there is provided a display device comprising a housing; a roller disposed inside the housing; a display unit configured to be rolled around the roller; a first arm and a second arm, wherein one end of the first arm is rotatably coupled to the display unit and another end of the first arm is rotatably coupled to the second arm; a lead screw disposed inside the housing; a slider configured to move along the lead screw according to a rotation of the lead screw; and a rod comprising one end rotatably coupled to the slider and another end rotatably coupled to the second arm such that the second arm is raised and lowered based on movement of the slider along the lead screw; wherein the rod and the second arm are rotatably coupled via at least a first connection member and a first intermediate member, wherein the first connection member is configured to pass through the second arm and the rod and the first intermediate member is configured to surround a portion of the first connection member which passes through the second arm.

According to another aspect of the present disclosure, wherein the rod and the slider are rotatably coupled via at least a second connection member and a second intermediate member, wherein the second connection member is configured to pass through the rod and a portion of the slider and the second intermediate member is configured to surround a portion of the second connection member which passes through the portion of the slider.

According to another aspect of the present disclosure, wherein the first connection member comprises a body configured to pass through an opening at the second arm and a first opening at the rod; and a head connected to the body and having a diameter greater than a diameter of the body, wherein the first intermediate member has a ring shape, wherein an inner circumferential surface of the first intermediate member contacts an outer circumferential surface of the body of the first connection member, and wherein an outer circumferential surface of the first intermediate member contacts an inner circumferential surface of the opening at the second arm.

According to another aspect of the present disclosure, wherein the first intermediate member comprises a first flange positioned between the second arm and the rod; and a first groove formed at the outer circumferential surface and positioned to face the inner circumferential surface of the opening at the second arm.

According to another aspect of the present disclosure, wherein the first groove is configured to accommodate a lubricant.

According to another aspect of the present disclosure, wherein the first flange is accommodated within the opening at the second arm.

According to another aspect of the present disclosure, the display device may further comprise a first fixing member configured to pass through an end of the body of the first connection member opposite the head.

According to another aspect of the present disclosure, wherein the portion of the slider is a rod mount extending from a body of the slider, wherein the second connection member comprises a second connection member body configured to pass through a second opening at the rod and an opening at the rod mount; and a second connection member head connected to the second connection member body and having a diameter greater than a diameter of the second connection member body, wherein the second intermediate member has a ring shape, wherein an inner circumferential surface of the second intermediate member contacts an outer circumferential surface of the second connection member body, and wherein an outer circumferential surface of the second intermediate member contacts an inner circumferential surface of the opening at the rod mount.

According to another aspect of the present disclosure, wherein the second intermediate member comprises a second flange positioned at an end of the second intermediate member away from the second connection member head and the rod; and a second groove formed at the outer circumferential surface of the second intermediate member and positioned to face the inner circumferential surface of the opening at the rod mount.

According to another aspect of the present disclosure, wherein the second groove is configured to accommodate a lubricant.

According to another aspect of the present disclosure, wherein the second flange is accommodated within the opening at the rod mount.

According to another aspect of the present disclosure, the display device may further comprise a second fixing member configured to pass through an end of the second connection member body opposite the second connection member head.

Effects of a display device according to the present disclosure are described as follows.

According to at least one aspect of the present disclosure, the present disclosure can reduce a noise that may occur when a display device is driven.

According to at least one aspect of the present disclosure, the present disclosure can reduce a vibration that may occur when a display device is driven.

According to at least one aspect of the present disclosure, the present disclosure can improve durability of a display device.

Further scope of applicability of the present disclosure will become apparent from the detailed description given blow. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The accompanying drawings, that may be included to provide a further understanding of the disclosure and are incorporated in and constitute a part of the disclosure, illustrate embodiments of the disclosure and together with the description serve to explain various principles of the disclosure.

DETAILED DESCRIPTION OF THE EMBODIMENTS

Reference will now be made in detail to embodiments of the disclosure, examples of which are illustrated in the accompanying drawings. Wherever possible, the same reference numbers will be used throughout the drawings to refer to the same or like parts. In general, a suffix such as "module" and "unit" may be used to refer to elements or components. Use of such a suffix herein is merely intended to facilitate description of the disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features, and it should be understood that the embodiments presented herein are not limited by the accompanying drawings. As such, the present disclosure should be construed to extend to any alterations, equivalents and substitutes in addition to those which are particularly set out in the accompanying drawings.

Hereinafter, embodiments of the disclosure are described using an organic light emitting diode (OLED) display panel as an example of a display panel. However, embodiments of the disclosure are not limited thereto. For example, a liquid crystal display (LCD) panel, a plasma display panel (PDP), and a field emission display (FED) panel may be used.

FIGS. 1 to 17K illustrate configuration of a display device related to the present disclosure.

Figure 1:
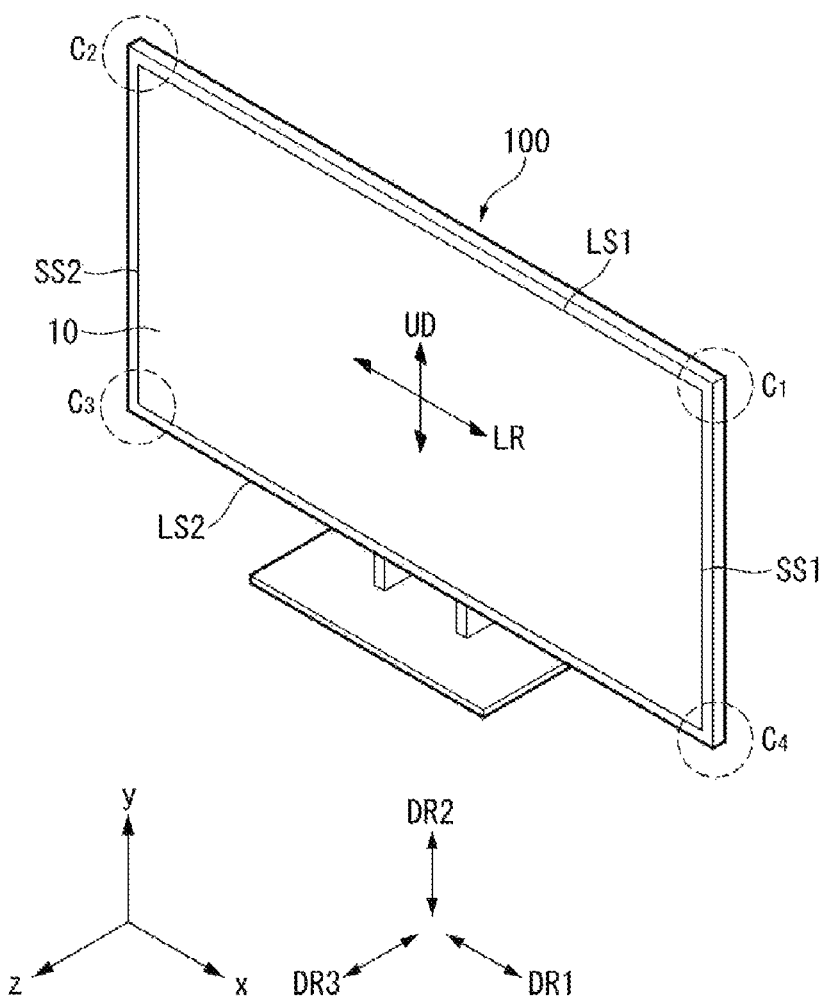
FIGS. 1 to 17K illustrate configuration of a display device related to the present disclosure.

As shown in FIG. 1, it is described below that a display panel 10 may include a first long side LS1, a second long side LS2 opposite the first long side LS1, a first short side SS1 adjacent to the first long side LS1 and the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Embodiments of the disclosure illustrate and describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

It is described below that a first direction DR1 may be a direction parallel to the long sides LS1 and LS2 of the display panel 10, and a second direction DR2 may be a direction parallel to the short sides SS1 and SS2 of the display panel 10.

A third direction DR3 may be a direction vertical to the first direction DR1 and/or the second direction DR2.

In embodiments disclosed herein, the first direction DR1 and the second direction DR2 may be commonly referred to as a horizontal direction. Further, the third direction DR3 may be referred to as a vertical direction.

In addition, a side or a surface, on which a display device 100 displays an image, may be referred to as a front side or a front surface. When the display device 100 displays the image, a side or a surface, at which the image cannot be observed, may be referred to as a rear side or a rear surface. When the display device 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

+x-axis direction may be referred to as a right direction, and −x-axis direction may be referred to as a left direction. +y-axis direction may be referred to as an upward direction, and −y-axis direction may be referred to as a downward direction. +z-axis direction may be referred to as a frontward direction, and −z-axis direction may be referred to as a rearward direction.

The x-axis direction may be a direction parallel to the first direction. The y-axis direction may be a direction parallel to the second direction. The z-axis direction may be a direction parallel to the third direction.

Figure 2:
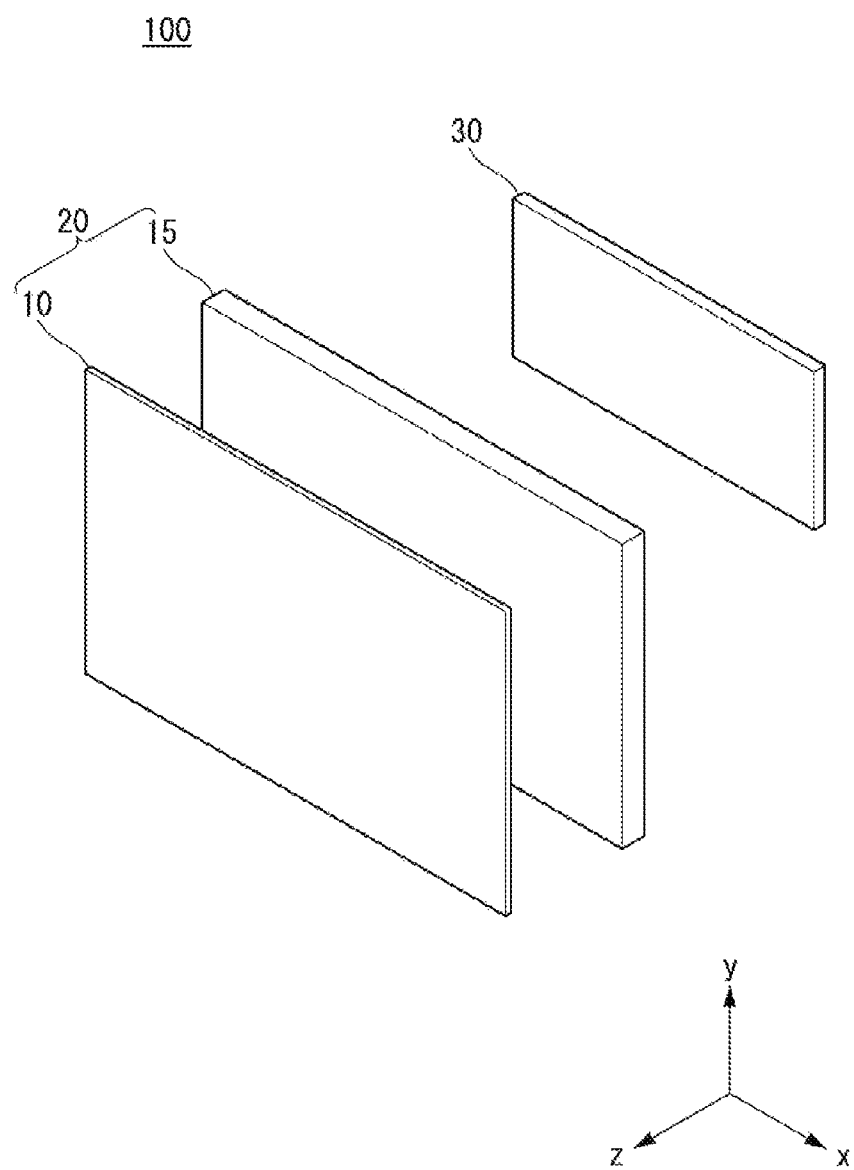

Referring to FIG. 2, the display device 100 according to the present disclosure may include a display unit 20 and a housing 30.

The display unit 20 may include the display panel 10 and a module cover 15. The display panel 10 may be provided on a front surface of the display device 100 and may display an image. The display panel 10 may divide an image into a plurality of pixels and output the image by controlling the light emission in accordance with color, brightness, and chroma of each pixel. The display panel 10 may be divided into an active area on which an image is displayed, and an inactive area in which no image is displayed.

If the display panel 10 has flexibility, the display panel 10 may be referred to as a flexible display panel 10.

The display panel 10 may have a rectangular shape. However, embodiments of the disclosure are not limited thereto. For example, the display panel 10 may have a shape which has a predetermined curvature at an edge. The display panel 10 may be an OLED display panel. Other display panels may be used. For example, a liquid crystal display panel may be used.

The module cover 15 may be provided on a rear surface of the display panel 10. The module cover 15 may be directly attached to the display panel 10. A size of the module cover 15 may be equal to or greater than a size of the display panel 10.

The module cover 15 may support the rear surface of the display panel 10. Hence, the module cover 15 may include a lightweight material with high rigidity. For example, the module cover 15 may include aluminum or include stainless material.

The housing 30 may be provided on a rear surface of the display unit 20. Namely, the housing 30 may be provided on a rear surface of the module cover 15. The housing 30 may shield at least one printed circuit board (PCB). Namely, the housing 30 may cover at least one PCB attached to the rear surface of the module cover 15. A coupling structure and a coupling method of at least one PCB are described in detail below.

The housing 30 may receive electromagnetic waves emitted from at least one PCB. Hence, although not shown, the housing 30 may include an inner housing made of a conductive material and an outer housing covering the inner housing. However, embodiments of the disclosure are not limited thereto. For example, the housing 30 may be formed as one body made of a conductive material.

Figure 3:
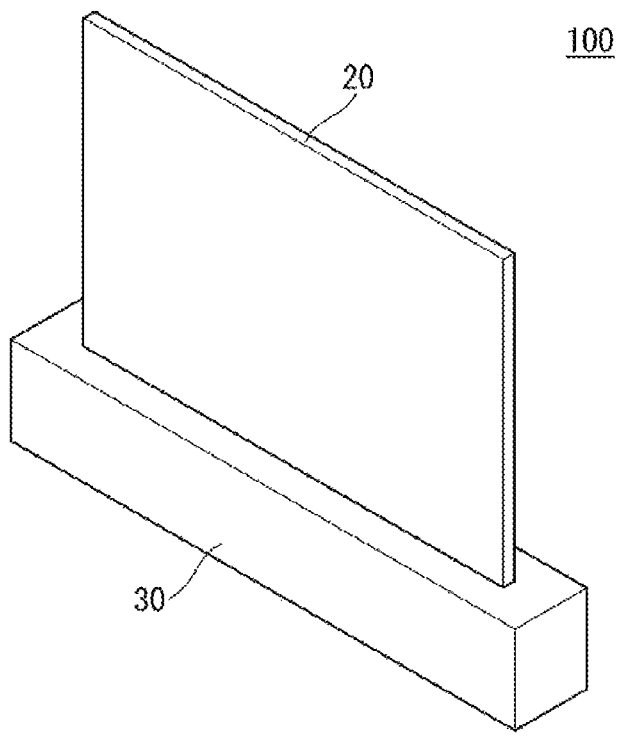
Figure 3:
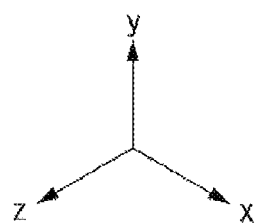

Referring to FIG. 3, in the display device 100 according to the embodiment of the disclosure, the housing 30 may be positioned under the display unit 20. More specifically, the housing 30 may have a shape surrounding a lower part of the display unit 20. Namely, the housing 30 may be configured not to expose various driving devices or driving circuits positioned inside the housing 30 to the outside.

A width of the housing 30 in the first and third directions may be greater than a width of the display unit 20 in the first and third directions in order to protect the display unit 20 therein. A width of the housing 30 in the second direction may be less than a width of the display unit 20 in the second direction.

In the display device 100 according to the present disclosure, the housing 30 may not be positioned in the active area of the display unit 20.

Figure 4:
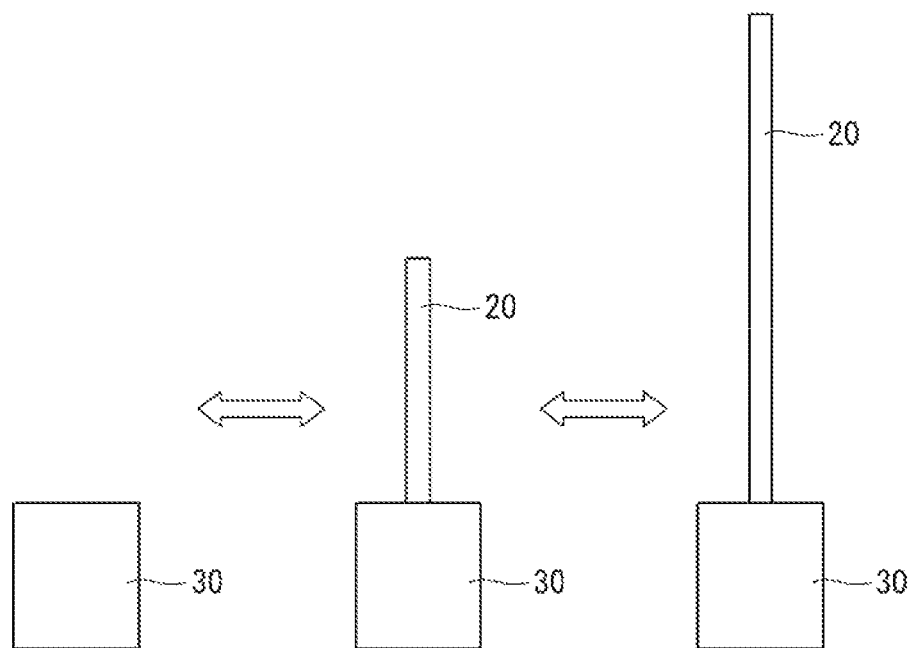

Referring to FIG. 4, the display device 100 according to the embodiment of the disclosure may be in a first state, in which the active area of the display unit 20 is positioned inside the housing 30, or a second state in which the active area of the display unit 20 is exposed to the outside of the housing 30.

When the display device 100 is in the first state, the active area of the display unit 20 may be positioned inside the housing 30. Namely, the display unit 20 may be shielded by the housing 30 in the first state.

When the display device 100 is in the second state, the active area of the display unit 20 may be exposed to the outside of the housing 30. Namely, at least a portion of the display unit 20 may protrude to an upper part of the housing 30 in the second state.

Although not shown, the display unit 20 may change from the first state to the second state by a roller positioned inside the housing 30. More specifically, the display unit 20 may change from the first state, in which the display unit 20 is rolled on the roller, to the second state in which the display unit 20 is unrolled from the roller and is exposed to the outside. On the contrary, the display unit 20 may change from the second state to the first state when the display unit 20 is rolled on the roller. A structure and an operation method of the roller and the display unit 20 are described in detail below.

The display unit 20 of the display device 100 according to the present disclosure may be in the first state or the second state. Hence, only when the display device 100 is used, the display unit 20 can be exposed to the outside of the housing 30, thereby saving the space.

Figure 5:
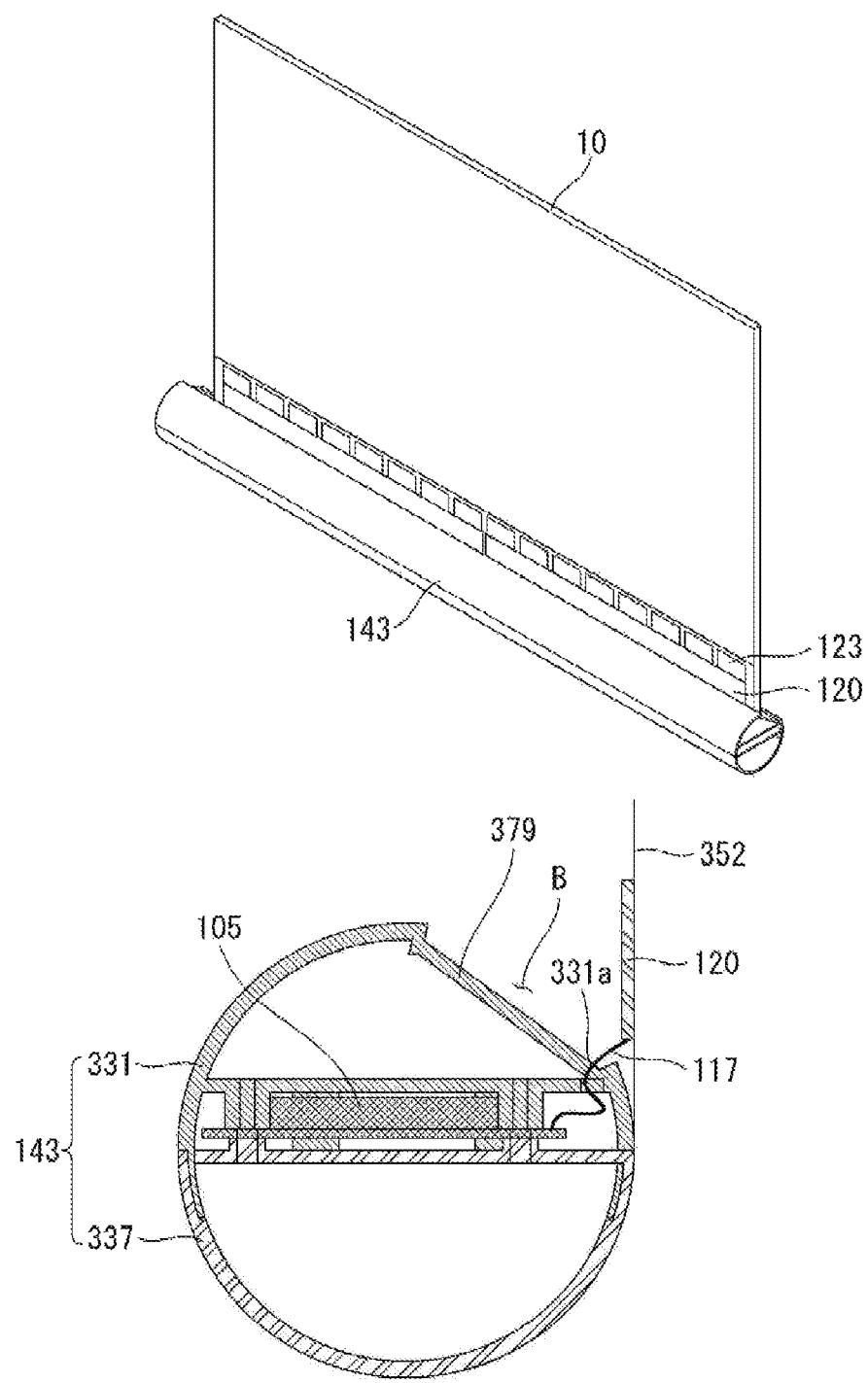

Referring to FIG. 5, a panel roller 143 may be connected to one end of the display panel 10. The panel roller 143 may roll or unroll the display panel 10 so that the display panel 10 is in the first state or the second state. The panel roller 143 may be referred to as a roller 143.

In the display device according to the present disclosure, at least one source PCB 120 may be positioned on at least a portion of a front surface of the display panel 10. For example, a plurality of source PCBs 120 may be positioned to be spaced apart from one another.

Signal lines may be positioned on at least one source PCB 120 and may transmit digital video data and timing control signals received from a timing controller board 105. The source PCB 120 may be connected to the display panel 10 by a source chip-on film (COF) 123. The source COF 123 connected to one side of the source PCB 120 may be extended to the active area of the display panel 10 and connected to the display panel 10.

A seating portion 379 may be positioned on an outer circumference of the panel roller 143. The seating portion 379 may form an accommodation space B as a portion of the outer circumference of the panel roller 143 is stepped. The seating portion 379 may be positioned at a contact portion between the source PCB 120 and the panel roller 143 while the panel roller 143 is rolled or unrolled. The seating portion 379 may have a shape in which at least a portion of the outer circumference of the panel roller 143 is recessed.

When the panel roller 143 is rolled, the source PCB 120 may be accommodated in the accommodation space B of the seating portion 379. Hence, even if the panel roller 143 is rolled, the source PCB 120 cannot be damaged.

The timing controller board 105 may be mounted inside the panel roller 143. A flexible flat cable (FFC) 117 may electrically connect the timing controller board 105 to the source PCB 120.

The panel roller 143 may include an upper panel roller 331 and a lower panel roller 337. The upper panel roller 331 and the lower panel roller 337 may be coupled to each other by a screw. The timing controller board 105 may be mounted between the upper panel roller 331 and the lower panel roller 337. The screw may mutually couple the upper panel roller 331, the lower panel roller 337, and the timing controller board 105. The FFC 117 may be connected to the timing controller board 105 and the source PCB 120 through a hole 331a positioned in the upper panel roller 331.

Because the timing controller board 105 rotates together with the panel roller 143, the FFC 117 may not be twisted. Further, the space can be saved because the timing controller board 105 is mounted inside the panel roller 143.

Figure 6:
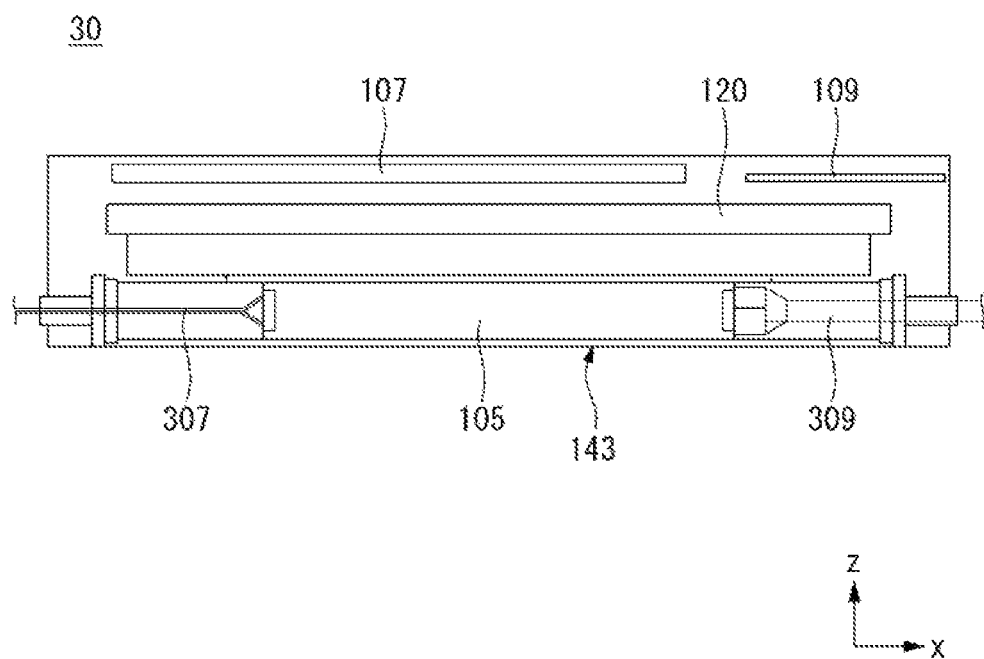

Referring to FIG. 6, with respect to the center of the housing 30 in which the display panel moves up and down, the timing controller board 105 may be mounted on the panel roller 143 at one side of the housing 30, and a power supply board 107 and a main board 109 may be positioned at other side of the housing 30.

The timing controller board 105 may be connected to the power supply board 107 and the main board 109. The timing controller board 105 may be connected to the power supply board 107 and the main board 109 through a wiring electrode. The wiring electrode may include a first wiring electrode 307 connecting the timing controller board 105 to the power supply board 107 and a second wiring electrode 309 connecting the timing controller board 105 to the main board 109.

For example, a plurality of first wiring electrodes 307 may be disposed. The first wiring electrode 307 may be in a circular shape. The first wiring electrode 307 may connect the timing controller board 105 to the power supply 107 through an opening in the center of a rotation axis of the panel roller 143.

The second wiring electrode 309 may use the FFC 117 connected to the timing controller board 105 and the source PCB 120. The second wiring electrode 309 may connect the timing controller board 105 to the main board 109 through an opening in the center of the rotation axis of the panel roller 143.

The first wiring electrode 307 and the second wiring electrode 309 may be positioned on the opposite sides of the timing controller board 105. An opening through which the first wiring electrode 307 passes and an opening through which the second wiring electrode 309 passes may be positioned on the opposite sides.

In the display device according to the present disclosure, the timing controller board 105 may be mounted on the panel roller 143, and the power supply board 107 and the main board 109 may be positioned on the opposite sides of the display panel. Hence, an inner space of the housing 30 can be saved.

Figure 7:
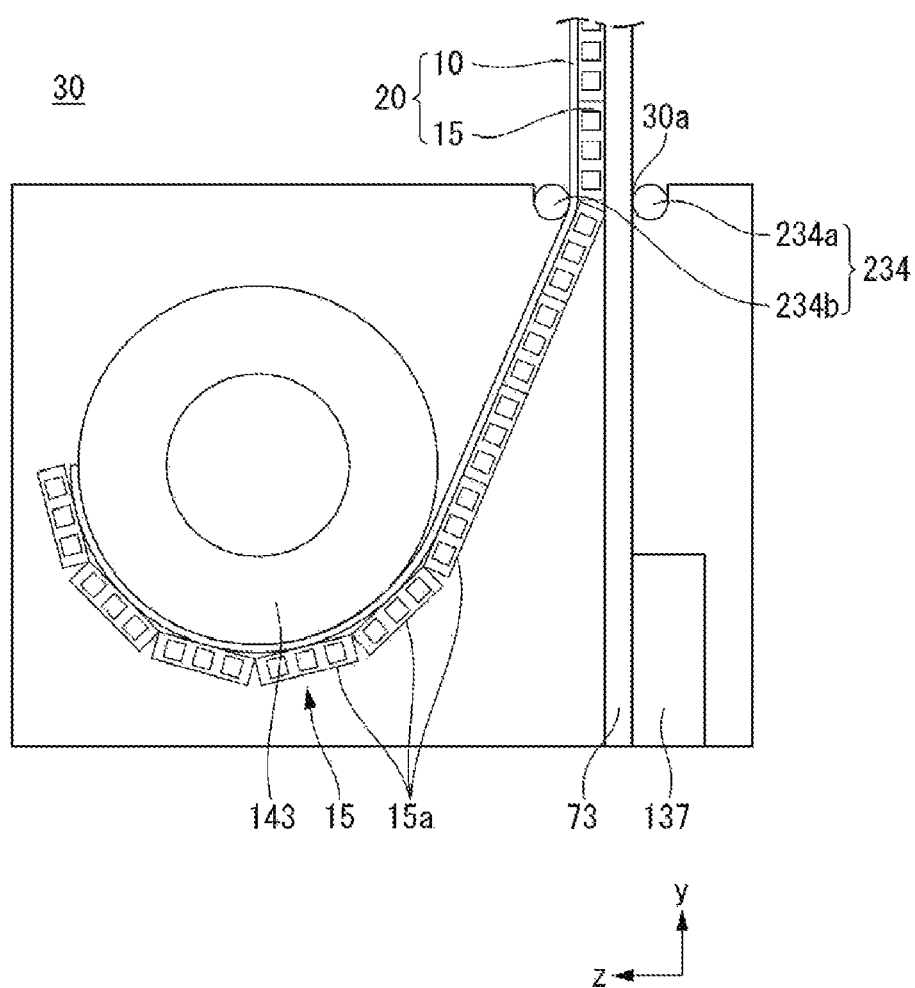

Referring to FIG. 7, the display device according to the present disclosure may include the panel roller 143, a motor assembly 137, and a link 73 inside the housing 30.

The link 73 may be referred to as a supporter 73.

The module cover 15 may include a plurality of segments 15a. The segment 15a may be referred to as an apron.

The panel roller 143 may be positioned in front of a portion of the housing 30 in which the display unit 20 moves up and down. The panel roller 143 may simultaneously roll and unroll the display panel 10 and the module cover 15.

The link 73 may be installed in the housing 30. The link 73 may perform a support function so that the display panel 10 and the module cover 15 can move up or down. The link 73 may move up or down an upper bar 75 (see FIG. 9A) coupled to the upper parts of the module cover 15 and the display panel 10.

An upper end of the display unit 20 may be connected to the upper bar, and a lower end of the display unit 20 may be connected to the panel roller 143. A portion between the upper end and the lower end of the display unit 20 may easily bend. The link 73 may support the module cover 15 at the rear surface of the module cover 15 so that the module cover 15 does not bend.

A motor assembly 137 may be positioned in a portion to which the link 73 is connected. The motor assembly 137 may be driven so that the link 73 moves up or down. The motor assembly 137 may receive an electrical signal and convert the electrical signal into a physical force. The motor assembly 137 may transfer rotation energy to the link 73 and changes form the first state to the second state. A structure and a driving principle of the motor assembly 137 are described in detail below.

A guide bar 234 may be positioned at an entrance 30a at which the link 73 moves up and down inside the housing 30. The guide bar 234 may include first and second guide bars 234a and 234b. The entrance 30a of the housing 30 may be formed between the first and second guide bars 234a and 234b. The first and second guide bars 234a and 234b may face each other with the link 73 interposed therebetween. For example, the first guide bar 234a may be positioned behind the link 73, and the second guide bar 234b may be positioned in front of the link 73.

The display device according to the present disclosure can simultaneously roll and unroll the display panel 10 and the module cover 15 using one roller. Hence, a thickness of the housing 30 can decrease.

Figure 8:
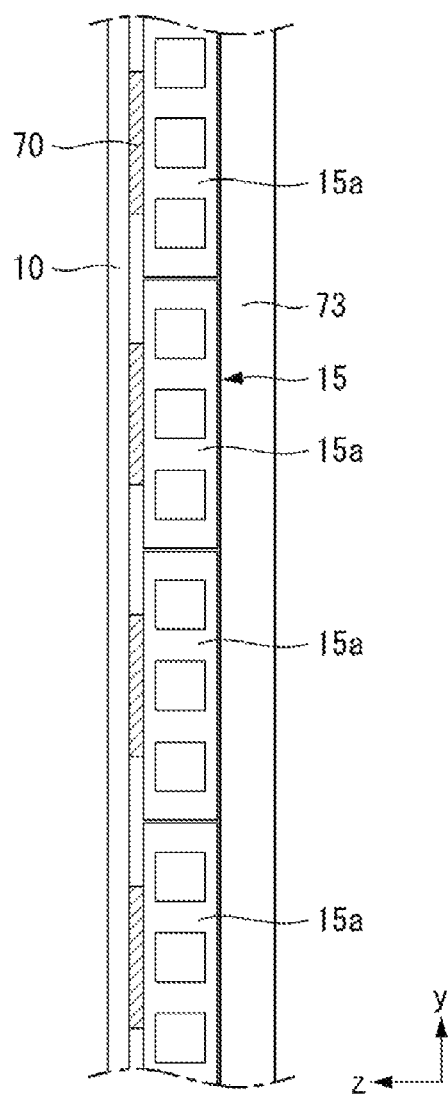

Referring to FIG. 8, the segments 15a may have a rectangular shape. The respective segments 15a may be spaced apart from each other in the y-axis direction and attached to the rear surface of the display panel 10. The module cover 15 may consist of the plurality of segments 15a and may be rolled or unrolled by the roller. The module cover 15 may include a plastic material or an aluminum material. Hence, the module cover 15 can protect the display panel 10 from an external impact.

The display panel 10 and the module cover 15 may be coupled to each other through adhesive layers 70. The adhesive layer 70 may be a double-sided tape. The display panel 10 and the module cover 15 may be rolled or unrolled together by the adhesive layers 70. The adhesive layer 70 may be positioned on each segment 15a and attached to the display panel 10. The adhesive layers 70 may be spaced apart from one another. Hence, the shape of the adhesive layers 70 may easily change when the module cover 15 is rolled or unrolled by the roller. As a width of the adhesive layer 70 in the second direction decreases, the display panel 10 can be naturally rolled or unrolled from the panel roller 143 (see FIG. 7) without being wrinkled.

As a width of the segment 15a in the second direction increases, the segments 15a can stably support the display panel 10 because rigidity of the segment 15a is improved.

When the width of the adhesive layer 70 in the second direction is equal to or less than 30% of the width of the segment 15a in the second direction, wrinkle in the display screen can decrease because less external force is transferred to the display panel 10.

Further, when the width of the adhesive layer 70 in the second direction is equal to or greater than 15% of the width of the segment 15a in the second direction, wrinkle in the display panel 10 can greatly decrease because the rigidity of the display panel 10 is improved.

As a width of the adhesive layer 70 in the third direction increases, the deformation of the display panel 10 against an external force can decrease. More specifically, as the width of the adhesive layer 70 in the third direction increases, the adhesive layer 70 can stably attach the display panel 10 and the module cover 15 because the flexibility of the adhesive layer 70 is good.

Further, as a width of the segment 15a in the third direction decreases, wrinkle of the display panel 10 can decrease. More specifically, as the width of the segment 15a in the third direction decreases, the segments 15a can decrease the wrinkle of the display panel 10 because the rigidity is improved.

Hence, when the width of the adhesive layer 70 in the third direction is equal to or greater than 3% of the width of the segment 15a in the third direction, the rigidity of the display panel 10 can be improved and the wrinkle of the display panel 10 can greatly decrease.

Further, when the width of the adhesive layer 70 in the third direction is equal to or less than 6% of the width of the segment 15a in the third direction, the rigidity of the display panel 10 can be improved and the wrinkle of the display panel 10 can greatly decrease.

In the display device according to the present disclosure, the module cover 15 may include the plurality of segments 15a, and the adhesive layer 70 may be positioned on each segment 15a.

Figure 9A:
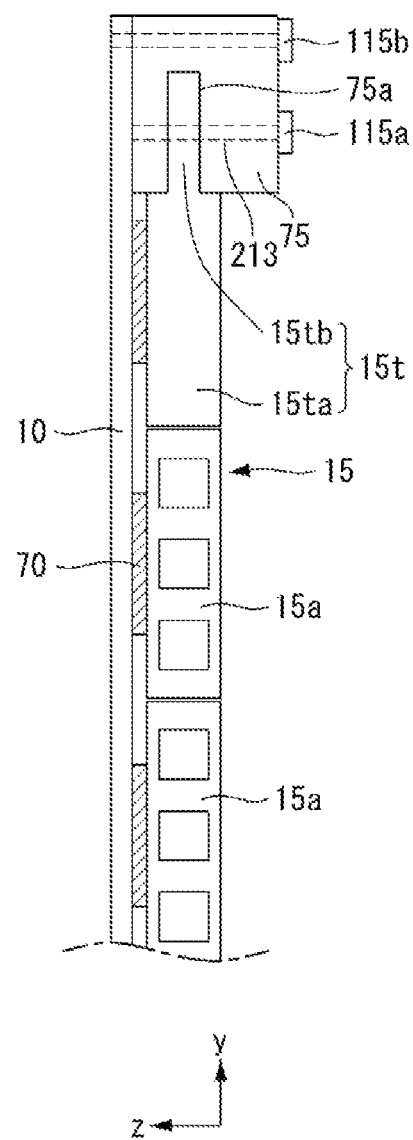
Figure 9B:
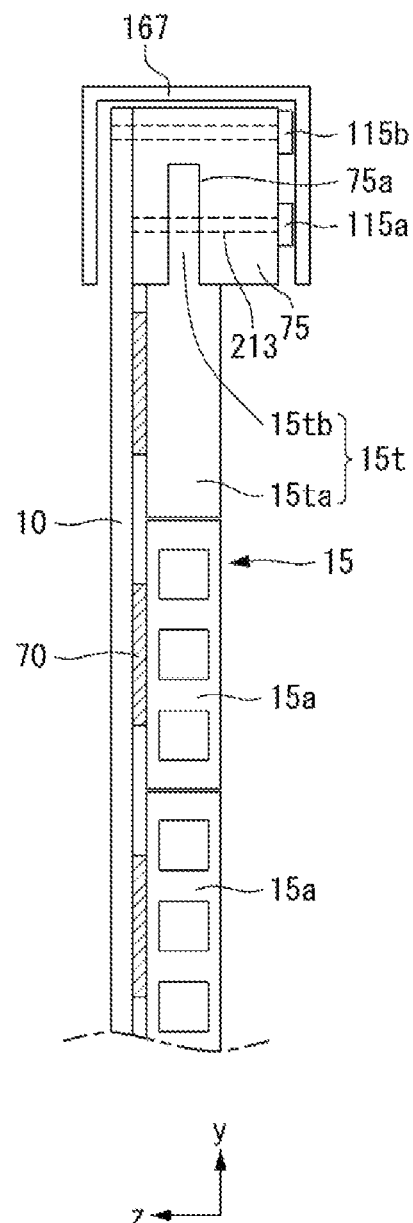

Referring to FIGS. 9A and 9B, the module cover 15 and the display panel 10 may be fastened to an upper bar 75. The module cover 15, the display panel 10, and the upper bar 75 may be fastened to each other by screws 115a and 115b.

The screws 115a and 115b may allow the module cover 15, the display panel 10, and the upper bar 75 to move up and down together. The screw 115a may fasten the upper bar 75 to the module cover 15. Alternatively, the screw 115b may fasten the upper bar 75 to the display panel 10. However, embodiments of the disclosure are not limited thereto. For example, at least one screw (115a, 115b) may fasten the module cover 15, the display panel 10, and the upper bar 75 together.

An upper part of the module cover 15 may have a shape suitable for being coupled to the upper bar 75. An upper segment 15t may be a segment positioned at the top of the module cover 15. The upper segment 15t may have a different shape from other segment 15a. The upper segment 15t may be referred to as an upper module cover 15t.

The upper segment 15t may include a first body 15ta connected to the other segment 15a and a second body 15tb coupled to the upper bar 75. A lower end of the first body 15ta may be connected to the other segment 15a, and the second body 15tb may be formed on the first body 15ta.

The upper bar 75 may include a groove 75a formed in the +y-axis direction. The second body 15tb may be inserted into the groove 75a. The screw 115a may pass through the second body 15tb in the z-axis direction.

A z-axis direction thickness of the first body 15ta may be greater than a z-axis direction thickness of the second body 15tb.

Referring to FIG. 9B, a top case 167 may cover the upper bar 75, the module cover 15, and the display panel 10. The upper bar 75, the module cover 15, and the display panel 10 may not be exposed to the outside by the top case 167. Hence, an appearance of the display device can be neat.

The top case 167 may be fastened to the upper bar 75, the module cover 15, or the display panel 10 by the screw.

Figure 10A:
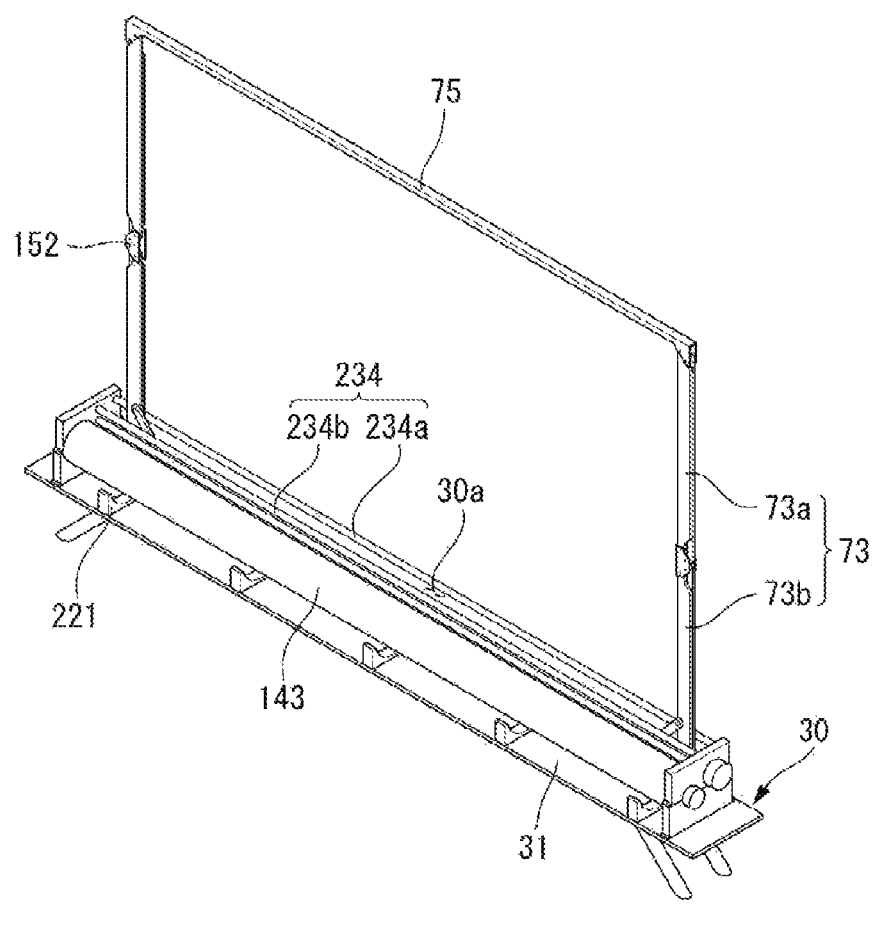

Referring to FIG. 10A, the display device according to the present disclosure may be in a shape in which both sides of the upper bar 75 are supported by the link 73. The upper bar 75 may be moved up and down by the link 73. The link 73 may include a first arm 73a and a second arm 73b.

The first arm 73a may be referred to as an upper link 73a. The second arm 73b may be referred to as a lower link 73b.

The first arm 73a and the second arm 73b may be connected by an arm joint 152. The arm joint 152 may be referred to as a hinge 152 or a joint 152.

An upper end of the first arm 73a may be fastened to the upper bar 75, and a lower end of the first arm 73a may be fastened to the arm joint 152. An upper end of the second arm 73b may be fastened to the motor assembly, and a lower end of the second arm 73b may be fastened to the arm joint 152.

The guide bar 234 may be positioned at the entrance 30a at which the link 73 moves up and down inside the housing 30. The guide bar 234 may include the first and second guide bars 234a and 234b. The entrance 30a of the housing 30 may be formed between the first and second guide bars 234a and 234b. The first and second guide bars 234a and 234b may face each other with the link 73 interposed therebetween. For example, the first guide bar 234a may be positioned behind the link 73, and the second guide bar 234b may be positioned in front of the link 73.

The panel roller 143 may be positioned in front of the link 73. A base 31 of the housing 30 may include a plurality of brackets 221. The base 31 may be referred to as a bottom surface 31.

The plurality of brackets 221 may be formed under the panel roller 143. The plurality of brackets 221 may be spaced along a longitudinal direction of the panel roller 143. Alternatively, the plurality of brackets 221 may be spaced along a longitudinal direction of the base 31. Each bracket 221 may be fixed to the base 31 through a screw.

Figure 10B:
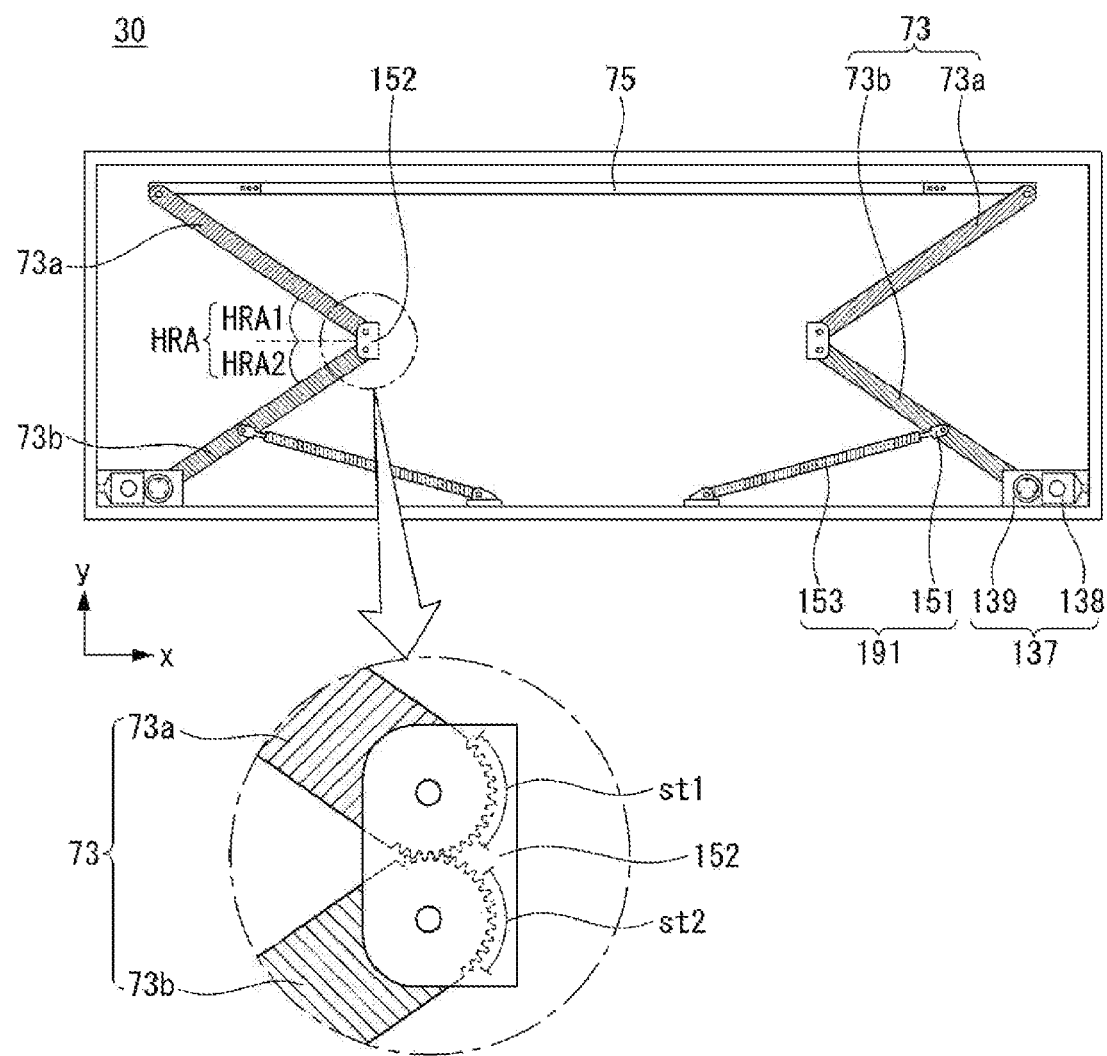

Referring to FIG. 10B, the display device according to the present disclosure may be in a gear shape in which other side of the first arm 73a and one side of the second arm 73b that are positioned inside the arm joint 152 are engaged with each other. The arm joint 152 may be referred to as a connection portion 152. The first arm 73a may be referred to as an upper support link 73a. The second arm 73b may be referred to as a lower support link 73b.

The first arm 73a may be rotatably connected to an upper part of the arm joint 152. The second arm 73b may be rotatably connected to a lower part of the arm joint 152.

A lower part of the first arm 73a may be provided with a gear st1. An upper part of the second arm 73b may be provided with a gear st2. The gear st1 of the first arm 73a and the gear st2 of the second arm 73b may be engaged with each other.

An angle HRA1 of the first arm 73a from the ground and an angle HRA2 of the second arm 73b from the ground may be equal to each other because the first arm 73a and the second arm 73b are engaged with each other to form a gear shape. Further, an angle between the first arm 73a and the second arm 73b may be the same on both sides because the first arm 73a and the second arm 73b are engaged with each other to form the gear shape. Hence, both sides of the upper bar 75 can move up or down while not being inclined and maintaining level. That is, the angle between the first arm 73a and the second arm 73b of each link 73 can be equal regardless of a height of the upper bar 75 from the ground.

Figure 11:
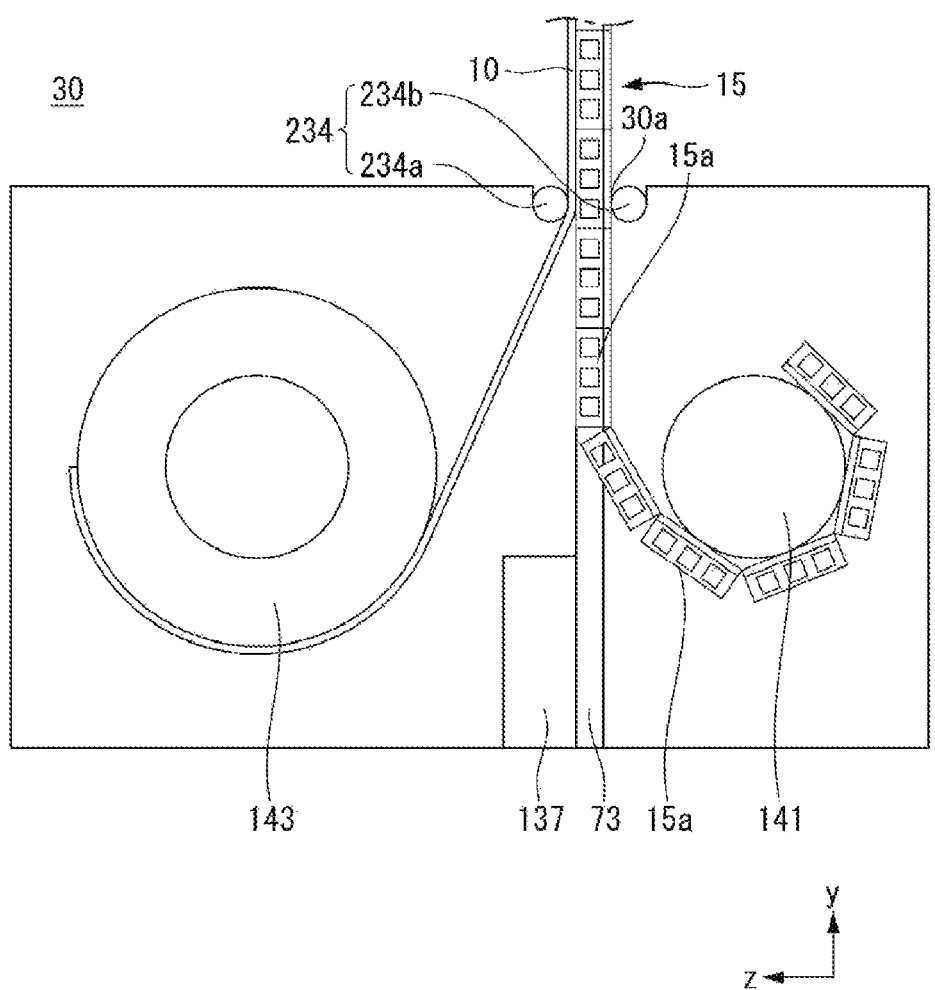

Referring to FIG. 11, the display device according to the present disclosure may further include a module cover roller 141 as well as the panel roller 143 inside the housing 30. The module cover roller 141 may be referred to as an apron roller 141.

The panel roller 143 may be positioned in front of the link 73, and the module cover roller 141 may be positioned behind the link 73. That is, the panel roller 143 and the module cover roller 141 may face each other based on the link 73.

The panel roller 143 may roll and unroll the display panel 10, and the module cover roller 141 may roll and unroll the module cover 15.

The module cover 15 may be thicker than the display panel 10. The module cover roller 141 on which the module cover 15 is rolled may occupy a larger space inside the housing 30 than the panel roller 143 on which the display panel 10 is rolled. Thus, the motor assembly 137 may be positioned in front of the link 73 relatively having a margin of space. However, embodiments of the disclosure are not limited thereto. For example, the motor assembly 137 may be positioned behind the link 73.

Because the display panel 10 and the module cover 15 are dividedly rolled and unrolled inside the housing 30, a rolling force required for the panel roller 143 to roll the display panel 10 may be greater than an adhesive force between the display panel 10 and the module cover 15. Further, a rolling force required for the module cover roller 141 to roll the module cover 15 may be greater than the adhesive force between the display panel 10 and the module cover 15.

The present disclosure can roll and unroll the display panel 10 and the module cover 15 using two rollers, respectively. Hence, less weight can be loaded on each of two rollers respectively rolling the display panel 10 and the module cover 15 than one roller rolling both the display panel 10 and the module cover 15. As a result, the display panel 10 rolled on the panel roller 143 can be prevented from sagging, and the module cover 15 rolled on the module cover roller 141 can be prevented from sagging.

Figure 12:
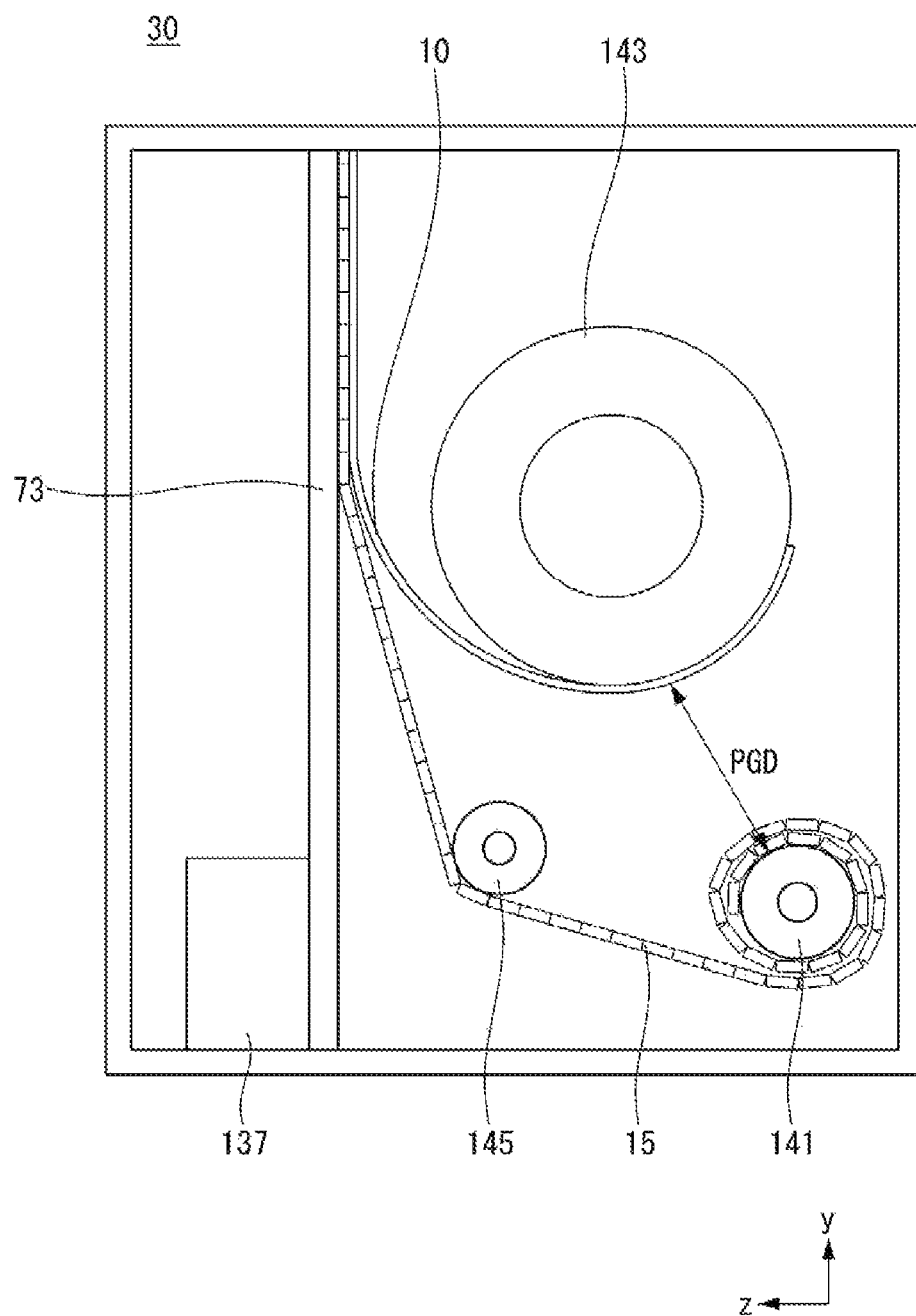

Referring to FIG. 12, the panel roller 143 and the module cover roller 141 may be positioned on the same side with respect to the link 73. For example, the panel roller 143 and the module cover roller 141 may be positioned behind the link 73. However, embodiments of the disclosure are not limited thereto. For example, the panel roller 143 and the module cover roller 141 may be positioned in front of the link 73.

The module cover roller 141 may be positioned under the panel roller 143. The module cover roller 141 on which the module cover 15 is rolled and the panel roller 143 on which the display panel 10 is rolled may interfere with each other. Thus, as the module cover roller 141 and the panel roller 143 are spaced apart from each other by a first distance PGD, interference between them can be prevented.

The first distance PGD may be a distance capable of preventing interference between the display panel 10 rolled on the panel roller 143 and the module cover 15 rolled on the module cover roller 141.

A guide roller 145 may be positioned under the panel roller 143. The guide roller 145 may guide a location of the module cover 15 so that the module cover 15 does not interfere with the panel roller 143.

Figure 13:
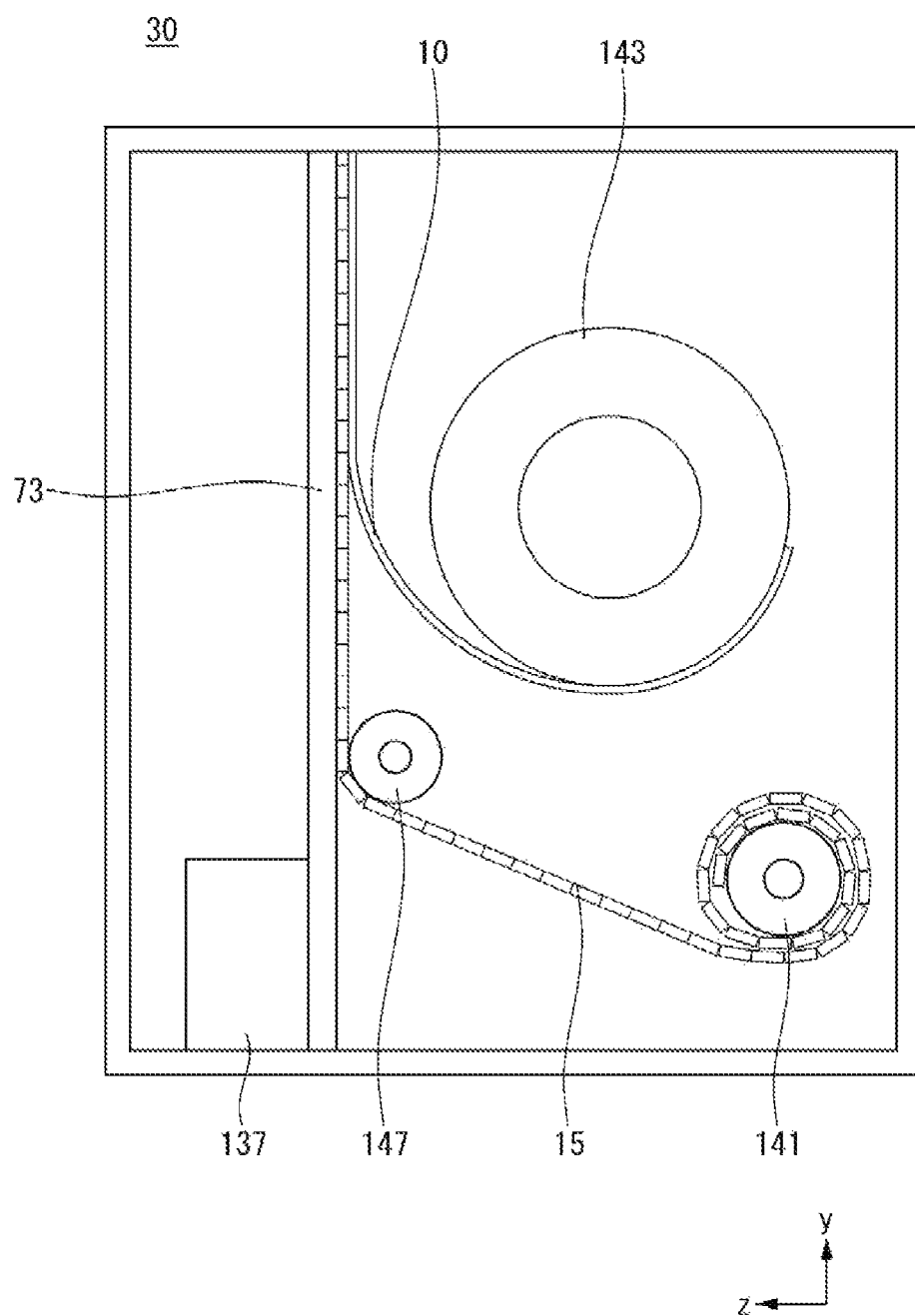

Referring to FIG. 13, a pressure roller 147 may be positioned under the panel roller 143. The pressure roller 147 may press the module cover 15 so that the module cover 15 contacts the link 73. Hence, the module cover 15 can be prevented from sagging or bending. The pressure roller 147 may be positioned adjacent to the link 73. The pressure roller 147 may guide the module cover 15 so that the module cover 15 and the display panel 10 do not interfere with each other.

Figure 14:
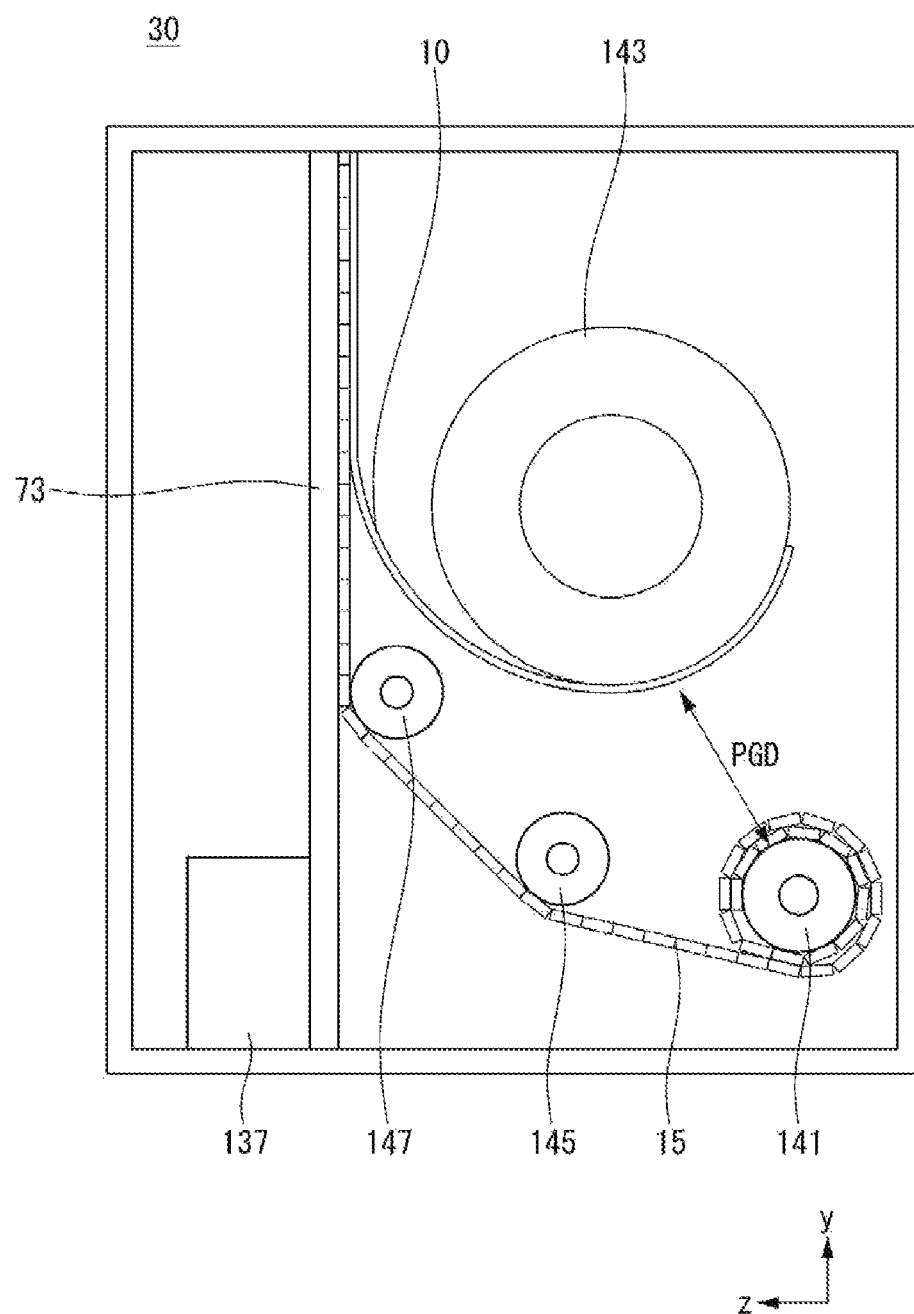

Referring to FIG. 14, a guide roller 145 and a pressure roller 147 may be positioned under the panel roller 143. The guide roller 145 may guide a location of the module cover 15 so that the module cover 15 does not interfere with the panel roller 143. The pressure roller 147 may press the module cover 15 so that the module cover 15 contacts the link 73.

Hence, malfunction of the display device due to the sagging or bending of the module cover 15 can be prevented. Further, malfunction of the display device due to interference between the module cover 15 and the display panel 10 can be prevented.

Figure 15:
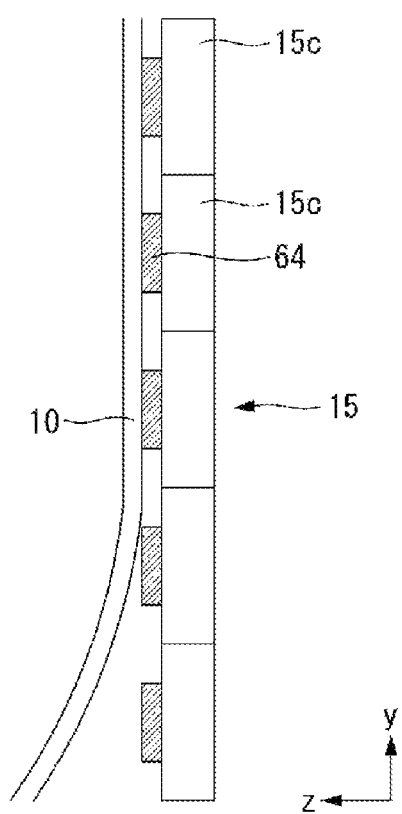

Referring to FIG. 15, in the display device according to the present disclosure, segments 15c on both sides of the module cover 15 may be attached to the display panel 10. The segment 15c may be referred to as a third module cover 15c.

A magnet 64 may be attached to a front surface of the segment 15c. The magnet 64 may be attached to the segment 15c through a double-sided tape. Each segment 15c may be provided with the magnet 64.

The display panel 10 may include a metal material. Thus, the display panel 10 and the magnet 64 may be attached to each other by a magnetic force. Further, the display panel 10 and the segment 15c may be attached to each other by the magnet 64.

The rear surface of the display panel 10 may include Fe—Ni Invar alloy. Thus, the display panel 10 can be strongly attached to the magnet 64.

Because the display panel 10 and the module cover 15 are attached by the magnets 64 positioned only on both sides of the module cover 15, a large number of magnets 64 are not needed. As a result, the manufacturing cost of the display device can be reduced.

Figure 16:
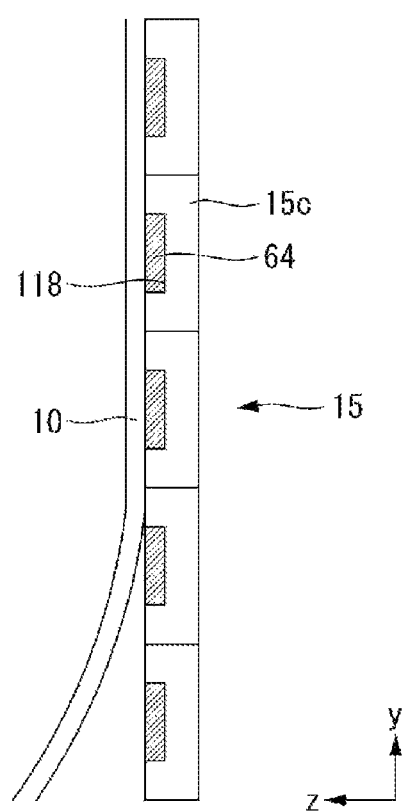

Referring to FIG. 16, in the display device according to the present disclosure, the magnet 64 may be positioned in a groove 118 of the segment 15c.

The groove 118 may be positioned on a surface of the segment 15c facing the display panel 10. The groove 118 may be positioned on a front surface of each segment 15c. Because the magnet 64 is accommodated in the groove 118, the magnet 64 may not protrude to the outside of the segment 15c. Thus, even if the display panel 10 contacts the segment 15c, the display panel 10 does not wrinkle and can be flat.

As the magnet 64 is accommodated in the groove 118, a thickness of the segment 15c can be reduced. Hence, a thickness of the display device can be reduced.

Figure 17A:
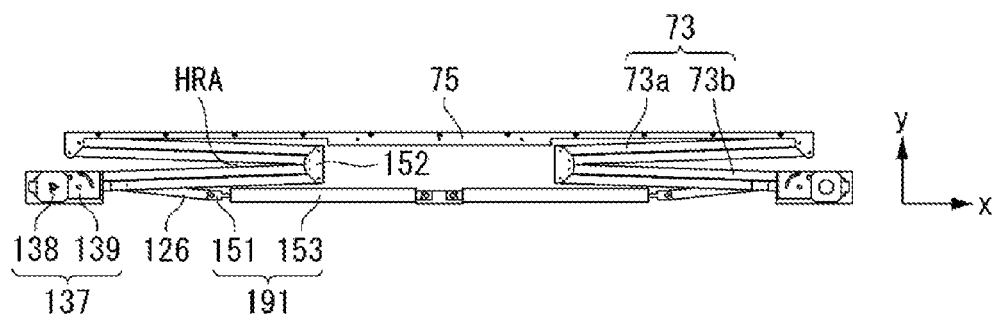
Figure 17B:
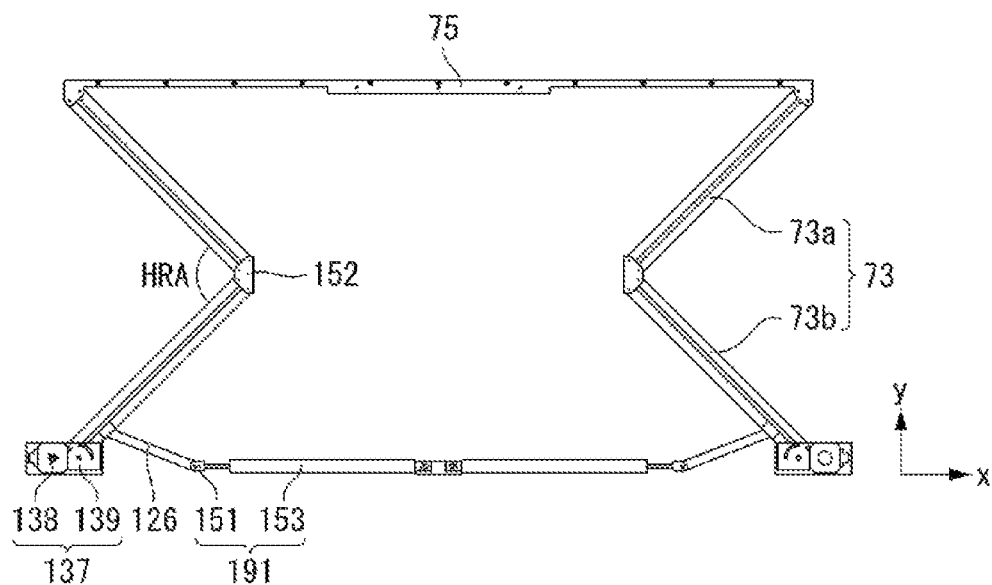
Figure 17C:
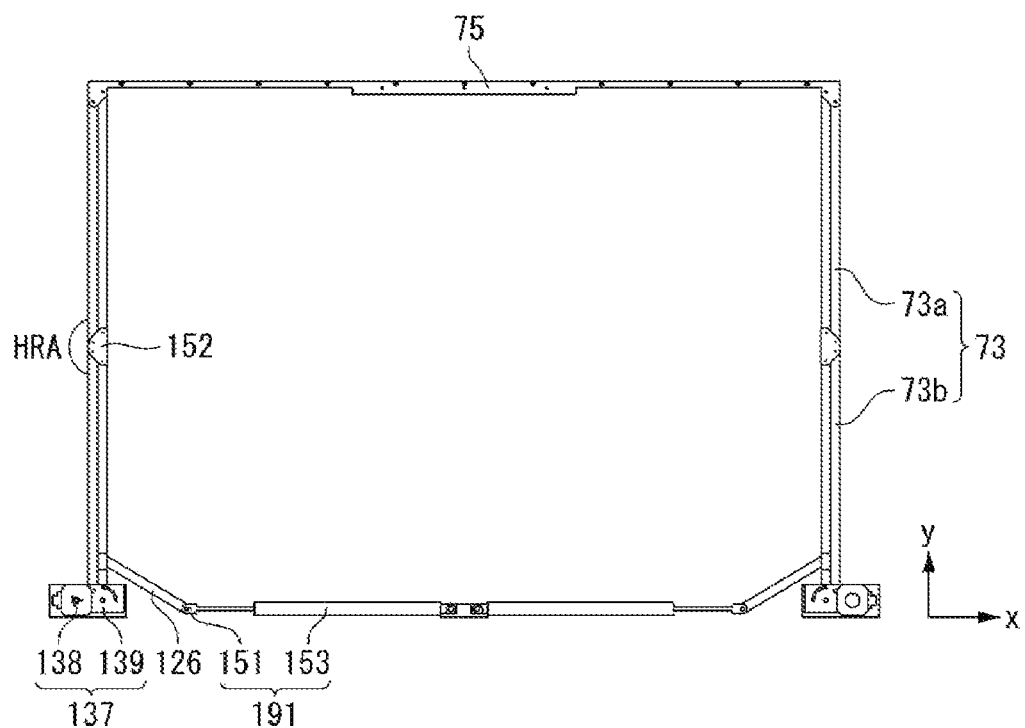

Referring to FIGS. 17A to 17C, as the display device according to the present disclosure changes from the first state to the second state, the upper bar 75 may move up. The upper bar 75 may move up and down by the links 73 connected to both sides of the upper bar 75.

As shown in FIG. 17A, when the display device is in the first state, an angle HRA between the first arm 73a and the second arm 73b may be very small. Hence, the upper bar 75 may not move up. Further, the display panel 10 and the module cover 15 may be rolled on the panel roller 143.

As shown in FIG. 17B, the angle HRA between the first arm 73a and the second arm 73b may increase while the motor assembly 137 rotates. While the angle HRA between the first arm 73a and the second arm 73b increases, the upper bar 75 may move up. Hence, the display panel 10 and the module cover 15 that have been rolled on the panel roller 143 may be gradually unrolled.

As shown in FIG. 17C, when the display device is in the second state, the first arm 73a and the second arm 73b may be positioned on a straight line. Namely, the angle HRA between the first arm 73a and the second arm 73b may be 180 degrees. Thus, the upper bar 75 may move up to a maximum height. Further, the display panel 10 and the module cover 15 may be unrolled from the panel roller 143.

Figure 17D:
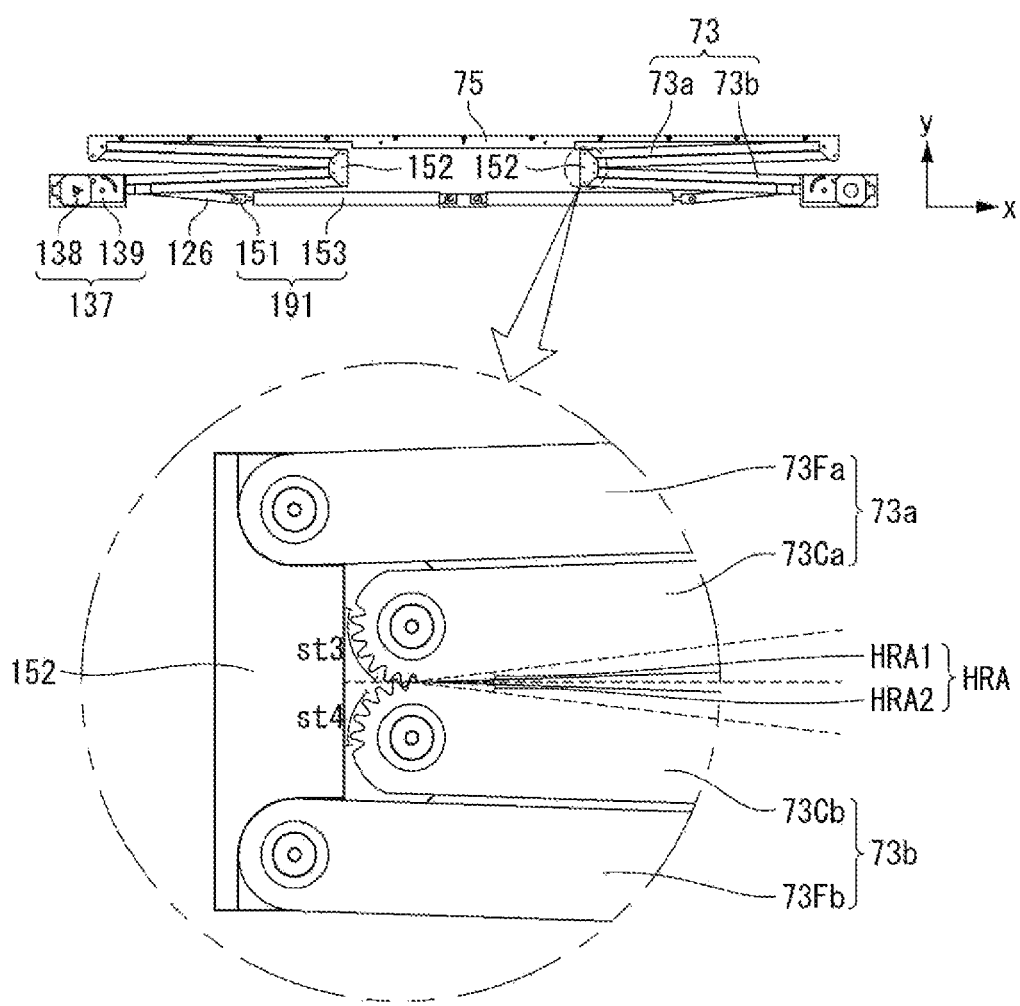

Referring to FIG. 17D, in the display device according to the present disclosure, a plurality of first arms 73a and a plurality of second arms 73b may be used.

More specifically, the first arm 73a may include a first upper arm 73Ca and a second upper arm 73Fa. Further, the second arm 73b may include a first lower arm 73Cb and a second lower arm 73Fb.

The first upper arm 73Ca may be referred to as a first upper link 73Ca, and the second upper arm 73Fa may be referred to as a second upper link 73Fa. The first lower arm 73Cb may be referred to as a first lower link 73Cb, and a second lower arm 73Fb may be referred to as a second lower link 73Fb.

The first arm 73a may be rotatably connected to the upper part of the arm joint 152. The second arm 73b may be rotatably connected to the lower part of the arm joint 152.

More specifically, the second upper arm 73Fa may be connected to an upper side above the first upper arm 73Ca. The second lower arm 73Fb may be connected to a lower side below the first lower arm 73Cb.

A lower part of the first upper arm 73Ca may be provided with a gear st3. An upper part of the first lower arm 73Cb may be provided with a gear st4. The gear st3 of the first upper arm 73Ca and the gear st4 of the first lower arm 73Cb may be engaged with each other.

An angle HRA1 of the first upper arm 73Ca from the ground and an angle HRA2 of first lower arm 73Cb from the ground may be equal to each other because the first upper arm 73Ca and the first lower arm 73Cb are engaged with each other. Further, an angle between the first upper arm 73Ca and the first lower arm 73Cb may be the same on both sides because the first upper arm 73Ca and the first lower arm 73Cb are engaged with each other. Hence, the upper bar 75 can move up or down while not being inclined and maintaining level. That is, the angle between the first upper arm 73Ca and the first lower arm 73Cb can be the same on both sides regardless of the height of the upper bar 75 from the ground.

The second upper arm 73Fa and the second lower arm 73Fb may not be provided with a gear. An angle between the second upper arm 73Fa and the second lower arm 73Fb may be equal to the angle between the first upper arm 73Ca and the first lower arm 73Cb.

Figure 17E:
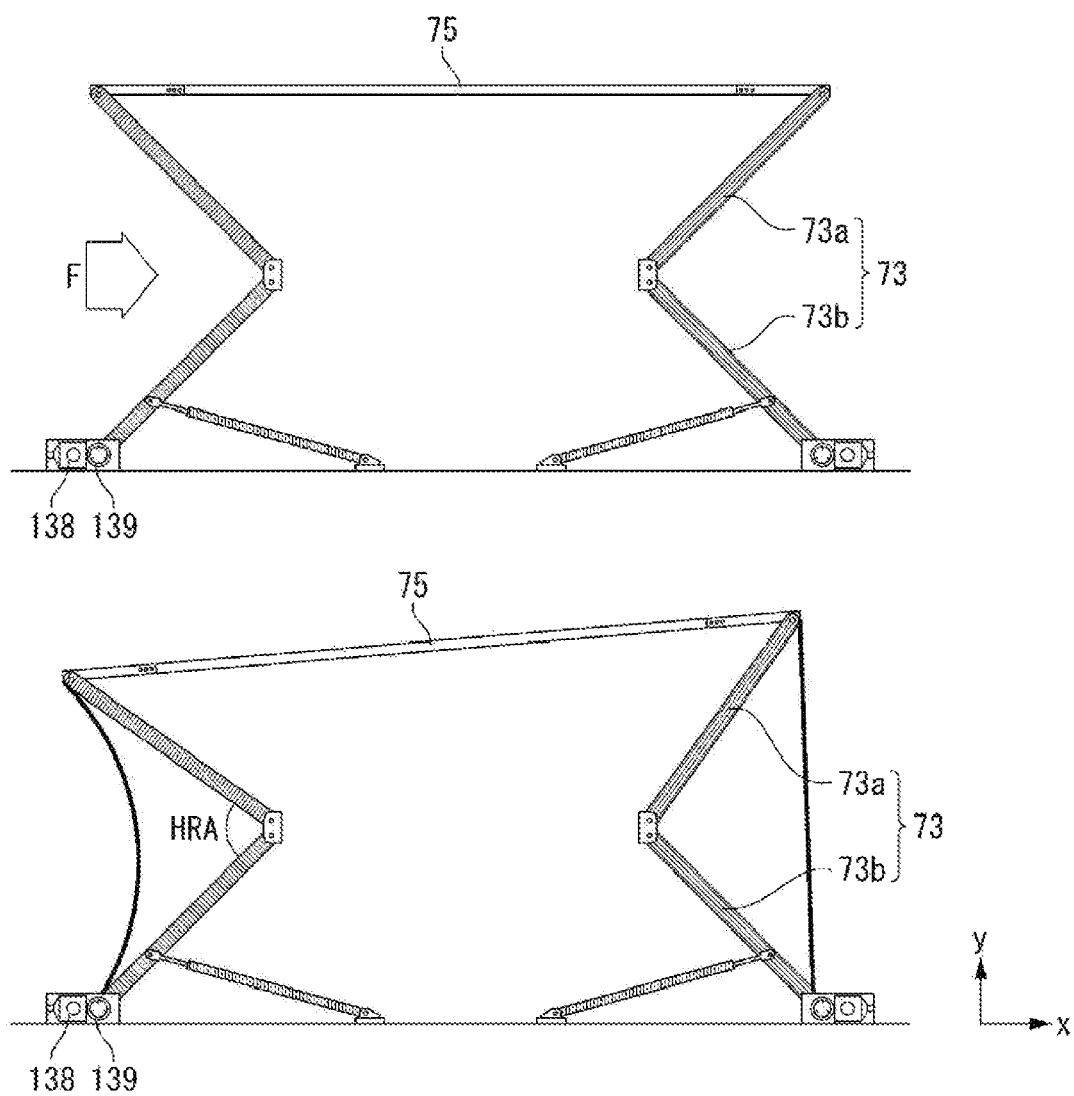

As shown in FIG. 17E, in a related art display device, upper and lower arms 73a and 73b may be formed as one arm. Hence, when an external force F is applied to one side, an angle HLA between the upper and lower arms 73a and 73b may be different on both sides. In this case, the display panel may be inclined to one side.

Figure 17F:
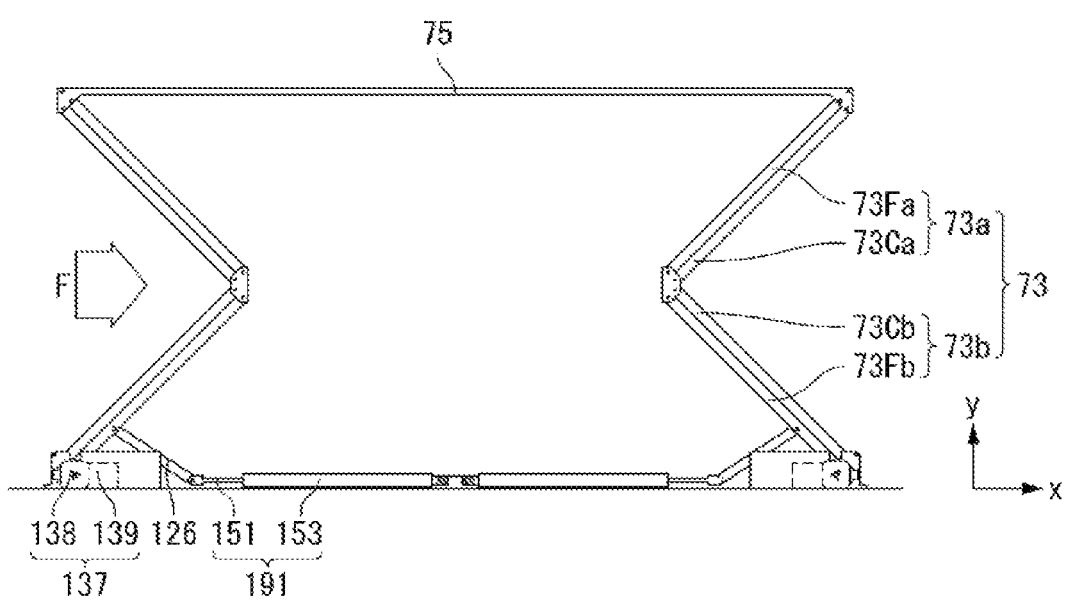

Unlike FIG. 17E, as shown in FIG. 17F, when the gear st3 of the first upper arm 73Ca and the gear st4 of the first lower arm 73Cb are engaged with each other, an angle HLA between the upper and lower arms 73a and 73b may not change even if an external force F is applied to one side of the display device. Hence, a damage of the display panel due to the inclination can be prevented.

Figure 17G:
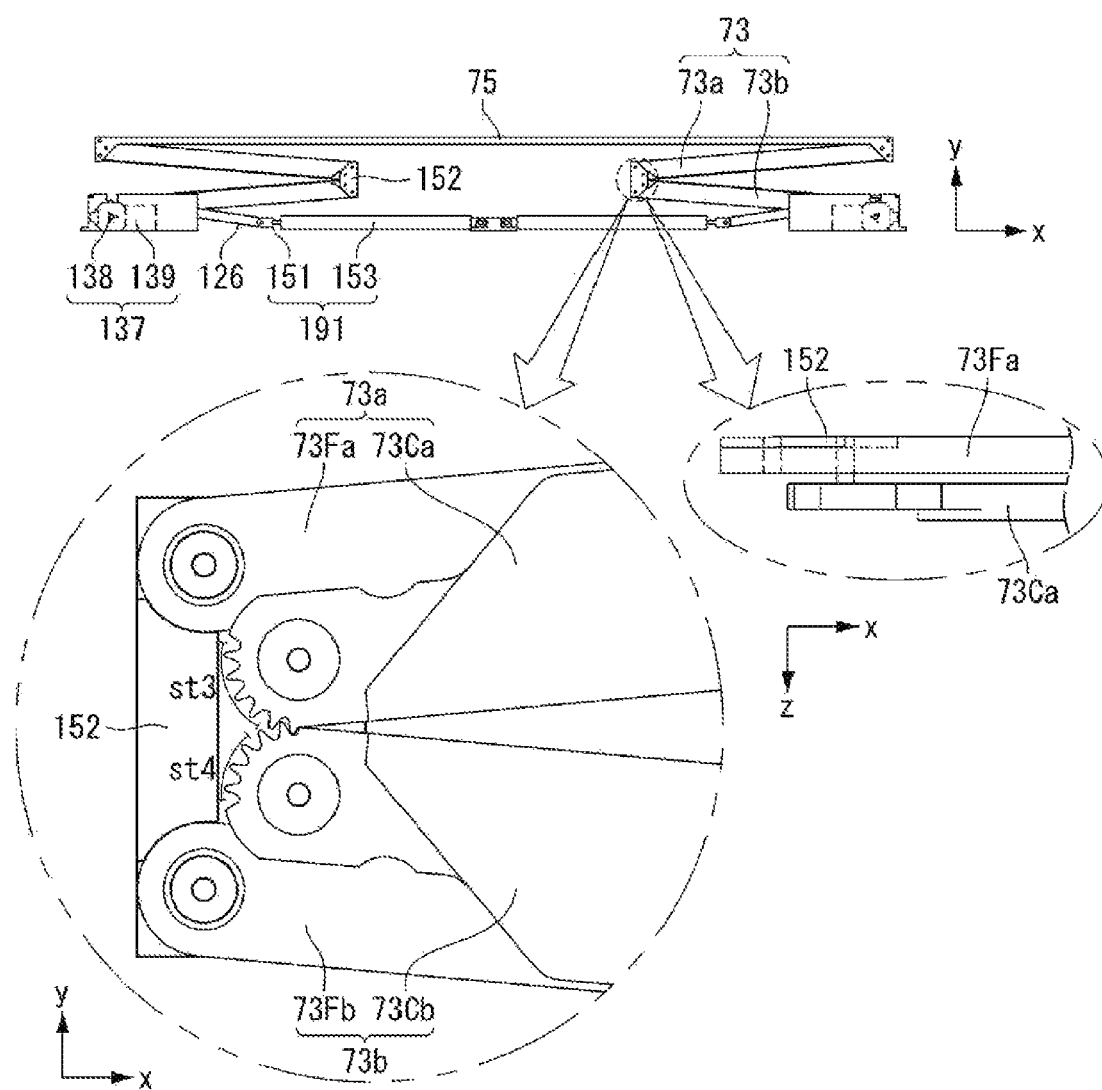

Referring to FIG. 17G, one side of each of the first upper and lower arms 73Ca and 73Cb may be extended in a direction toward the second upper and lower arms 73Fa and 73Fb. That is, a width of each of the first upper and lower arms 73Ca and 73Cb may further increase. Hence, the first upper and lower arms 73Ca and 73Cb can shield the second upper and lower arms 73Fa and 73Fb at the front when viewing the link 73 from the front of the display device. Alternatively, the first upper arm 73Ca and the second upper arm 73Fa may overlap each other. Alternatively, the first lower arm 73Cb and the second lower arm 73Fb may overlap each other.

A rotation axis of the first upper arm 73Ca, a rotation axis of the second upper arm 73Fa, a rotation axis of the first lower arm 73Cb, and a rotation axis of the second lower arm 73Fb may be spaced apart from each other.

A vertical height of a portion of the arm joint 152 connected to the first upper and lower arms 73Ca and 73Cb may be different from a vertical height of a portion of the arm joint 152 connected to the second upper and lower arms 73Fa and 73Fb.

Although not shown, one side of each of the second upper and lower arms 73Fa and 73Fb may also be extended in a direction toward the first upper and lower arms 73Ca and 73Cb. That is, a width of each of the second upper and lower arms 73Fa and 73Fb may further increase when viewed from the rear surface. Hence, the second upper and lower arms 73Fa and 73Fb can shield the first upper and lower arms 73Ca and 73Cb at the front.

Figure 17H:
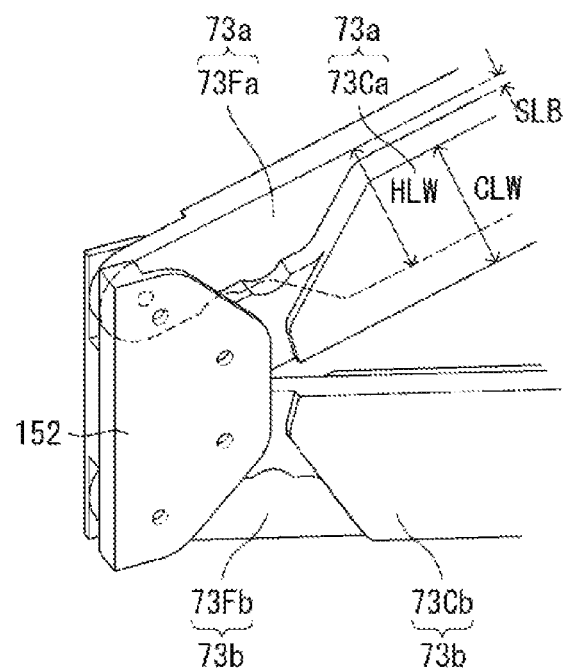

As shown in FIG. 17H, in the first state, a width of at least a portion of the first upper and lower arms 73Ca and 73Cb may overlap the second upper and lower arms 73Fa and 73Fb. For example, the first upper and lower arms 73Ca and 73Cb may be spaced apart from the second upper and lower arms 73Fa and 73Fb by a predetermined distance SLB and may overlap the second upper and lower arms 73Fa and 73Fb. Hence, an entire width HLW of the first arm 73a may be greater than a width of the second upper arm 73Fa or a width CLW of the first upper arm 73Ca.

Figure 17I:
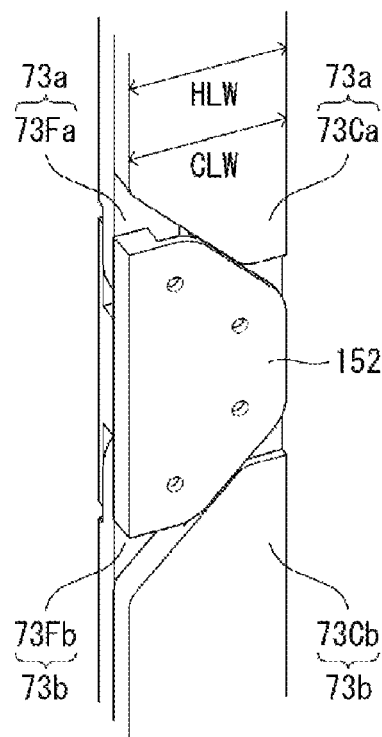

Unlike FIG. 17H, as shown in FIG. 17I, in the second state, an entire width of the first upper and lower arms 73Ca and 73Cb may overlap the second upper and lower arms 73Fa and 73Fb. Hence, an entire width HLW of the first arm 73a may be equal to a width of the second upper arm 73Fa or a width CLW of the first upper arm 73Ca.

Figure 17J:
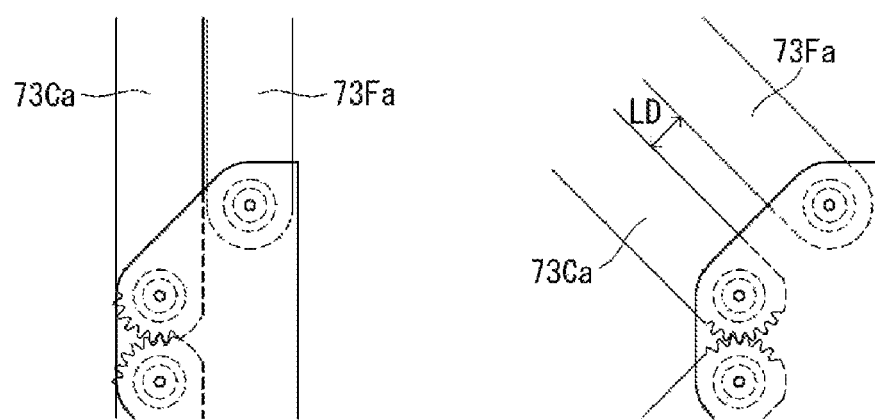

As shown in FIG. 17J, when one side of the first upper arm 73Ca is not extended, there may occur a predetermined gap (or distance) LD between the first upper arm 73Ca and the second upper arm 73Fa with the change from the second state to the first state. As the change to the first state proceeds, the distance LD between the first upper arm 73Ca and the second upper arm 73Fa may further increase.

In this case, there is a problem that the user's hand may be caught between the first upper arm 73Ca and the second upper arm 73Fa during the change from the first state to the second state.

Figure 17K:
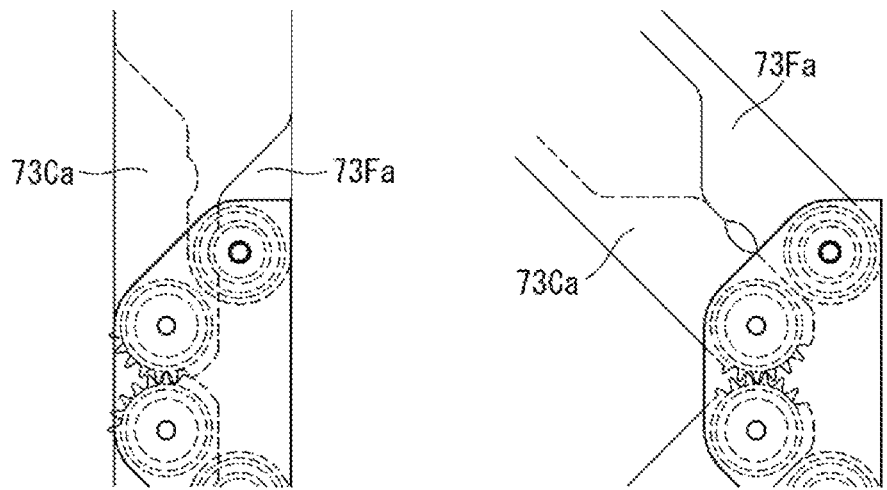

Unlike FIG. 17J, as shown in FIG. 17K, when one side of the first upper arm 73Ca is extended and overlaps the second upper arm 73Fa, the gap between the first upper arm 73Ca and the second upper arm 73Fa may not be still exposed even during the change from the second state to the first state. Hence, the present disclosure can prevent the user's hand from being caught between the first upper arm 73Ca and the second upper arm 73Fa during the change from the first state to the second state.

Figure 18:
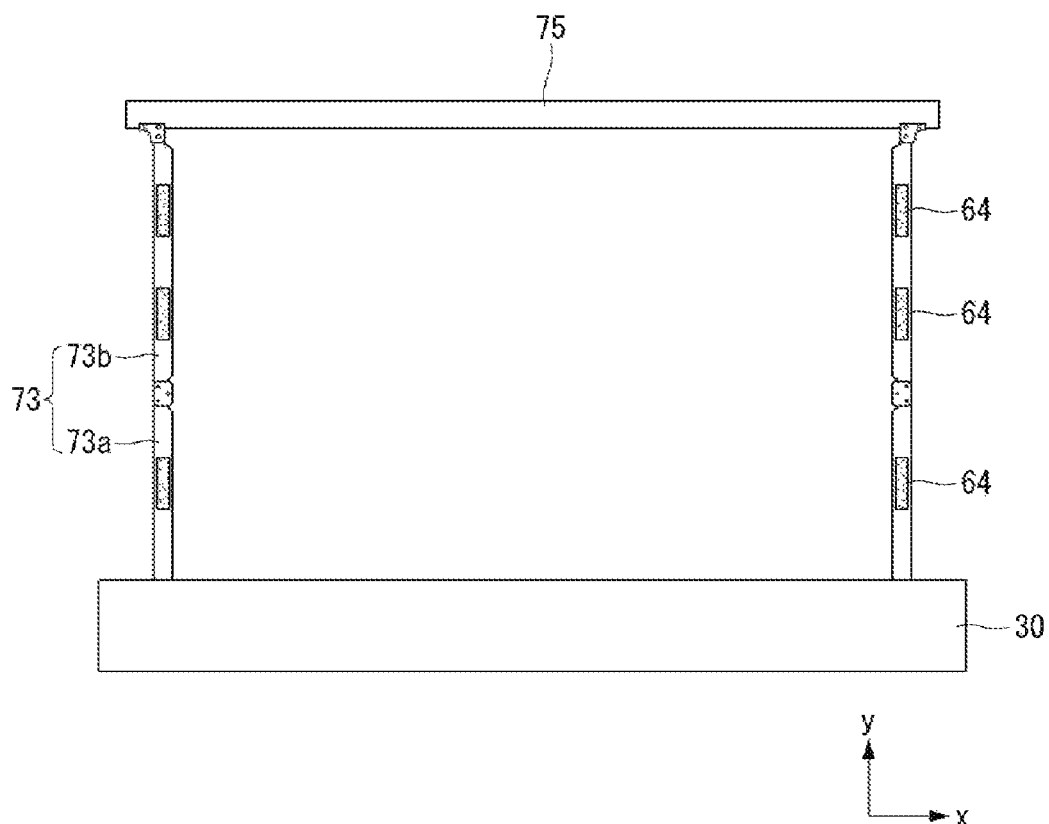
FIGS. 18 to 29 illustrate a display device according to an embodiment of the disclosure.

Referring to FIG. 18, a plurality of magnets 64 may be positioned on the link 73. For example, at least one magnet 64 may be positioned on the first arm 73a, and at least one magnet 64 may be positioned on the second arm 73b. The plurality of magnets 64 may be spaced apart from each other.

The display unit may include a metal material. The display unit may be in close contact with the link 73 by the magnet 64. Even if a magnetic force of one of the plurality of magnets 64 weakens, it can be maintained that the display panel and the module cover are in close contact with the link 73 by a magnetic force of the remaining magnets 64.

Figure 19:
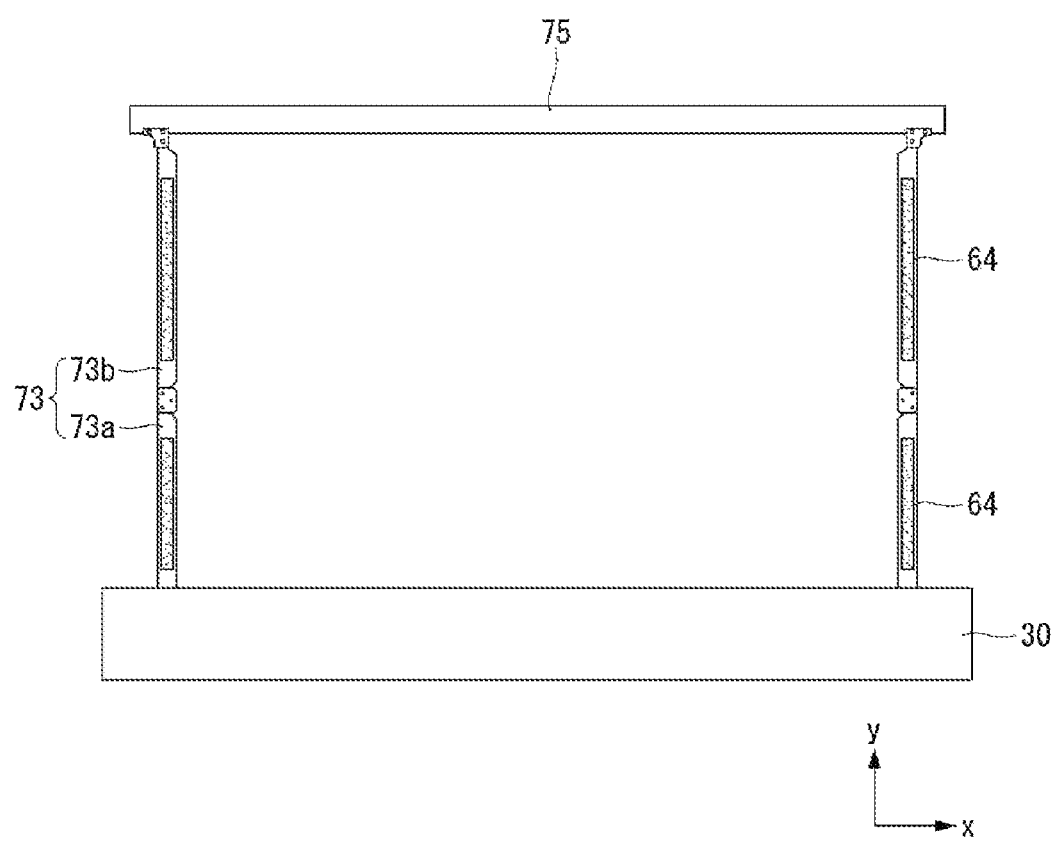

Referring to FIG. 19, one magnet 64 may be positioned on each of the first arm 73a and the second arm 73b. In this case, the magnet 64 may have a shape extending in a long side direction of the first arm 73a and the second arm 73b.

Because the magnet 64 has the shape extending in the long side direction of the first arm 73a and the second arm 73b, an area of a portion where the link 73 is in close contact with the display panel and the module cover can be increased. Hence, an adhesive strength between the link 73 and the display panel and the module cover can increase.

Figure 20:
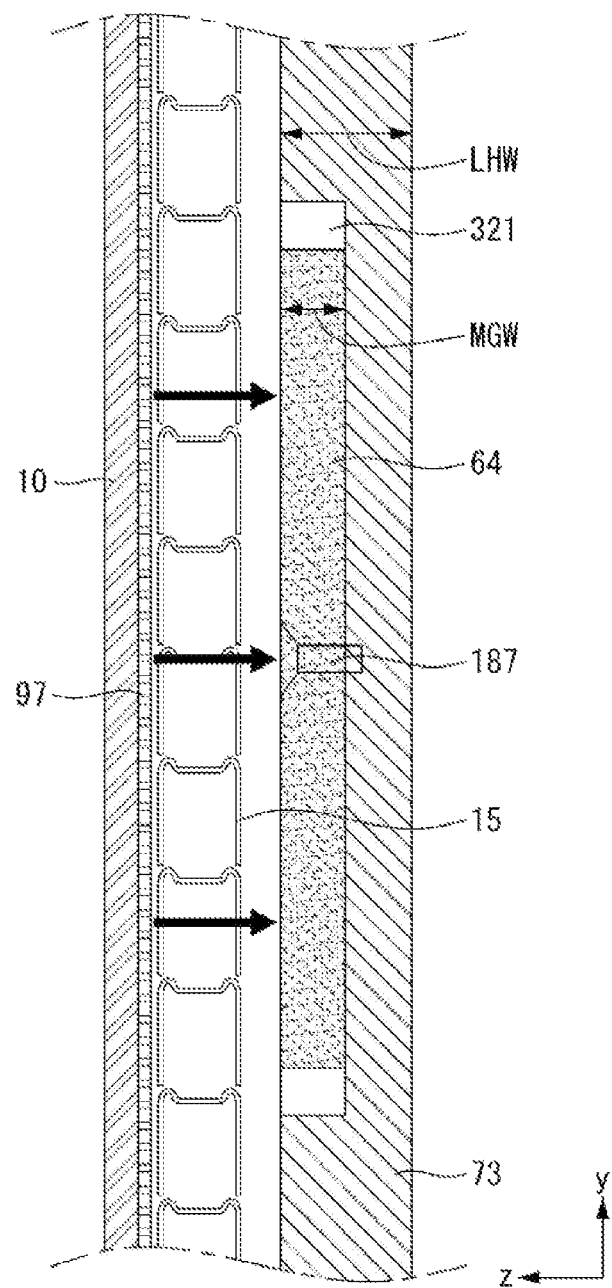

Referring to FIG. 20, the magnet 64 may be positioned in a recess 321 formed on the link 73. The recess 321 may have a shape recessed to the inside of the link 73. The magnet 64 may be coupled to the link 73 through at least one screw 187.

A width LHW of the recess 321 recessed to the inside of the link 73 may be equal to or greater than a thickness MGW of the magnet 64. If the thickness MGW of the magnet 64 is greater than the width LHW of the recess 321, the display panel 10 and the module cover 15 may not be in close contact with the link 73. In this case, the display panel 10 may be wrinkled or may not be flat.

A panel protection portion 97 may be disposed on the rear surface of the display panel 10. The panel protection portion 97 can prevent an impact that the display panel 10 receives due to a friction with the module cover 15. The panel protection portion 97 may include a metal material. The panel protection portion 97 may have a very thin thickness. For example, the panel protection portion 97 may be about 0.1 mm thick.

Because the panel protection portion 97 includes a metal material, a mutual attraction may act between the panel protection portion 97 and the magnet 64. Even if the module cover 15 between the panel protection portion 97 and the link 73 does not include a metal material, the module cover 15 may be in close contact with the magnet 64.

Figure 21:
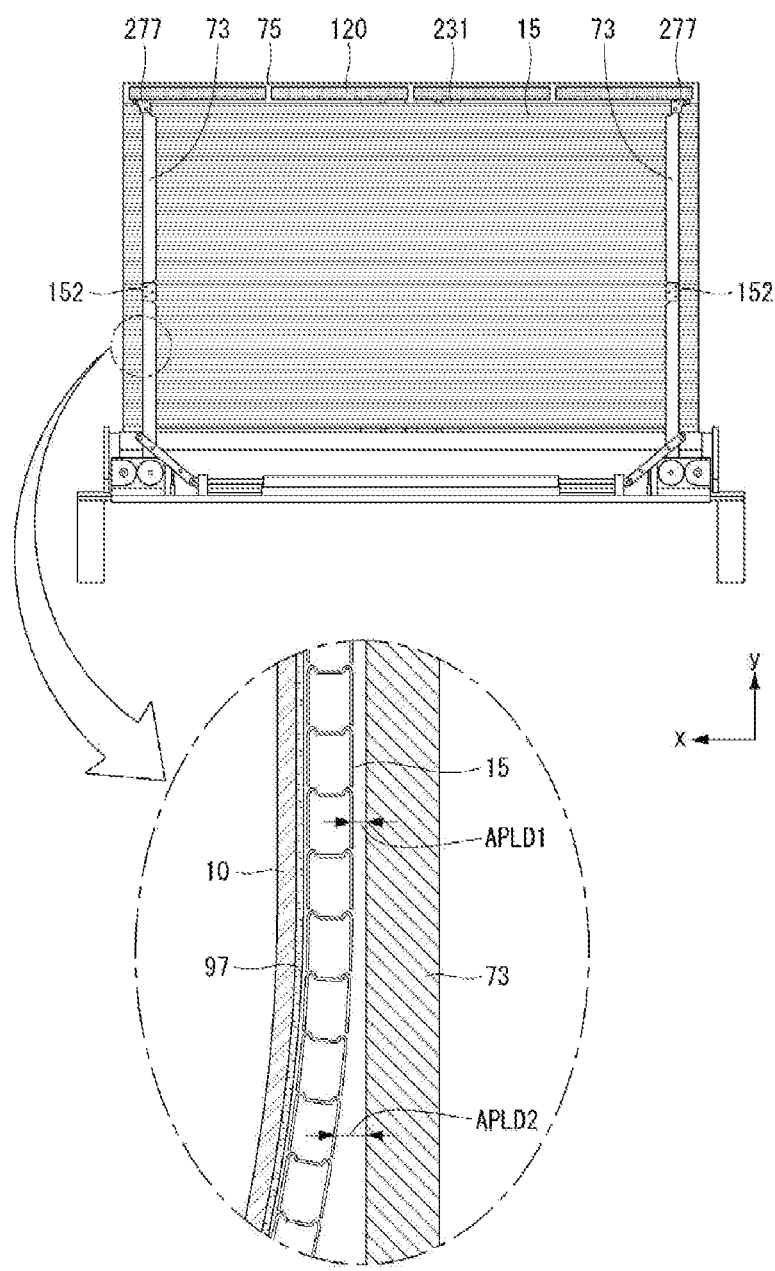

Referring to FIG. 21, when a magnet is not provided on the link 73, the module cover 15 may be in close contact with the link 73 by the upper bar 75 on the upper side and the guide bar 234 (see FIG. 10) on the lower side. A portion of the link 73 between the upper bar 75 and the guide bar 234 may not be in close contact with the module cover 15. Alternatively, a central portion of the link 73 may not be in close contact with the module cover 15. The central portion of the link 73 may be around the arm joint 152. In this case, distances APRD1 and APLD2 between the module cover 15 and the link 73 may not be constant. In this case, the display panel 10 may bend.

Figure 22:
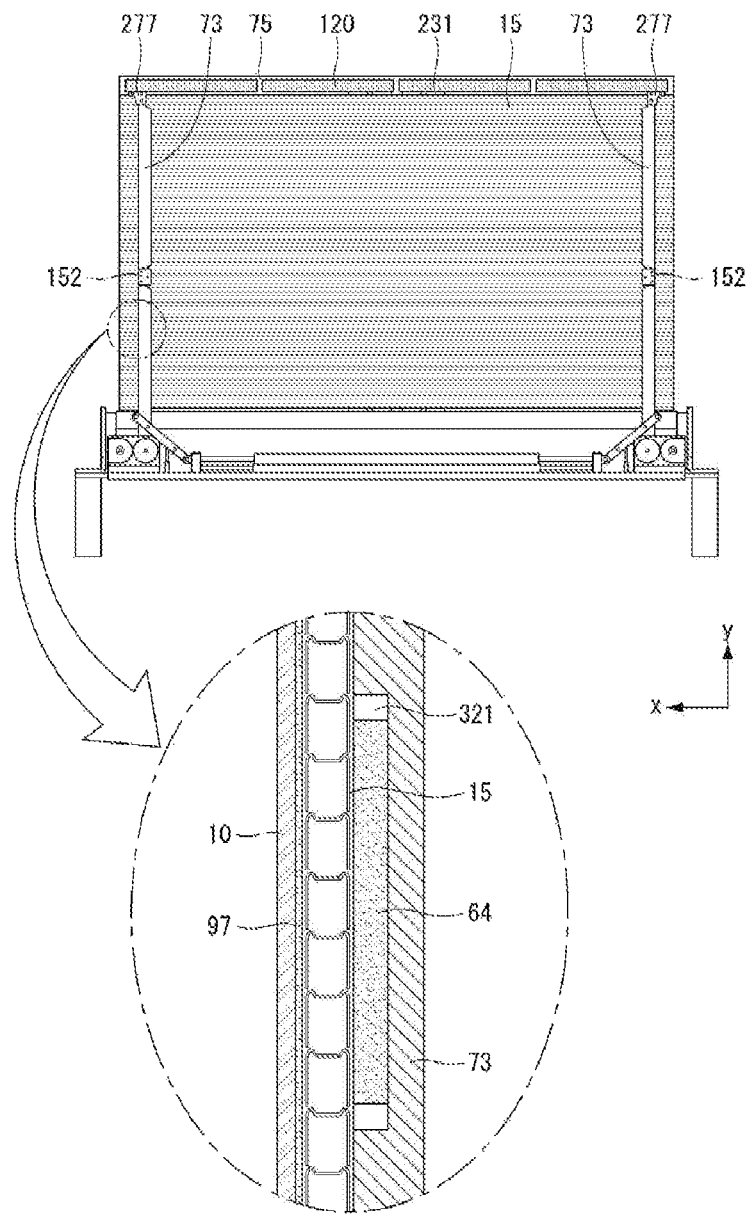

Referring to FIG. 22, when the magnet 64 is positioned on the recess 321 of the link 73, the magnet 64 may be in close contact with both the module cover 15 and the panel protection portion 97 at the same time because the magnet 64 pulls the panel protection portion 97. That is, the central portion of the link 73 may be in close contact with the module cover 15.

Figure 23A:
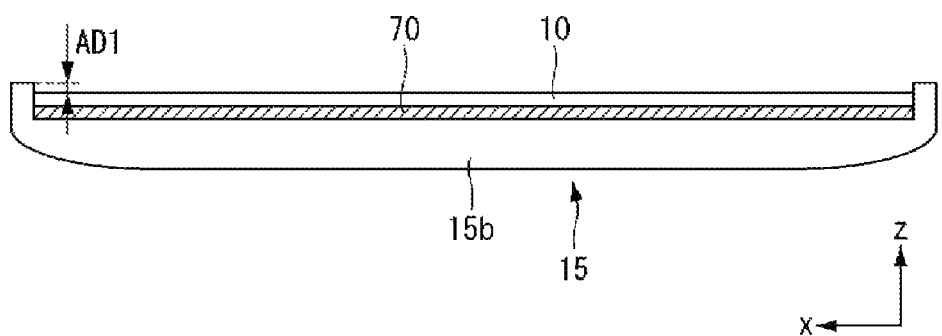
Figure 23B:
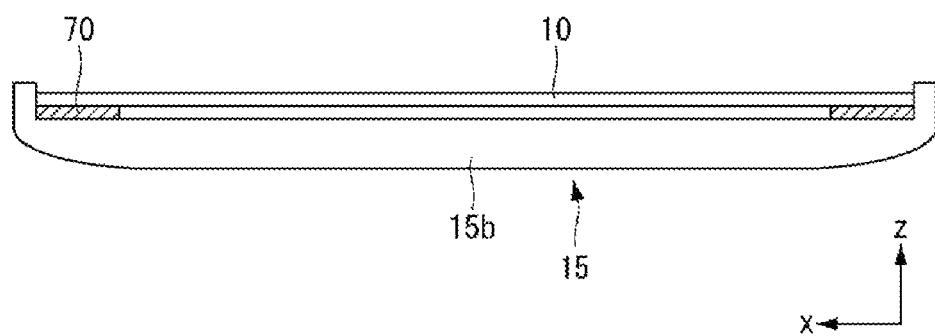

Referring to FIGS. 23A and 23B, both ends of the module cover 15 may bend in the +z-axis direction. The display panel 10 may be attached to a non-bent portion of the module cover 15. A bent length in the +z-axis direction on both ends of the module cover 15 may be greater than a sum of thicknesses of the display panel 10 and the adhesive layer 70. That is, a bent portion of the module cover 15 may protrude from the display panel 10 by a predetermined distance AD1 in the +z-axis direction. Hence, the display panel 10 can be shielded when viewing the module cover 15 in the x-axis direction.

Referring to FIG. 23A, the adhesive layer 70 may be disposed between the display panel 10 and the module cover 15. The adhesive layer 70 may be disposed to elongate along the x-axis direction. The whole of the display panel 10 may be attached to the module cover 15. In this case, because an adhesive strength between the module cover 15 and the display panel 10 may be very strong, the module cover 15 and the display panel 10 may not be easily detached from each other.

Referring to FIG. 23B, the adhesive layer 70 may be disposed between the display panel 10 and the module cover 15. The adhesive layer 70 may be partially disposed between the display panel 10 and the module cover 15. For example, the adhesive layers 70 may be respectively disposed at one end and other end of the display panel 10. In this case, a smaller amount of the adhesive layer 70 may be used than when the adhesive layer 70 is disposed to elongate along the x-axis direction. Thus, the manufacturing cost of the display device can be reduced.

The present disclosure is not limited to the case where the adhesive layer 70 is used to attach the display panel 10 and the module cover 15. For example, the magnet may be used to attach the display panel 10 and the module cover 15.

Figure 24:
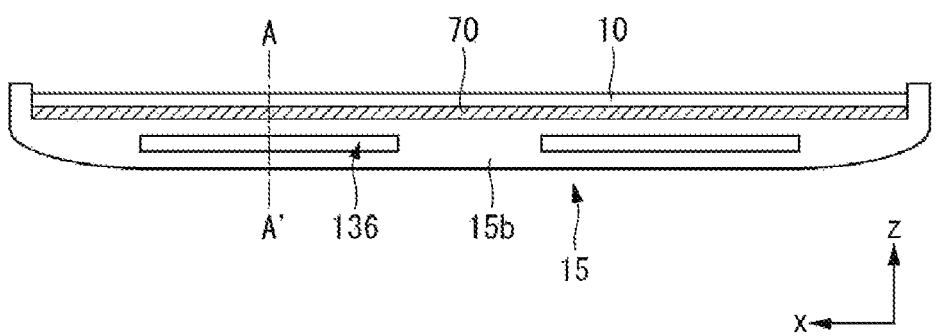
Figure 24:
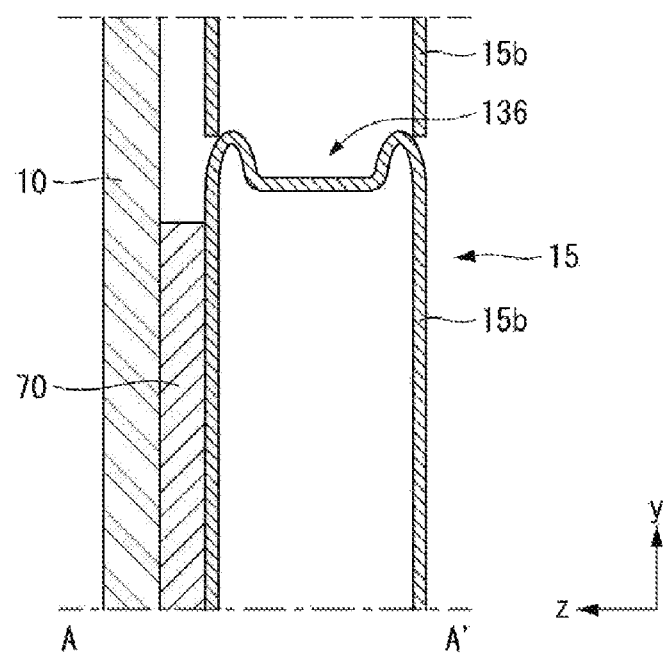

Referring to FIG. 24, a bead 136 may be formed on an upper surface of a segment 15b. The bead 136 may have a shape recessed to the inside of the segment 15b. The bead 136 may have a shape recessed in the −y-axis direction. A plurality of beads 136 may be formed on the segment 15b. The plurality of beads 136 may be spaced apart from each other. The beads 136 can improve rigidity of the segment 15b. For example, the bead 136 can prevent the shape of the segment 15b from being deformed by an external impact.

Figure 25:
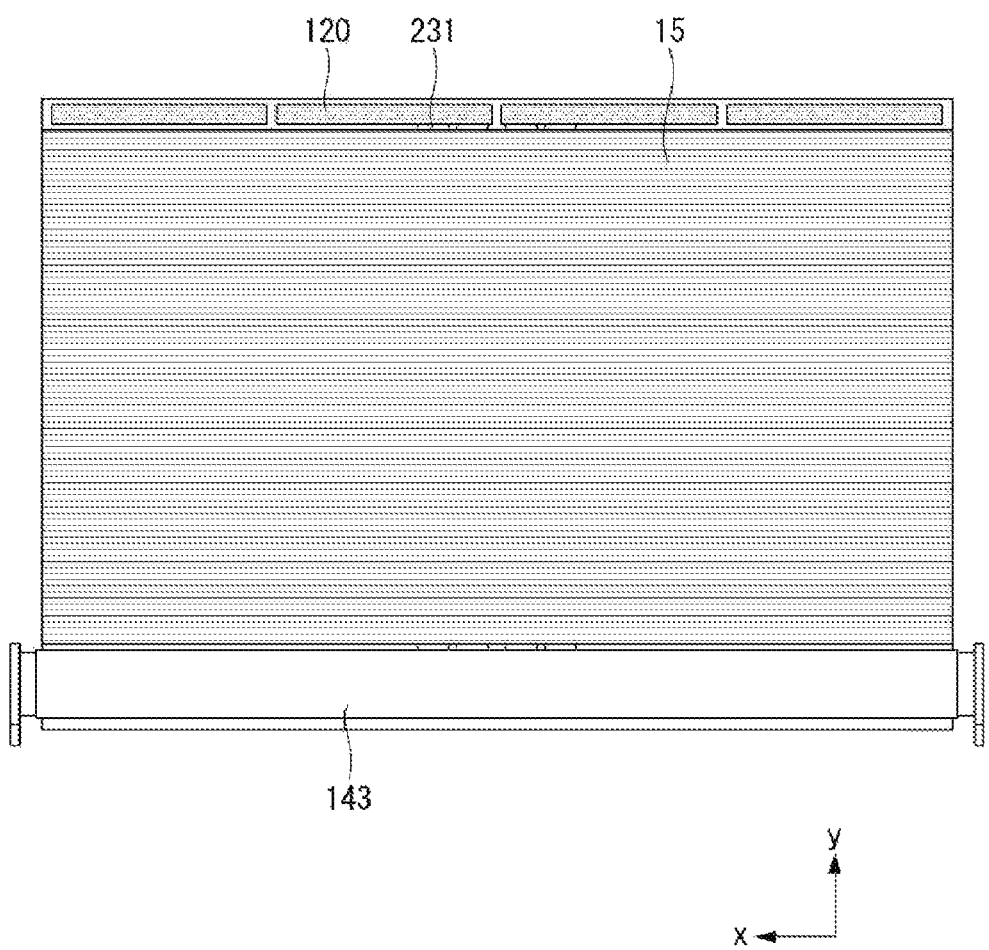

Referring to FIG. 25, the source PCB 120 may be positioned on the upper side of the module cover 15. When the first state changes to the second state, a location of the source PCB 120 may change depending on the movement of the module cover 15.

The FFC 231 may be positioned in the center of the module cover 15 with respect to the first direction. However, embodiments of the invention are not limited thereto. For example, the FFC 231 may be positioned at both ends of the module cover 15 with respect to the first direction.

Figure 26:
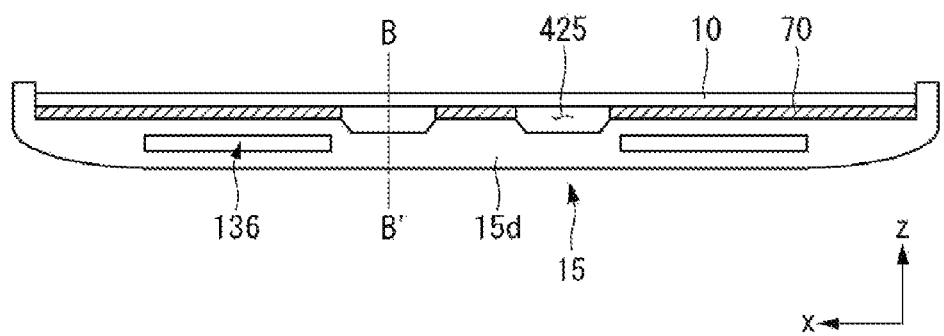
Figure 26:
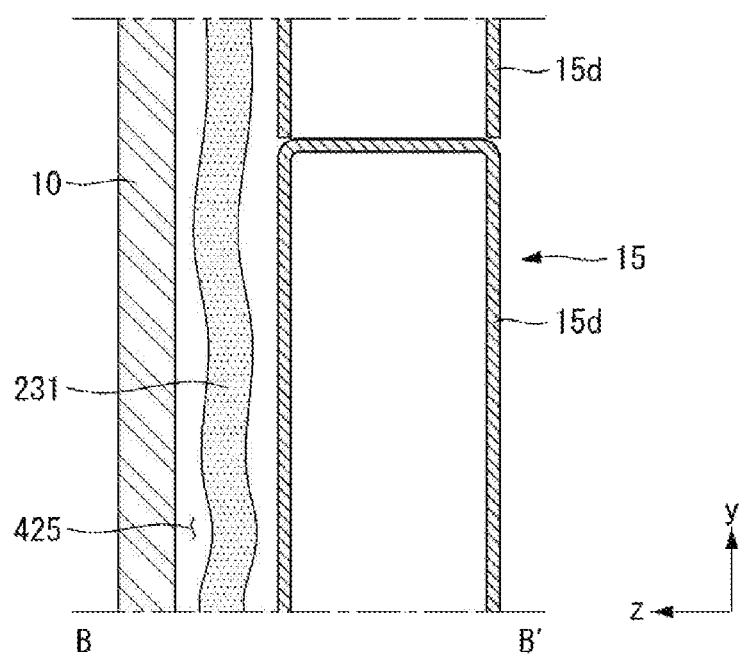

Referring to FIG. 26, a segment 15d may include a recess 425 that is recessed in the −z-axis direction. The recess 425 may form a space between the display panel 10 and the module cover 15. The FFC 231 may be accommodated in the space formed by the recess 425. The recess 425 can improve the rigidity of the segment 15d.

The bead 136 may be positioned on the segment 15d except a formation portion of the recess 425. The bead 136 may not be positioned in the formation portion of the recess 425 because a thickness of the segment 15d in the third direction decreases. However, embodiments of the invention are not limited thereto. For example, the bead 136 may be positioned in the formation portion of the recess 425.

Figure 27:
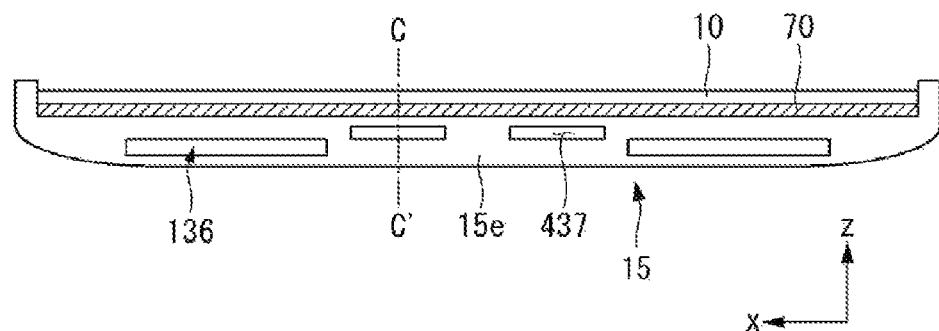
Figure 27:
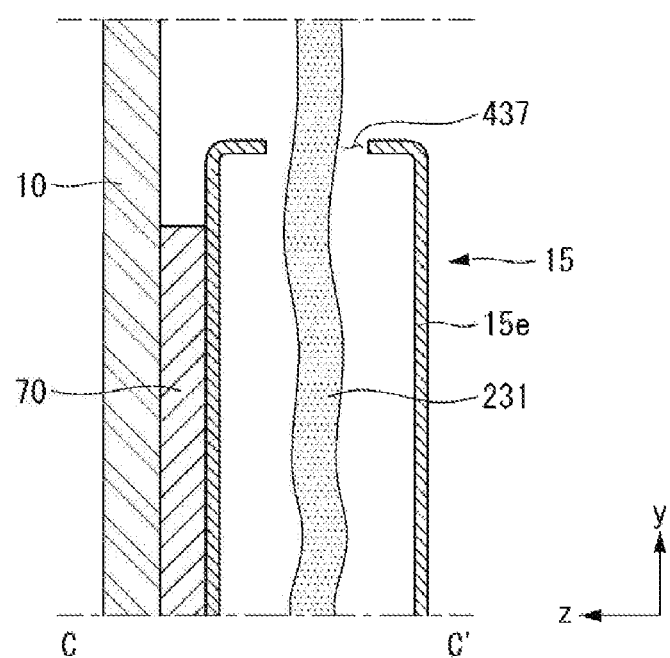

Referring to FIG. 27, a segment 15e may have a through portion 437 positioned in the center with respect to the first direction. The through portion 437 may pass through a central portion of the segment 15e in the second direction. Namely, the through portion 437 may be a hole positioned in the segment 15e. The through portion 437 may be a portion in which the FFC 231 is positioned. Because the through portion 437 is formed inside the segment 15e, a thickness of the segment 15e can further decrease compared to when the FFC 231 is positioned in the recess 425.

The bead 136 may be positioned on the segment 15e except a formation portion of the through portion 437. The bead 136 may not be positioned in the formation portion of the through portion 437 because the thickness of the segment 15e in the third direction decreases. However, embodiments of the invention are not limited thereto. For example, the bead 136 may be positioned in the formation portion of the through portion 437.

Figure 28:
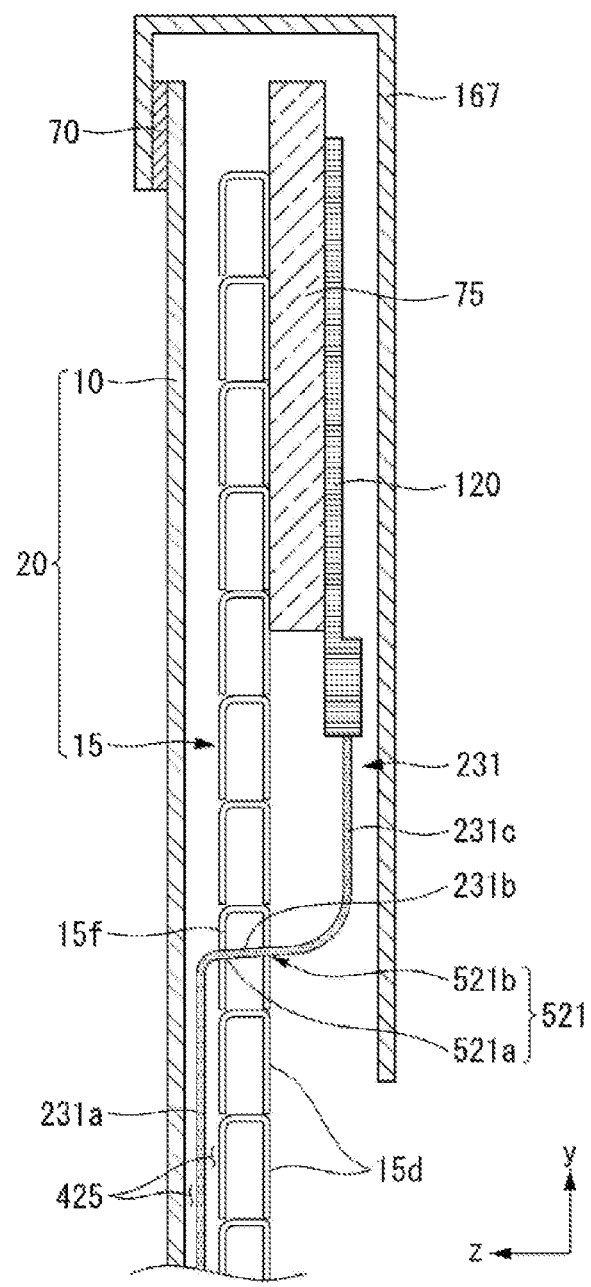

Referring to FIG. 28, in the display device according to the present disclosure, the top case 167 may shield the source PCB 120 and the upper bar 75 as well as the display panel 10 and the module cover 15. Hence, the appearance of the display device can be neat because the source PCB 120 is not exposed to the outside.

One surface of the upper bar 75 may be coupled to the rear surface of the module cover 15, and other surface of the upper bar 75 may be coupled to the source PCB 120. The upper bar 75 may be fixed to the module cover 15 and may support the source PCB 120.

Figure 29:
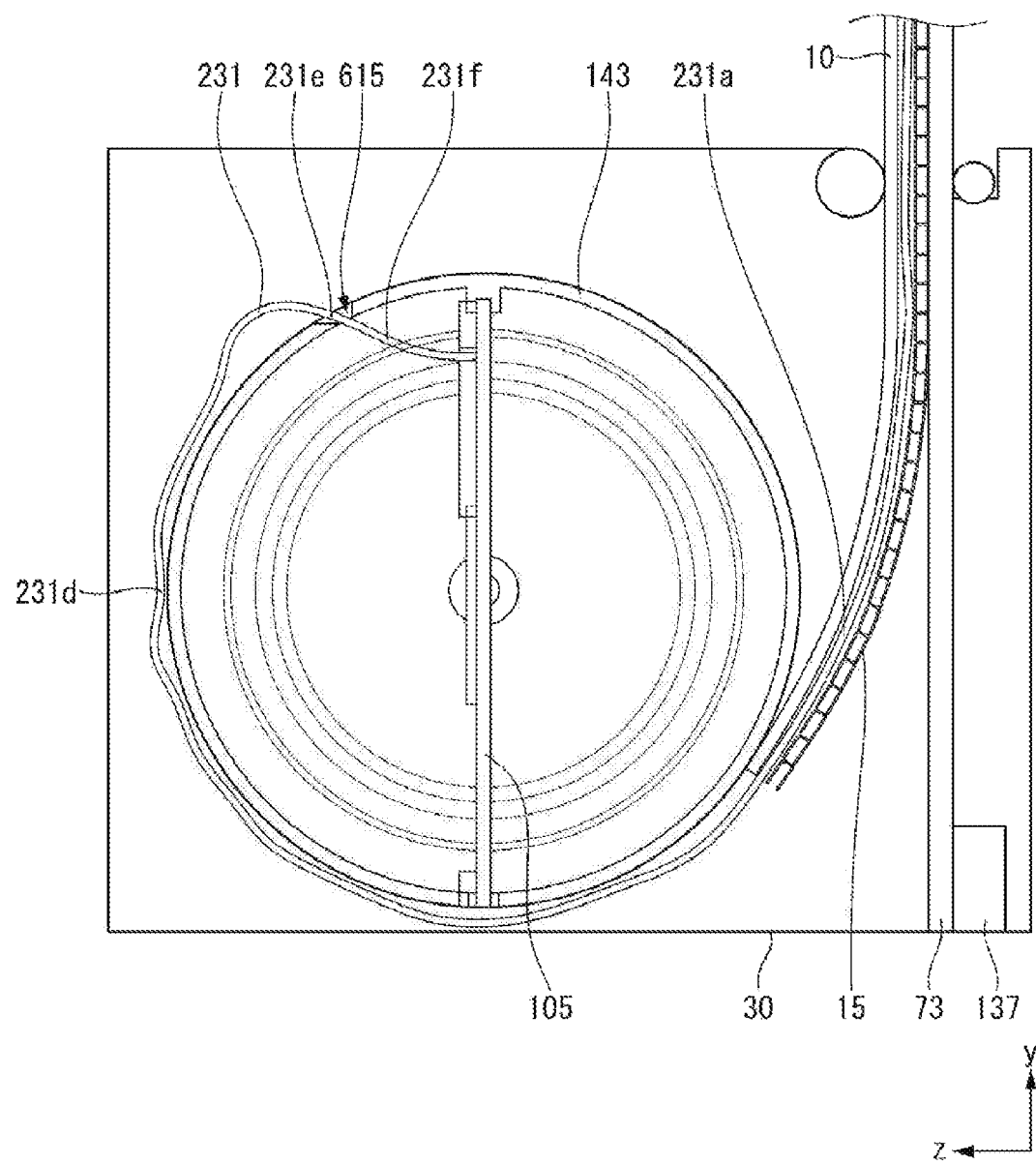

A lower end of the FFC 231 may be connected to the timing controller board 105 (see FIG. 29) inside the panel roller 143 (see FIG. 29). The FFC 231 and the display unit 20 may be rolled and unrolled from the panel roller 143.

A portion of the FFC 231 may be positioned between the display panel 10 and the module cover 15. The portion of the FFC 231 that is positioned between the display panel 10 and the module cover 15 may be referred to as a first portion 231a. The first portion 231a may be positioned in the recess 425 in which the plurality of segments 15d is formed. Alternatively, the first portion 231a may be accommodated in the recess 425 in which the plurality of segments 15d is formed.

A portion of the FFC 231 may pass through a segment 15f. The portion of the FFC 231 that passes through the segment 15f may be referred to as a second portion 231b. The segment 15f may include a first hole 521a formed at a front surface and a second hole 521b formed at a rear surface. The first hole 521a and the second hole 521b may be connected to each other to form one hole 521. The hole 521 may pass through the segment 15f in the third direction. The second portion 231b may pass through the hole 521. The hole 521 may be referred to as a connection hole 521.

An upper end of the FFC 231 may be electrically connected to the source PCB 120. A portion of the FFC 231 may be positioned on the rear surface of the module cover 15. The portion of the FFC 231 that is positioned on the rear surface of the module cover 15 may be referred to as a third portion 231c. The third portion 231c may be electrically connected to the source PCB 120.

The third portion 231c may be shielded by the top case 167. Hence, the third portion 231c may not be exposed to the outside.

Referring to FIG. 29, in the display device according to the present disclosure, the FFC 231 may be connected to the timing controller board 105 mounted on the panel roller 143. A through hole 615 may be positioned in the panel roller 143, and the FFC 231 may be connected to one side of the timing controller board 105 through the through hole 615.

The through hole 615 may be positioned on one side of the panel roller 143 and may pass through an outer circumferential portion of the panel roller 143. The FFC 231 may be connected to one side of the timing controller board 105 through the through hole 615.

In the display device according to the present disclosure, even if the FFC 231 is positioned on the outer circumference of the panel roller 143, the connection between the FFC 231 and the timing controller board 105 can be maintained by the through hole 615. Hence, the FFC 231 rotates together with the panel roller 143 and cannot be twisted.

A portion of the FFC 231 may be rolled on the panel roller 143. The portion of the FFC 231 rolled on the panel roller 143 may be referred to as a fourth portion 231d. The fourth portion 231d may contact an outer circumferential surface of the panel roller 143.

A portion of the FFC 231 may pass through the through hole 615. The portion of the FFC 231 that passes through the through hole 615 may be referred to as a fifth portion 231e.

The lower end of the FFC 231 may be electrically connected to the timing controller board 105. A portion of the FFC 231 may be positioned inside the panel roller 143. The portion of the FFC 231 that is positioned inside the panel roller 143 may be referred to as a sixth portion 231f. The sixth portion 231f may be electrically connected to the timing controller board 105.

Figure 30:
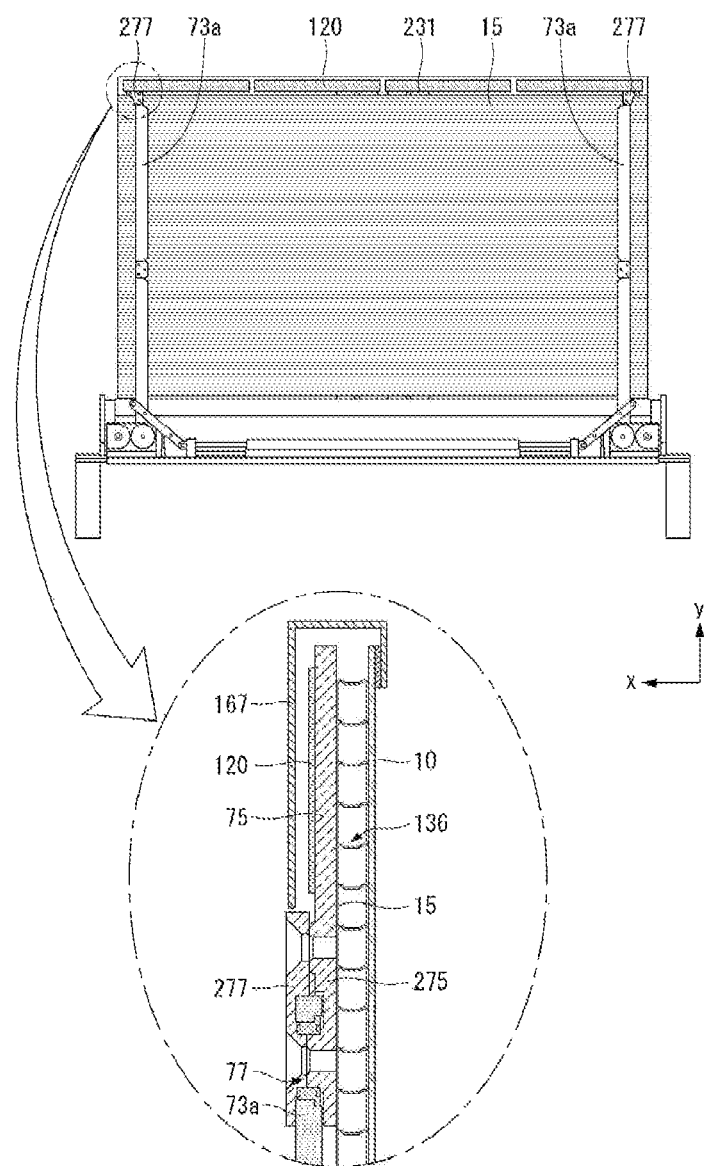
FIGS. 30 to 34 illustrate a display device according to another embodiment of the disclosure.

Referring to FIG. 30, the first arm 73a may be connected to both ends of the upper bar 75. The first arm 73a may be rotatably connected to a link bracket 277 through a coupling hole 77 positioned in the first arm 73a. The link bracket 277 may be coupled to a connection portion 275 of the upper bar 75. The link bracket 277 may be separated from the top case 167 downwardly (in −y-axis direction). The link bracket 277 may couple the first arm 73a to the connection portion 275 through at least one screw.

The small-sized display device can be implemented by coupling the module cover 15, the source PCB 120, and the first link 73a to the upper bar 75.

Figure 31A:
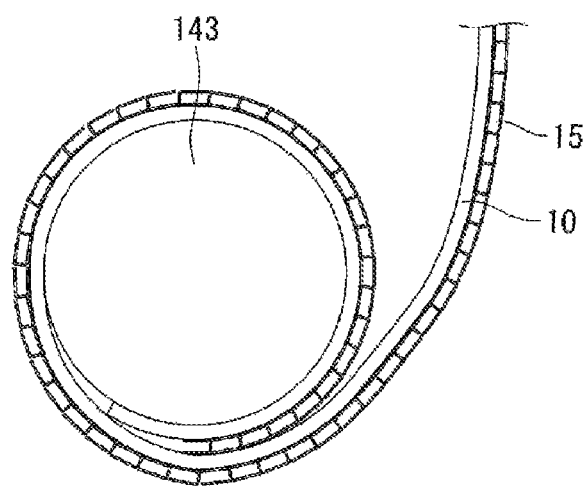
Figure 31B:
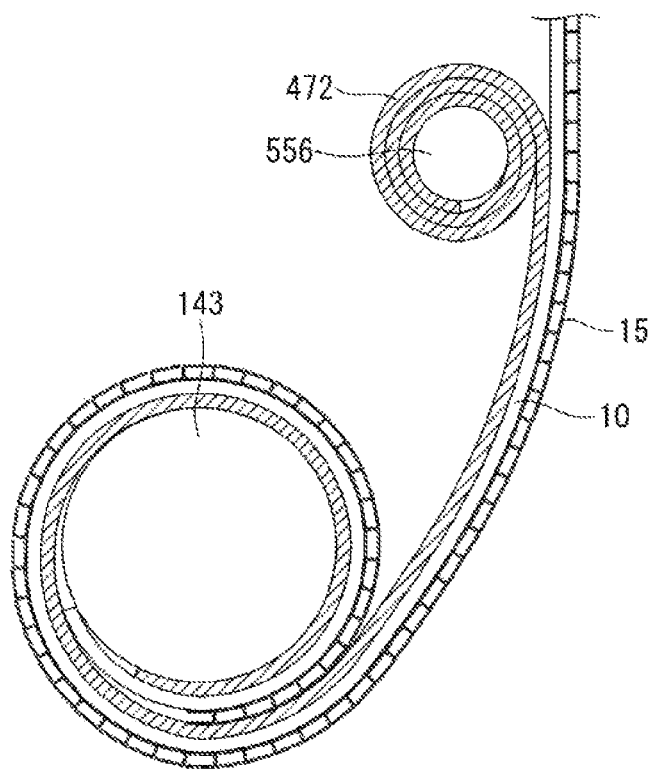

Referring to FIGS. 31A and 31B, an auxiliary roller 556 may be spaced apart from the panel roller 143. The auxiliary roller 556 may be connected to a protective sheet 472. One end of the protective sheet 472 may be connected to the auxiliary roller 556, and other end of the protective sheet 472 may be connected to the display panel 10. The auxiliary roller 556 may roll or unroll the protective sheet 472. The protective sheet 472 may include a nonwoven fabric.

The auxiliary roller 556 may be positioned adjacent to a portion in which the panel roller 143 rolls and unrolls. The auxiliary roller 556 may rotate in the opposite direction of a rotation direction of the panel roller 143. Namely, when the panel roller 143 unrolls the display panel 10, the auxiliary roller 556 may roll the protective sheet 472. Further, when the panel roller 143 rolls the display panel 10, the auxiliary roller 556 may unroll the protective sheet 472.

Referring to FIG. 31A, if the protective sheet 472 is not included, the module cover 15 and the display panel 10 may rub against each other when the panel roller 143 rolls and unrolls the module cover 15 and the display panel 10. The display panel 10 may be damaged by friction with the module cover 15.

Referring to FIG. 31B, the display panel 10, the module cover 15, and the protective sheet 472 may be together rolled and unrolled from the panel roller 143. If the display panel 10, the module cover 15, and the protective sheet 472 are rolled on the panel roller 143, the protective sheet 472 may be positioned between the display panel 10 and the module cover 15. The protective sheet 472 can prevent friction between the display panel 10 and the module cover 15. The protective sheet 472 can prevent a damage of the display panel 10 by preventing the friction between the display panel 10 and the module cover 15.

Figure 32:
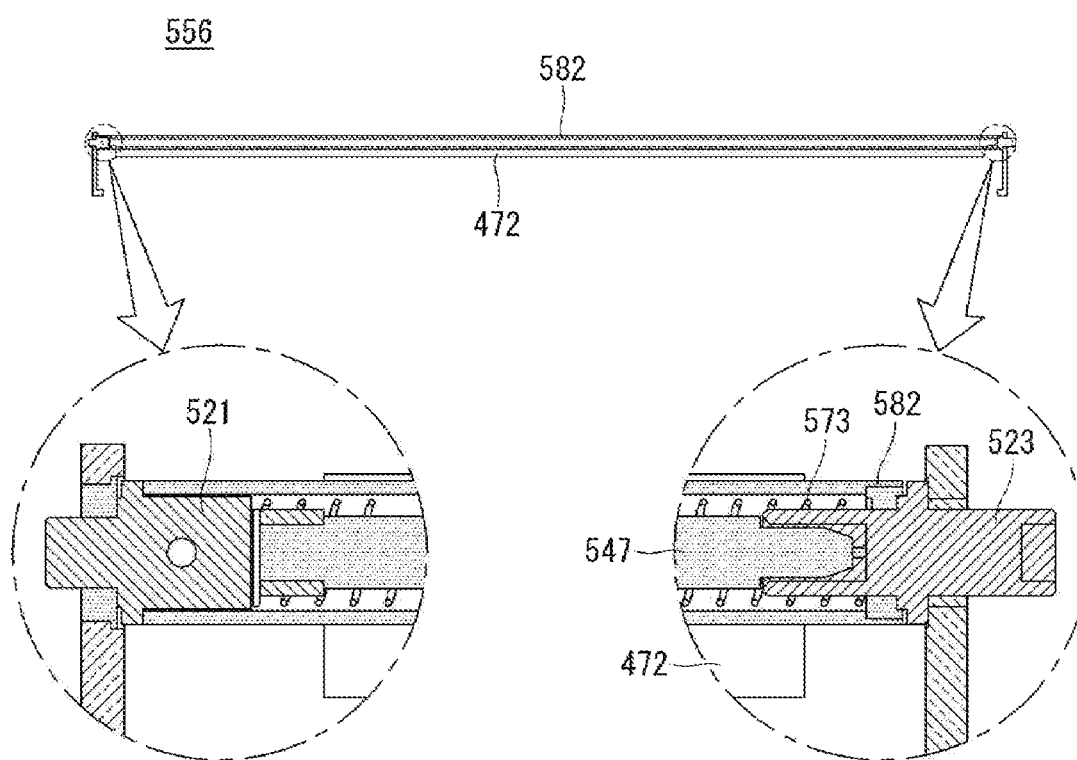

Referring to FIG. 32, the auxiliary roller 556 may include a fixed cap 521, a rotating cap 523, a shaft 547, a coil spring 573, and a roller cover 582.

The coil spring 573 may be disposed inside the auxiliary roller 556. A longitudinal direction of the coil spring 573 may be parallel to a longitudinal direction of the auxiliary roller 556.

The fixed cap 521 may be positioned at one end of the auxiliary roller 556. The fixed cap 521 may be coupled to one end of the coil spring 573. The fixed cap 521 may be fixed regardless of a rotation of the roller cover 582. The fixed cap 521 may not rotate.

The rotating cap 523 may be positioned at other end of the auxiliary roller 556. The rotating cap 523 may be coupled to other end of the coil spring 573. When the roller cover 582 rotates, the rotating cap 523 may rotate together with the roller cover 582.

When the roller cover 582 rotates, the fixed cap 521 at one side may not rotate, the rotating cap 523 may rotate together with the roller cover 582, and the coil spring 573 may be elastically deformed. The coil spring 573 may store energy during the elastic deformation and apply a restoring force to the rotating cap 523. The restoring force of the coil spring 573 may act in the opposite direction of a rotation direction of the rotating cap 523.

Hence, as the protective sheet 472 is unrolled from the auxiliary roller 556, a force of rolling again the protective sheet 472 on the auxiliary roller 556 may act on the auxiliary roller 556. That is, when the display panel is unrolled from the panel roller, the protective sheet 472 may be rolled on the auxiliary roller 556.

As the protective sheet 472 is rolled on the auxiliary roller 556, a force of unrolling again the protective sheet 472 from the auxiliary roller 556 may act on the auxiliary roller 556. That is, when the display panel is rolled on the panel roller, the protective sheet 472 may be unrolled from the auxiliary roller 556.

The shaft 547 may be a central axis of the auxiliary roller 556. The shaft 547 may be connected to the fixed cap 521. The coil spring 573 may be inserted into the shaft 547. The shaft 547 may assist so that the coil spring 573 is stably positioned inside the auxiliary roller 556.

The roller cover 582 may form an appearance of the auxiliary roller 556. The roller cover 582 may accommodate the fixed cap 521, the rotating cap 523, the shaft 547, and the coil spring 573. The roller cover 582 may be connected to one end of the protective sheet 472. That is, the protective sheet 472 may be rolled on the roller cover 582.

Figure 33:
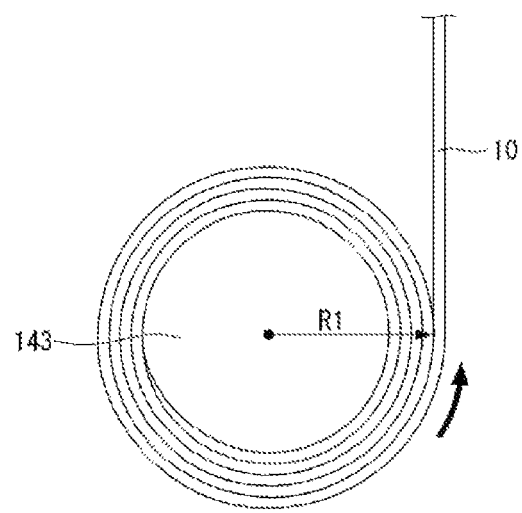
Figure 33:
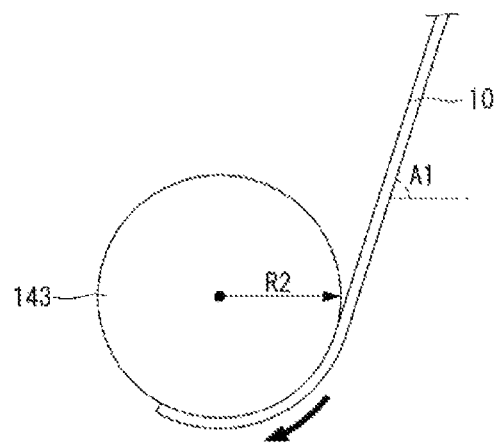

Referring to FIG. 33, a radius formed by the panel roller 143 and the display panel 10 rolled on the panel roller 143 may be denoted as R1. A value of R1 may vary depending on a rolling degree of the display panel 10 on the panel roller 143. A radius of the panel roller 143 may be denoted as R2.

The panel roller 143 may be fixed inside the housing 30 (see FIG. 7). Further, the entrance 30*a* (see FIG. 7) of the housing 30 through which the display panel 10 passes may be fixed. Thus, an angle formed by the display panel 10 unrolled from the panel roller 143 inside the housing 30 and the base 31 (see FIG. 10A) may vary depending on R1.

When the display panel 10 is sufficiently unrolled from the panel roller 143, the radius formed by the panel roller 143 and the display panel 10 rolled on the panel roller 143 is the radius R2 of the panel roller 143. In this instance, the display panel 10 may be inclined to the base 31 by an angle A1. When the display panel 10 may be inclined to the base 31, the moving up and down of the display panel 10 may be unstable.

Figure 34:
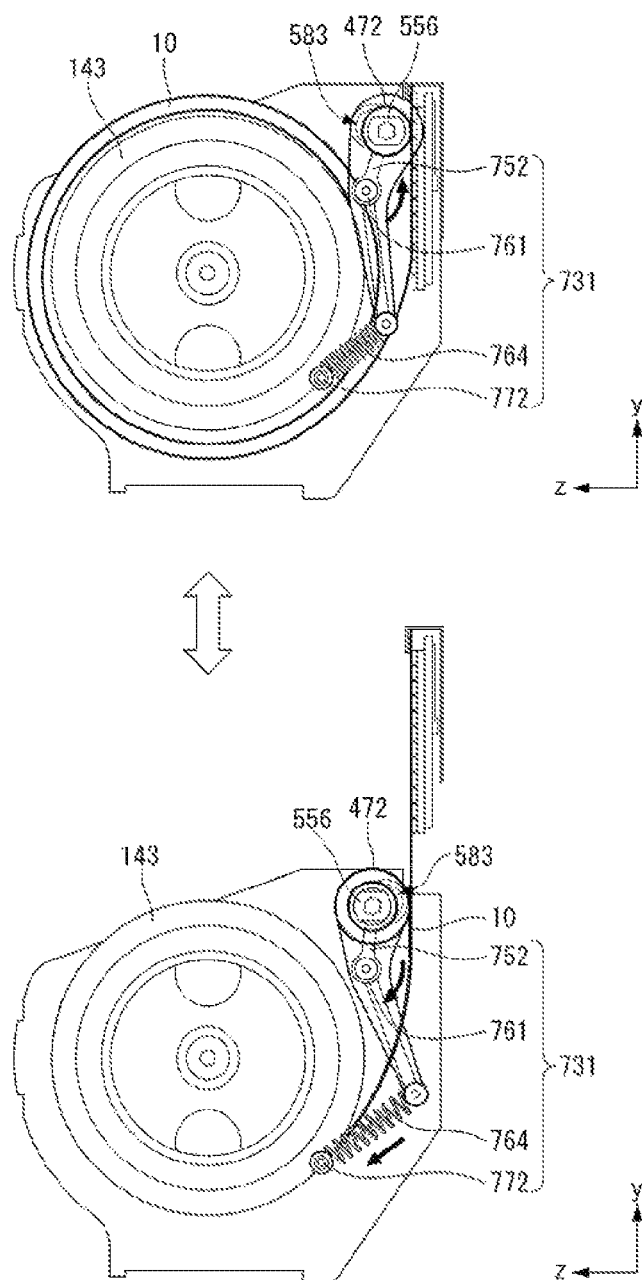

Referring to FIG. 34, a guide assembly 731 may be coupled to the auxiliary roller 556.

The auxiliary roller 556 can prevent the display panel 10 from being inclined to the base 31 (see FIG. 10A). The auxiliary roller 556 can stably guide the display panel 10 unrolled from the panel roller 143. However, the radius formed by the panel roller 143 and the display panel 10 rolled on the panel roller 143 may vary depending on a rolling degree of the protective sheet 472 on the auxiliary roller 556.

The guide assembly 731 may be coupled to the auxiliary roller 556 and may adjust a location of the auxiliary roller 556 depending on a rolling degree of the protective sheet 472 on the auxiliary roller 556. Hence, the auxiliary roller 556 can stably guide the display panel 10 unrolled from the panel roller 143 even if the radius formed by the auxiliary roller 556 and the protective sheet 472 rolled on the auxiliary roller 556 varies.

The guide assembly 731 may include a guide arm 752, a pin bolt 761, a tension spring 764, and a supporter 772. One end of the guide arm 752 may be connected to the auxiliary roller 556, and other end of the guide arm 752 may be connected to the tension spring 764. The guide arm 752 may rotate around the pin bolt 761. The pin bolt 761 may be fixed to the housing. The auxiliary roller 556 may be connected to the guide arm 752 and may rotate around the pin bolt 761.

One end of the tension spring 764 may be connected to the guide arm 762, and the other end of the tension spring 764 may be connected to the supporter 772. The supporter 772 may be fixed to the housing 30.

When the display panel 10 is unrolled from the panel roller 143, the auxiliary roller 556 may roll the protective sheet 472, and the radius formed by the auxiliary roller 556 and the protective sheet 472 rolled on the auxiliary roller 556 may increase. In addition, the auxiliary roller 556 may rotate counterclockwise around the pin bolt 761. In this instance, the tension spring 764 may apply a force to rotate the guide arm 752 clockwise. The tension spring 764 can prevent the auxiliary roller 556 from excessively rotating counterclockwise around the pin bolt 761.

When the display panel 10 is rolled on the panel roller 143, the protective sheet 472 may be unrolled from the auxiliary roller 556, and the radius formed by the auxiliary roller 556 and the protective sheet 472 rolled on the auxiliary roller 556 may decrease. In addition, the auxiliary roller 556 may rotate clockwise around the pin bolt 761.

The tension spring 764 can prevent the auxiliary roller 556 from rotating counterclockwise around the pin bolt 761.

The following description will be given focusing on different configurations and actions from the embodiments described above, and the description of configurations equivalent to or similar to the embodiments described above is omitted to avoid the duplicate description.

Figure 35:
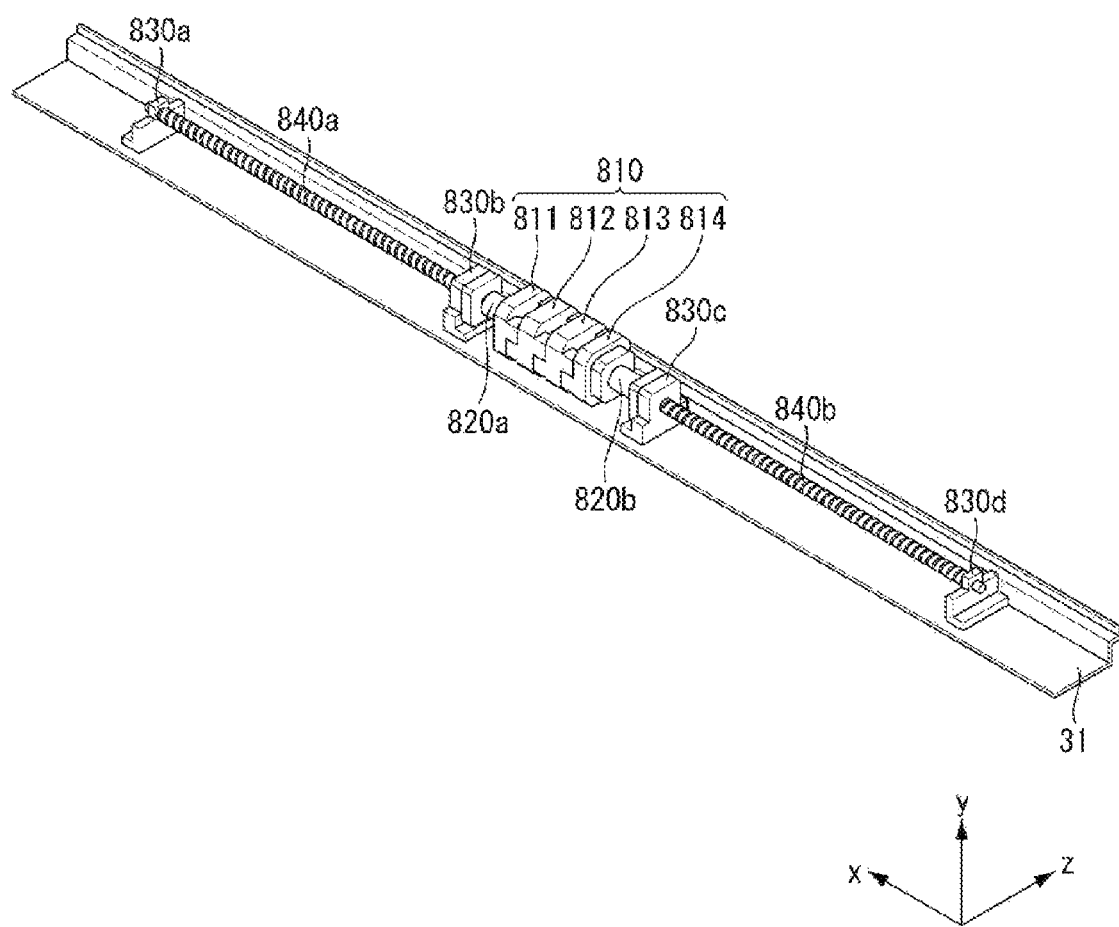
FIGS. 35 to 64 illustrate a display device according to another embodiment of the disclosure.

Referring to FIG. 35, a motor assembly 810 may be installed on the base 31. The base 31 may be the bottom of the housing 30 (see FIG. 19). Drive shafts may be formed on both sides of the motor assembly 810. A right drive shaft and a left drive shaft of the motor assembly 810 may rotate in the same direction. Alternatively, the right drive shaft and the left drive shaft of the motor assembly 810 may rotate in opposite directions.

The motor assembly 810 may include a plurality of motors. The plurality of motors may be connected in series with each other. The plurality of motors may be arranged in order of a first motor 811, a second motor 812, a third motor 813, and a fourth motor 814 from right to left. The right drive shaft of the motor assembly 810 may be formed in the first motor 811, and the left drive shaft of the motor assembly 810 may be formed in the fourth motor 814. The motor assembly 810 can output a high torque by connecting the plurality of motors in series.

The motor assembly 810 may be connected to lead screws 840a and 840b. The lead screws 840a and 840b may include a right lead screw 840a connected to the right side of the motor assembly 810 and a left lead screw 840b connected to the left side of the motor assembly 810. The right lead screw 840a may be referred to as a first lead screw 840a, and the left lead screw 840b may be referred to as a second lead screw 840b.

The right drive shaft of the motor assembly 810 may be connected to the right lead screw 840a. Alternatively, the right drive shaft of the motor assembly 810 and the right lead screw 840a may be connected to each other through a right coupling 820a. Alternatively, a drive shaft of the first motor 811 may be connected to the right lead screw 840a. Alternatively, the drive shaft of the first motor 811 and the right lead screw 840a may be connected to each other through the right coupling 820a. The right drive shaft may be referred to as a first drive shaft, and the left drive shaft may be referred to as a second drive shaft.

The left drive shaft of the motor assembly 810 may be connected to the left lead screw 840b. Alternatively, the left drive shaft of the motor assembly 810 and the left lead screw 840b may be connected to each other through a left coupling 820b. Alternatively, a drive shaft of the fourth motor 814 may be connected to the left lead screw 840b. Alternatively, the drive shaft of the fourth motor 814 and the left lead screw 840b may be connected to each other through the left coupling 820b.

The couplings 820a and 820b may include the right coupling 820a connecting the right drive shaft of the motor assembly 810 to the right lead screw 840a, and the left coupling 820b connecting the left drive shaft of the motor assembly 810 to the left lead screw 840b.

Each of the lead screws 840a and 840b may be formed with a screw thread in the longitudinal direction. A direction of the screw thread of the right lead screw 840a and a direction of the screw thread of the left lead screw 840b may be opposite to each other. Alternatively, the direction of the screw thread of the right lead screw 840a and the direction of the screw thread of the left lead screw 840b may be the same.

Bearings 830a, 830b, 830c and 830d may be installed on the base 31. The plurality of bearings 830a, 830b, 830c and 830d may be formed along a longitudinal direction of the base 31. The bearings 830a, 830b, 830c and 830d may include right bearings 830a and 830b on the right side of the motor assembly 810 and left bearings 830c and 830d on the left side of the motor assembly 810.

The bearings 830a, 830b, 830c and 830d may support the lead screws 840a and 840b. The lead screws 840a and 840b may be connected to the drive shafts of the motor assembly 810 and may rotate. The bearings 830a, 830b, 830c and 830d may support the lead screws 840a and 840b without disturbing the rotation of the lead screws 840a and 840b.

The right bearings 830a and 830b may support the right lead screw 840a. The right bearings 830a and 830b may include a first right bearing 830a supporting the right side of the right lead screw 840a, and a second right bearing 830b supporting the left side of the right lead screw 840a. The first right bearing 830a may be referred to as a first bearing 830a, and the second right bearing 830b may be referred to as a second bearing 830b.

The left bearings 830c and 830d may support the left lead screw 840b. The left bearings 830c and 830d may include a first left bearing 830c supporting the right side of the left lead screw 840b, and a second left bearing 830d supporting the left side of the left lead screw 840b.

The bearings 830a, 830b, 830c and 830d, the couplings 820a and 820b, and the motor assembly 810 may be arranged in order of the first right bearing 830a, the second right bearing 830b, the right coupling 820a, the motor assembly 810, the left coupling 820b, the first left bearing 830c, and the second left bearing 830d from right to left.

Figure 36:
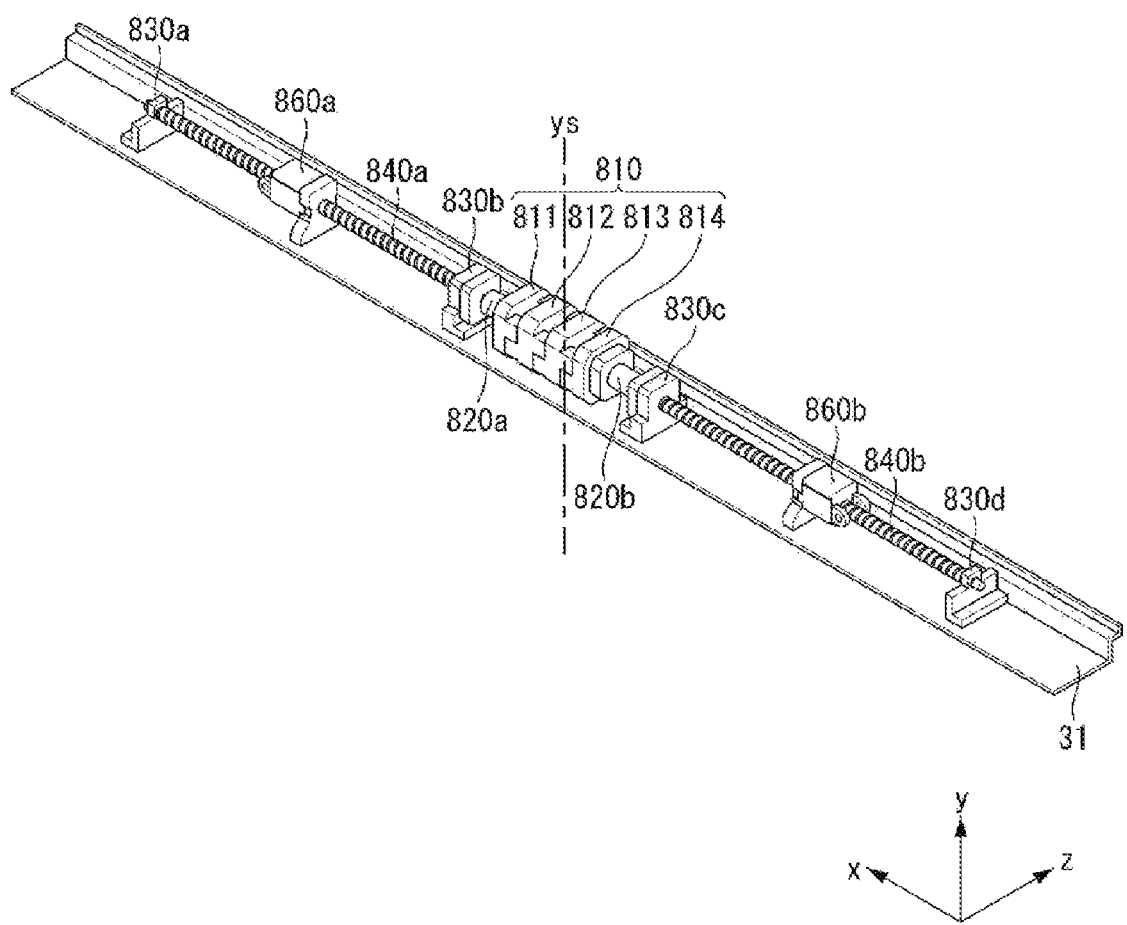
Figure 37:
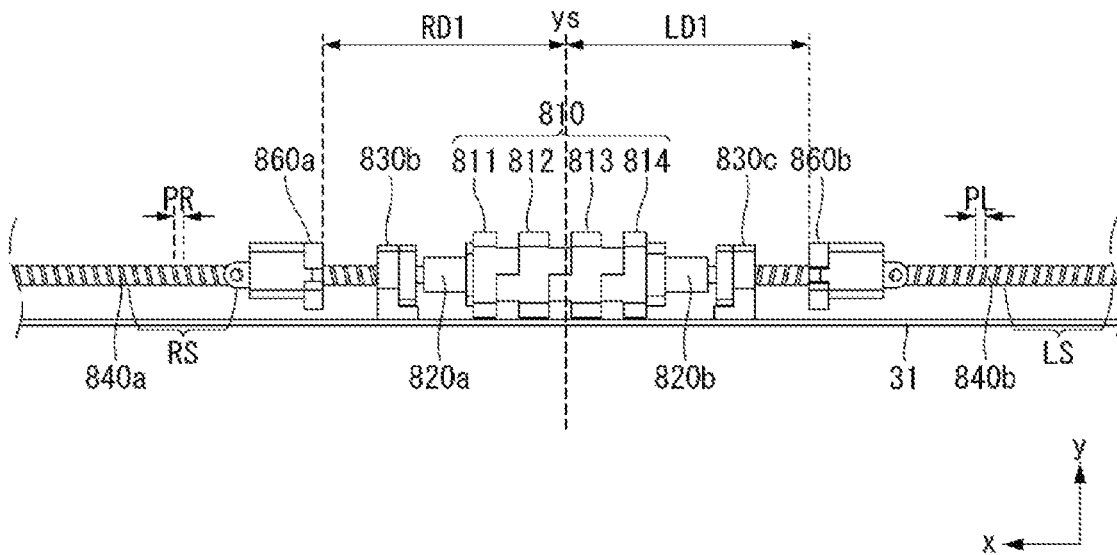

Referring to FIGS. 36 and 37, the display device may further include sliders 860a and 860b. The sliders 860a and 860b may be coupled to the lead screws 840a and 840b, and the lead screws 840a and 840b may be disposed to pass through the sliders 860a and 860. The plurality of sliders 860a and 860b may be used. The sliders 860a and 860b may include a right slider 860a coupled to the right lead screw 840a, and a left slider 860b coupled to the left lead screw 840b. The right slider 860a may be referred to as a first slider 860a, and the left slider 860b may be referred to as a second slider 860b.

Figure 43:
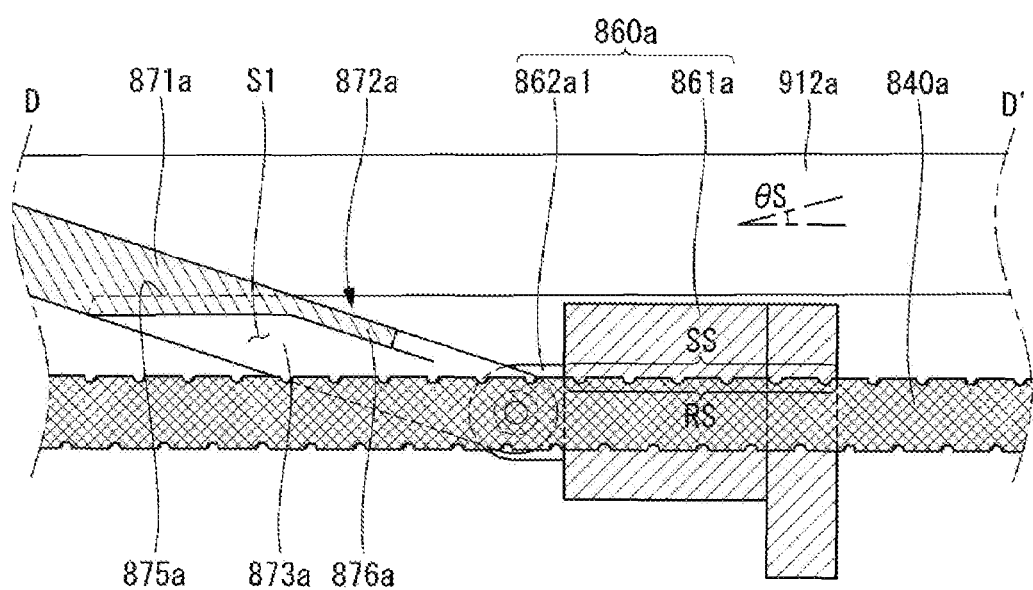
Figure 44A:
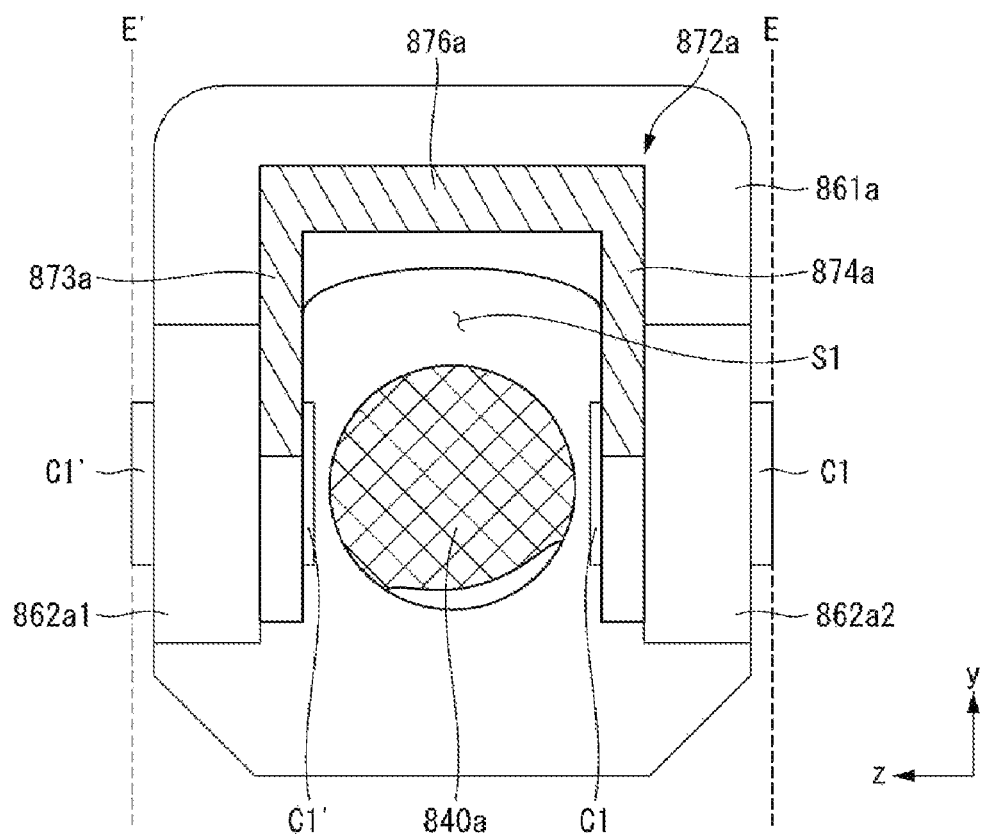
Figure 44B:
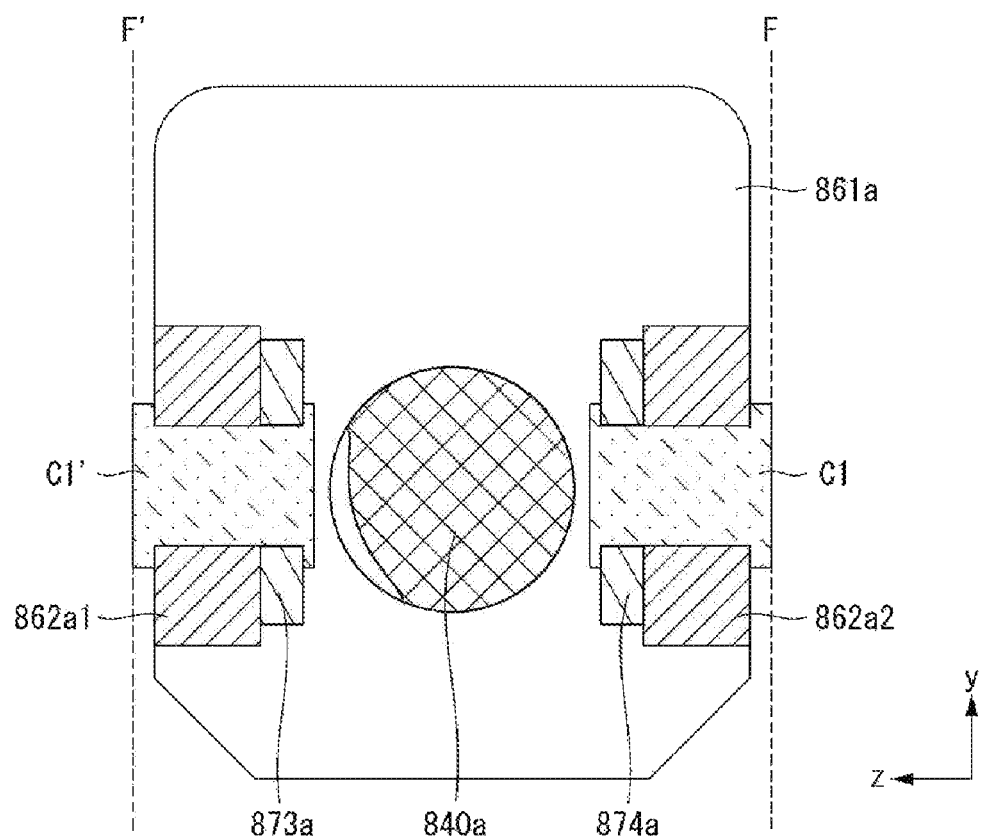

A screw thread SS (see FIG. 43) may be formed on an inner perimeter surface of each of the sliders 860a and 860b. The screw threads SS on the inner perimeter surface of each of the sliders 860a and 860b may be engaged with screw threads RS and LS on the lead screws 840a and 840b. The sliders 860a and 860b may move back and forth in the longitudinal direction of the lead screws 840a and 840b according to the rotation of the lead screws 840a and 840b.

The right slider 860a may be engaged with the right lead screw 840a. The right slider 860a may move back and forth between the first right bearing 830a and the second right bearing 830b according to the rotation of the right lead screw 840a.

The left slider 860b may be engaged with the left lead screw 840b. The left slider 860b may move back and forth between the first left bearing 830c and the second left bearing 830d according to the rotation of the left lead screw 840b.

The right slider 860a may be spaced apart from a symmetry axis ys of the motor assembly 810 by a distance RD1. The left slider 860b may be spaced apart from the symmetry axis ys of the motor assembly 810 by a distance LD1. The distance RD1 and the distance LD1 may be set to the same length. That is, the right slider 860a and the left slider 860b may be symmetrical to each other with respect to the symmetry axis ys of the motor assembly 810.

The motor assembly 810 may be configured such that a rotation direction of the right drive shaft and a rotation direction of the left drive shaft are equally output. A direction of the screw thread RS of the right lead screw 840*a* and a direction of the screw thread LS of the left lead screw 840*b* may be opposite to each other. Hence, when the right slider 860*a* moves in the +x-axis direction according to the rotation of the right drive shaft, the left slider 860*b* may move in the −x-axis direction according to the rotation of the left drive shaft. Alternatively, when the right slider 860*a* moves in the −x-axis direction according to the rotation of the right drive shaft, the left slider 860*b* may move in the +x-axis direction according to the rotation of the left drive shaft.

Figure 38:
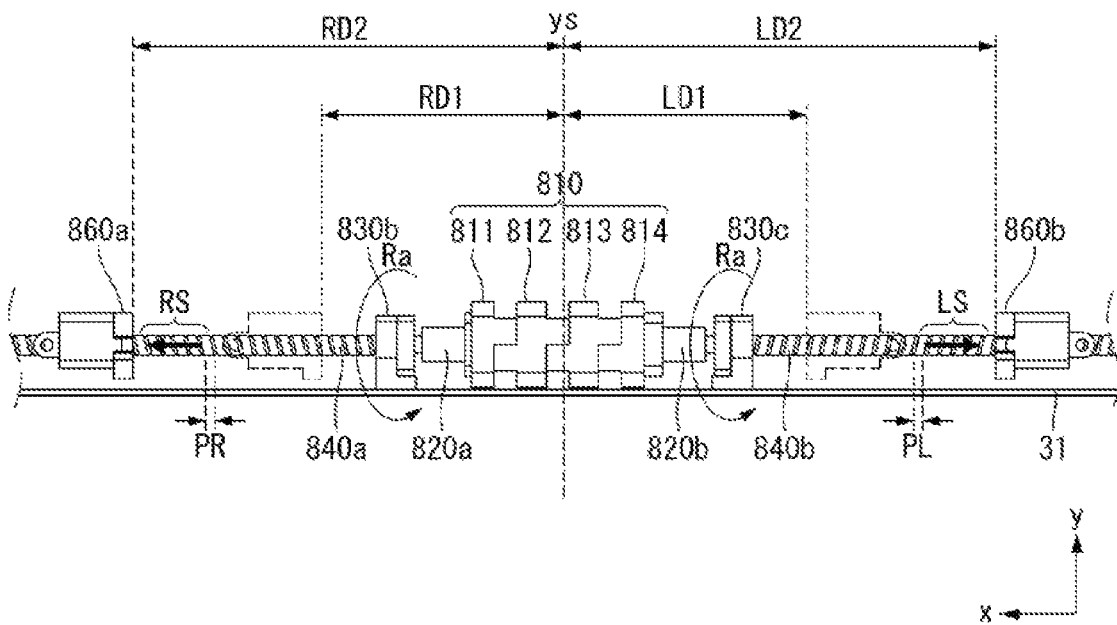

Referring to FIG. 38, a direction of the screw thread RS of the right lead screw 840*a* and a direction of the screw thread LS of the left lead screw 840*b* may be opposite to each other. The right lead screw 840*a* may have a pitch PR, and the left lead screw 840*b* may have a pitch PL. The pitch PR of the right lead screw 840*a* and the pitch PL of the left lead screw 840*b* may be set to the same length.

The motor assembly 810 may be configured such that an output of the right drive shaft and an output of the left drive shaft are equally output. A rotation direction Ra of the right drive shaft and a rotation direction Ra of the left drive shaft may be the same as each other. The number of revolutions per unit time in the right drive shaft and the number of revolutions per unit time in the left drive shaft may be the same as each other. A direction of torque of the right drive shaft and a direction of torque of the left drive shaft may be the same as each other. A magnitude of torque of the right drive shaft and a magnitude of torque of the left drive shaft may be the same as each other.

The right slider 860*a* may move in the +x-axis direction according to the rotation of the right drive shaft at a location that is spaced apart from the symmetry axis ys of the motor assembly 810 by a distance RD1. When the right drive shaft rotates n times, the right slider 860*a* may be spaced apart from the symmetry axis ys of the motor assembly 810 by a distance RD2. In this case, the distance RD1 and the distance RD2 may have a difference of (the number n of revolutions) *(pitch PR of the right slider 860*a*).

The left slider 860*b* may move in the −x-axis direction according to the rotation of the left drive shaft at a location that is spaced apart from the symmetry axis ys of the motor assembly 810 by a distance LD1. When the left drive shaft rotates n times, the left slider 860*b* may be spaced apart from the symmetry axis ys of the motor assembly 810 by a distance LD2. In this case, the distance LD1 and the distance LD2 may have a difference of (the number n of revolutions) *(pitch PL of the left slider 860*b*).

That is, when the pitch PR of the right slider 860*a* and the pitch PL of the left slider 860*b* are the same as each other, a displacement of the right slider 860*a* and a displacement of the left slider 860*b* may have the same magnitude and opposite directions.

When initial locations of the right slider 860*a* and the left slider 860*b* are symmetrical with respect to the symmetry axis ys of the motor assembly 810, the right slider 860*a* and the left slider 860*b* may be far from each other while maintaining the symmetry with respect to the symmetry axis ys of the motor assembly 810.

Figure 39:
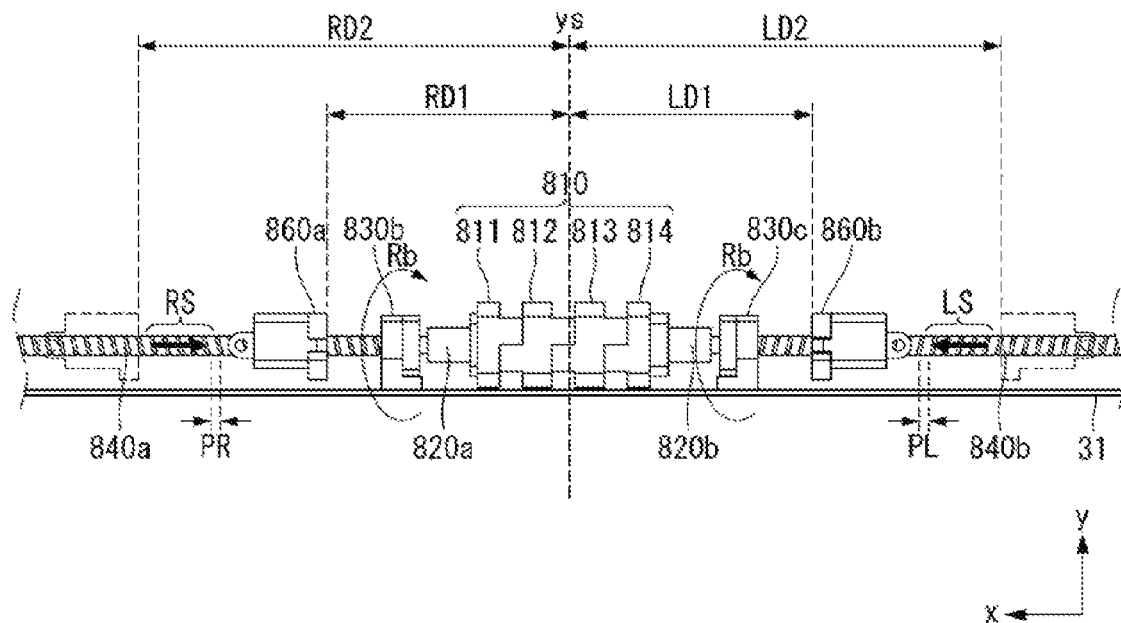

Referring to FIG. 39, the right slider 860*a* may move in the −x-axis direction according to the rotation of the right drive shaft at a location that is spaced apart from the symmetry axis ys of the motor assembly 810 by a distance RD2. A rotation direction Rb of the right drive shaft and a rotation direction Rb of the left drive shaft may be the same as each other. When the right drive shaft rotates n times, the right slider 860*a* may be spaced apart from the symmetry axis ys of the motor assembly 810 by a distance RD1. In this case, the distance RD1 and the distance RD2 may have a difference of (the number n of revolutions)*(pitch PR of the right slider 860*a*).

The left slider 860*b* may move in the +x-axis direction according to the rotation of the left drive shaft at a location that is spaced apart from the symmetry axis ys of the motor assembly 810 by a distance LD2. When the left drive shaft rotates n times, the left slider 860*b* may be spaced apart from the symmetry axis ys of the motor assembly 810 by a distance LD1. In this case, the distance LD1 and the distance LD2 may have a difference of (the number n of revolutions) *(pitch PL of the left slider 860*b*).

That is, when the pitch PR of the right slider 860*a* and the pitch PL of the left slider 860*b* are the same as each other, a displacement of the right slider 860*a* and a displacement of the left slider 860*b* may have the same magnitude and opposite directions.

When initial locations of the right slider 860*a* and the left slider 860*b* are symmetrical with respect to the symmetry axis ys of the motor assembly 810, the right slider 860*a* and the left slider 860*b* may be close to each other while maintaining the symmetry with respect to the symmetry axis ys of the motor assembly 810.

Figure 40:
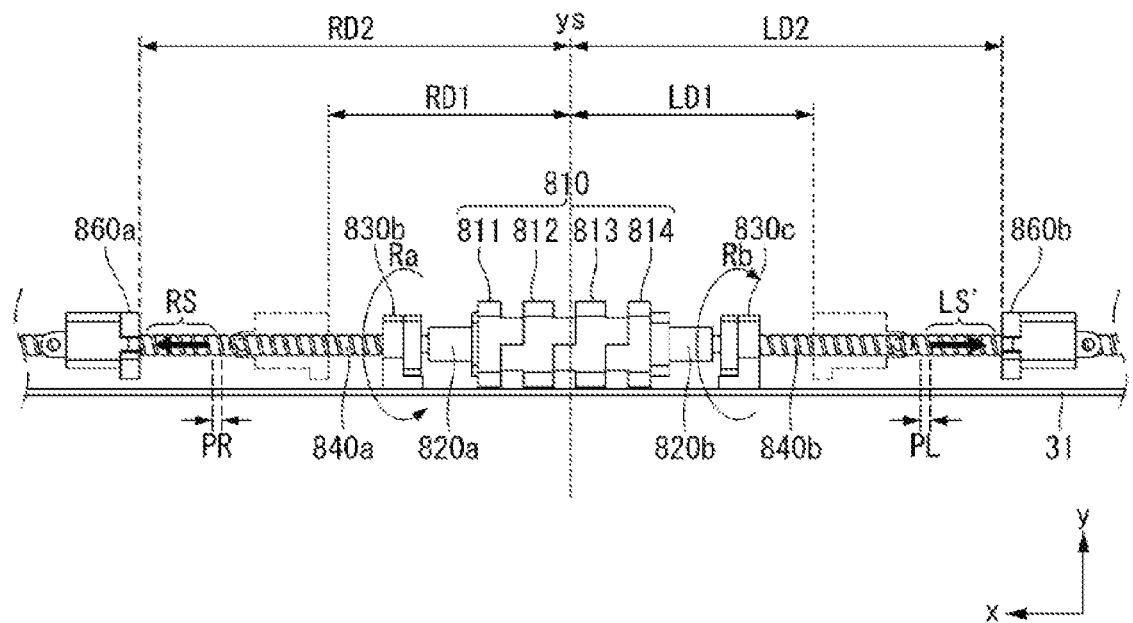

Referring to FIG. 40, the motor assembly 810 may be configured such that a rotation direction Ra of the right drive shaft and a rotation direction Rb of the left drive shaft are output in opposite directions. A direction of the screw thread RS of the right lead screw 840*a* and a direction of the screw thread LS of the left lead screw 840*b* may be the same. Hence, when the right slider 860*a* moves in the +x-axis direction according to the rotation of the right drive shaft, the left slider 860*b* may move in the −x-axis direction according to the rotation of the left drive shaft. Alternatively, when the right slider 860*a* moves in the −x-axis direction according to the rotation of the right drive shaft, the left slider 860*b* may move in the +x-axis direction according to the rotation of the left drive shaft.

The right lead screw 840*a* may have a pitch PR, and the left lead screw 840*b* may have a pitch PL. The pitch PR of the right lead screw 840*a* and the pitch PL of the left lead screw 840*b* may be set to the same length.

The motor assembly 810 may be configured such that an output of the right drive shaft and an output of the left drive shaft are equally output. A rotation direction of the right drive shaft and a rotation direction of the left drive shaft may be opposite to each other. The number of revolutions per unit time in the right drive shaft and the number of revolutions per unit time in the left drive shaft may be the same as each other. A direction of torque of the right drive shaft and a direction of torque of the left drive shaft may be opposite to each other. A magnitude of torque of the right drive shaft and a magnitude of torque of the left drive shaft may be the same as each other.

The right slider 860*a* may move in the +x-axis direction according to the rotation of the right drive shaft at a location that is spaced apart from the symmetry axis ys of the motor assembly 810 by a distance RD1. When the right drive shaft rotates n times, the right slider 860*a* may be spaced apart from the symmetry axis ys of the motor assembly 810 by a distance RD2. In this case, the distance RD1 and the distance RD2 may have a difference of (the number n of revolutions) *(pitch PR of the right slider 860*a*).

The left slider 860*b* may move in the −x-axis direction according to the rotation of the left drive shaft at a location that is spaced apart from the symmetry axis ys of the motor assembly 810 by a distance LD1. When the left drive shaft rotates n times, the left slider 860*b* may be spaced apart from the symmetry axis ys of the motor assembly 810 by a distance LD2. In this case, the distance LD1 and the distance LD2 may have a difference of (the number n of revolutions) *(pitch PL of the left slider 860*b*).

That is, when the pitch PR of the right slider 860*a* and the pitch PL of the left slider 860*b* are the same as each other, a displacement of the right slider 860*a* and a displacement of the left slider 860*b* may have the same magnitude and opposite directions.

When initial locations of the right slider 860*a* and the left slider 860*b* are symmetrical with respect to the symmetry axis ys of the motor assembly 810, the right slider 860*a* and the left slider 860*b* may be far from each other while maintaining the symmetry with respect to the symmetry axis ys of the motor assembly 810.

Figure 41:
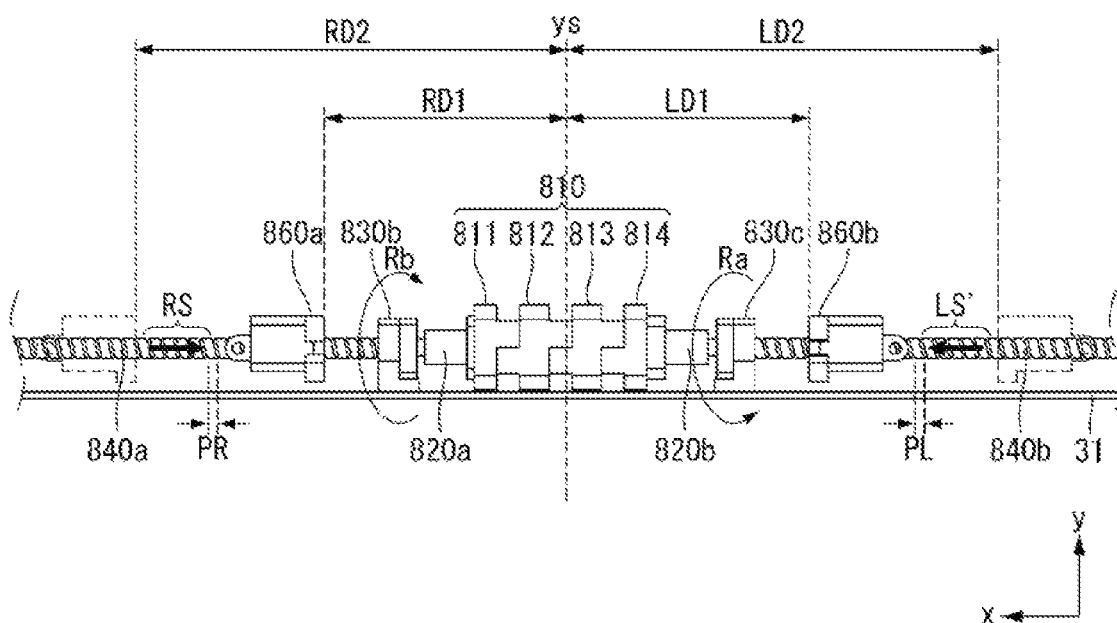
Figure 42:
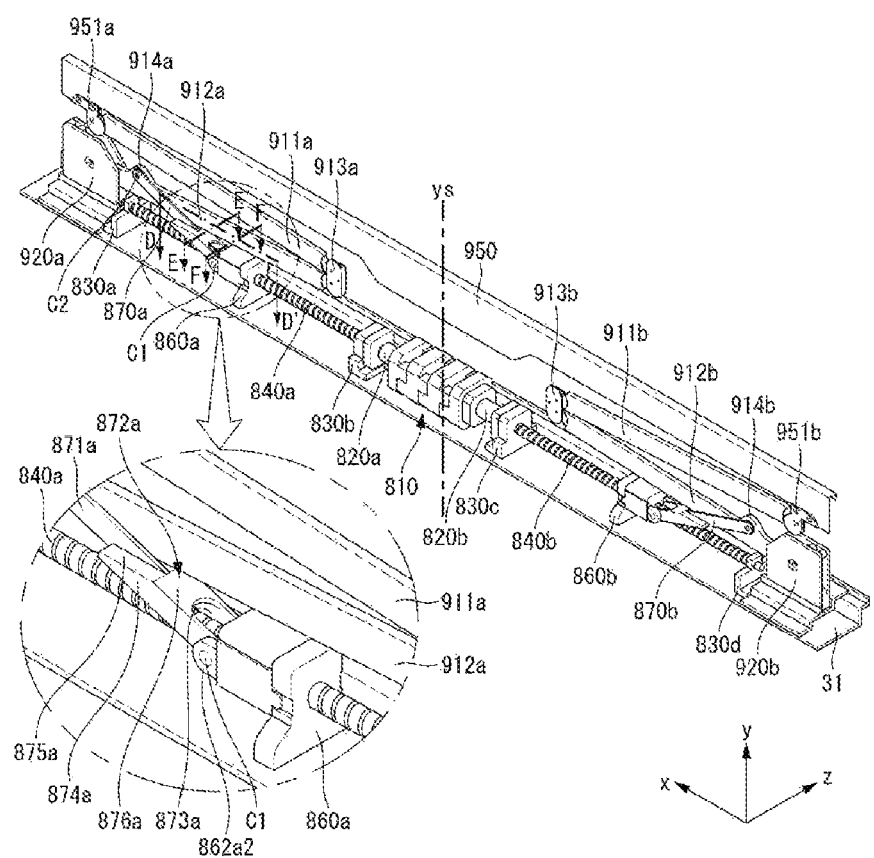

Referring to FIG. 41, the motor assembly 810 may be configured such that a rotation direction Rb of the right drive shaft and a rotation direction Ra of the left drive shaft are output in opposite directions. The right slider 860*a* may move in the −x-axis direction according to the rotation of the right drive shaft at a location that is spaced apart from the symmetry axis ys of the motor assembly 810 by a distance RD2. When the right drive shaft rotates n times, the right slider 860*a* may be spaced apart from the symmetry axis ys of the motor assembly 810 by a distance RD1. In this case, the distance RD1 and the distance RD2 may have a difference of (the number n of revolutions)*(pitch PR of the right slider 860*a*).

The left slider 860*b* may move in the +x-axis direction according to the rotation of the left drive shaft at a location that is spaced apart from the symmetry axis ys of the motor assembly 810 by a distance LD2. When the left drive shaft rotates n times, the left slider 860*b* may be spaced apart from the symmetry axis ys of the motor assembly 810 by a distance LD1. In this case, the distance LD1 and the distance LD2 may have a difference of (the number n of revolutions) *(pitch PL of the left slider 860*b*).

That is, when the pitch PR of the right slider 860*a* and the pitch PL of the left slider 860*b* are the same as each other, a displacement of the right slider 860*a* and a displacement of the left slider 860*b* may have the same magnitude and opposite directions.

When initial locations of the right slider 860*a* and the left slider 860*b* are symmetrical with respect to the symmetry axis ys of the motor assembly 810, the right slider 860*a* and the left slider 860*b* may be close to each other while maintaining the symmetry with respect to the symmetry axis ys of the motor assembly 810.

Referring to FIGS. 42, 43, 44A and 44B, link mounts 920*a* and 920*b* may be installed on the base 31. The link mounts 920*a* and 920*b* may include a right link mount 920*a* that is spaced apart from the first right bearing 830*a* toward the right side, and a left link mount 920*b* that is spaced apart from the second left bearing 830*d* toward the left side.

Links 910*a* and 910*b* may be connected to the link mounts 920*a* and 920*b*. The links 910*a* and 910*b* may include a right link 910*a* connected to the right link mount 920*a* and a left link 910*b* connected to the left link mount 920*b*.

The right link 910*a* may be referred to as a first link, and the left link 910*b* may be referred to as a second link. The right link mount 920*a* may be referred to as a first link mount 920*a*, and the left link mount 920*b* may be referred to as a second link mount 920*b*.

The links 910*a* and 910*b* may include first arms 911*a* and 911*b*, second arms 912*a* and 912*b*, and arm joints 913*a* and 913*b*. One sides of the second arms 912*a* and 912*b* may be rotatably connected to the link mounts 920*a* and 920*b*, and other sides of the second arms 912*a* and 912*b* may be rotatably connected to the arm joints 913*a* and 913*b*. One sides of the first arms 911*a* and 911*b* may be rotatably connected to the arm joints 913*a* and 913*b*, and other sides of the first arms 911*a* and 911*b* may be rotatably connected to link brackets 951*a* and 951*b*.

The link brackets 951*a* and 951 b may include a right link bracket 951*a* connected to the first arm 911*a* of the right link 910*a* and a left link bracket 951*b* connected to the first arm 911*b* of the left link 910*b*. The link brackets 951*a* and 951*b* may be connected to an upper bar 950.

The upper bar 950 may connect the right link bracket 951*a* to the left link bracket 951*b*.

Rods 870*a* and 870*b* may connect the sliders 860*a* and 860*b* to the links 910*a* and 910*b*. One sides of the rods 870*a* and 870*b* may be rotatably connected to the sliders 860*a* and 860*b*, and other sides of the rods 870*a* and 870*b* may be rotatably connected to the second arms 912*a* and 912*b*. The rods 870*a* and 870*b* may include a right rod 870*a* connecting the right slider 860*a* to the second arm 912*a* of the right link 910*a* and a left rod 870*b* connecting the left slider 860*b* to the second arm 912*b* of the left link 910*b*. The right rod 870*a* may be referred to as a first rod 870*a*, and the left rod 870*b* may be referred to as a second rod 870*b*.

More specifically, a structure formed by the right lead screw 840*a*, the right slider 860*a*, the right rod 870*a*, and the right link 910*a* is described. The right slider 860*a* may include a body 861*a* and a load mount 862*a*. A screw thread SS may be formed on an inner perimeter surface of the body 861*a*. The screw thread SS of the body 861*a* may be engaged with the screw thread RS of the right lead screw 840*a*. The right lead screw 840*a* may pass through the body 861*a*.

The load mount 862*a* may be formed on the right side of the body 861*a*. The rod mount 862*a* may be rotatably connected to one side of the right rod 870*a*. The rod mount 862*a* may include a first rod mount 862*a*1 and a second rod mount 862*a*2. The first rod mount 862*a*1 may be disposed in front of the right lead screw 840*a*, and the second rod mount 862*a*2 may be disposed behind the right lead screw 840*a*. The first rod mount 862*a*1 and the second rod mount 862*a*2 may be spaced apart from each other. The second rod mount 862*a*2 may be spaced apart from the first rod mount 862*a*1 in the −z-axis direction. The right lead screw 840*a* may be positioned between the first rod mount 862*a*1 and the second rod mount 862*a*2.

The rod mount 862*a* may be rotatably connected to one side of the right rod 870*a* through a connection member C1. The connection member C1 may pass through the rod mount 862*a* and the right rod 870*a*.

The right rod 870*a* may be rotatably connected to the second arm 912*a* through a connection member C2. The connection member C2 may pass through the second arm 912*a* and the right rod 870*a*.

The right rod 870*a* may include a transfer portion 871*a* connected to the second arm 912*a* of the right link 910*a* and a cover 872*a* connected to the rod mount 862*a* of the right slider 860*a*. The transfer portion 871*a* may transfer, to the right link 910*a*, a force generated when the right slider 860*a* moves back and forth along the right lead screw 840*a*.

The cover 872*a* may include a first plate 873*a* disposed in front of the right lead screw 840*a*. The first plate 873*a* may be disposed perpendicular to the base 31. Alternatively, the first plate 873*a* may face the right lead screw 840*a*.

The cover 872*a* may include a second plate 874*a* disposed behind the right lead screw 840*a*. The second plate 874*a* may be disposed perpendicular to the base 31. Alternatively, the second plate 874*a* may face the right lead screw 840*a*.

Alternatively, the second plate 874a may be spaced apart from the first plate 873a. The right lead screw 840a may be positioned between the first plate 873a and the second plate 874a.

The cover 872a may include a third plate 875a connecting the first plate 873a to the second plate 874a. The third plate 875a may be connected to the transfer portion. The third plate 875a may be positioned on an upper side of the right lead screw 840a.

The cover 872a may include a fourth plate 876a connecting the first plate 873a to the second plate 874a. The fourth plate 876a may be connected to the third plate 875a. The fourth plate 876a may be positioned on the upper side of the right lead screw 840a.

One side of the first plate 873a may be connected to the first rod mount 862a1. The first plate 873a and the first rod mount 862a1 may be connected through a connection member C1'. Other side of the first plate 873a may be connected to the third plate 875a.

One side of the second plate 874a may be connected to the second rod mount 862a2. The second plate 874a and the second rod mount 862a2 may be connected through a connection member C1. Other side of the second plate 874a may be connected to the third plate 875a.

When the right slider 860a moves to close to the motor assembly 810, the right lead screw 840a and the right rod 870a may contact each other. When the right lead screw 840a and the right rod 870a contact each other, a mutual interference may occur, and a movement of the right slider 860a may be restricted.

The cover 872a may provide a space S1 therein. The first plate 873a, the second plate 874a, the third plate 875a, and the fourth plate 876a may form the space S1. When the right slider 860a moves to close to the motor assembly 810, the right lead screw 840a may be accommodated or escaped in the space S1 provided by the cover 872a. The right slider 860a may move closer to the motor assembly 810 than when there is no cover 872a, due to the space S1 provided by the cover 872a. That is, the cover 872a can increase a movable range of the right slider 860a by providing the space S1 therein. In addition, there is an advantage in that the size of the housing 30 (see FIG. 2) can be reduced by accommodating the right lead screw 840a in the cover 872a.

The cover 872a may limit a minimum value of an angle θS formed by the second arm 912a and the base 31. When the angle θS is sufficiently small, the third plate 875a of the cover 872a may contact the second arm 912a and support the second arm 912a. The third plate 875a can limit the minimum value of the angle θS and prevent the sagging of the second arm 912a by supporting the second arm 912a. That is, the cover 872a may serve as a stopper preventing the sagging of the second arm 912a. Further, the third plate 875a can reduce an initial load of standing up the second arm 912a by limiting the minimum value of the angle θS.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, the third plate 875a can reduce the load on the motor assembly 810 in order to stand up the second arms 912a and 912b by limiting the minimum value of the angle θS.

A structure formed by the left lead screw 840b, the left slider 860b, the left rod 870b, and the left link 910b may be symmetrical to the above-described structure formed by the right lead screw 840a, the right slider 860a, the right rod 870a, and the right link 910a. In this instance, a symmetry axis may be the symmetry axis ys of the motor assembly 810.

Figure 45:
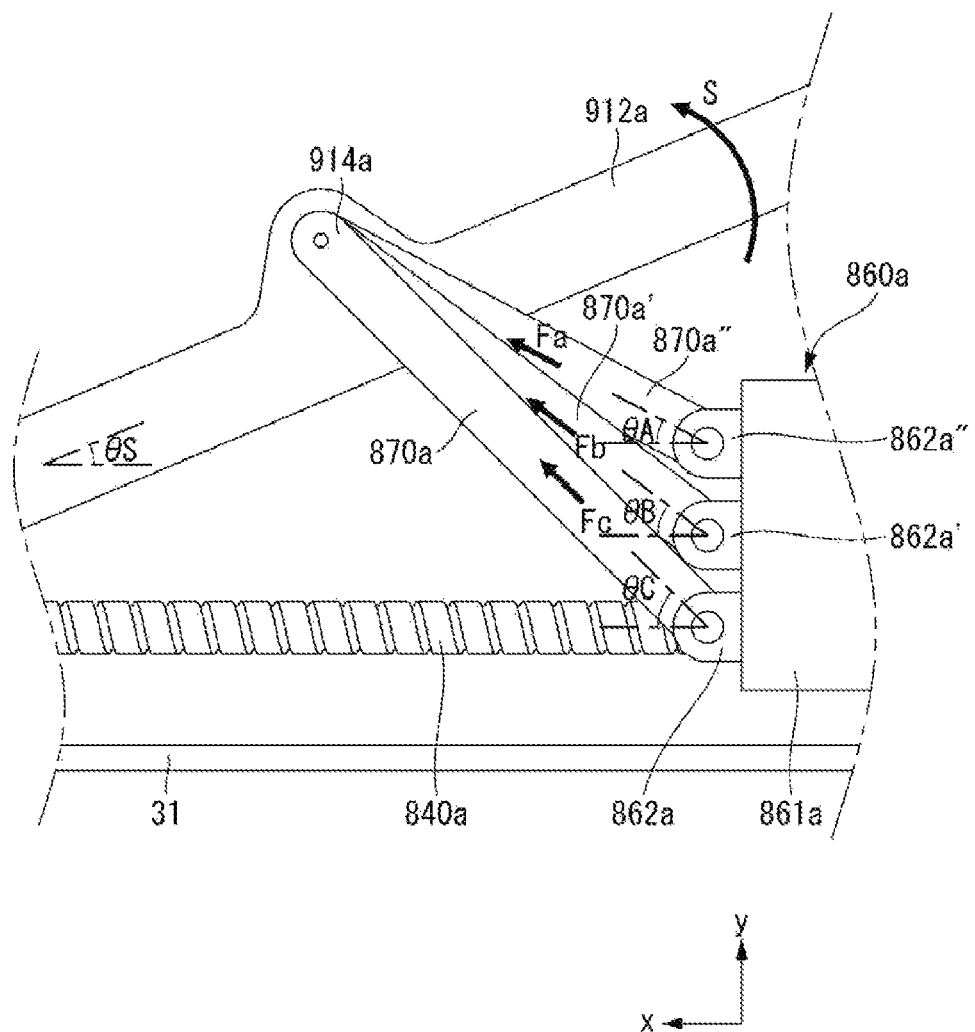
Figure 46:
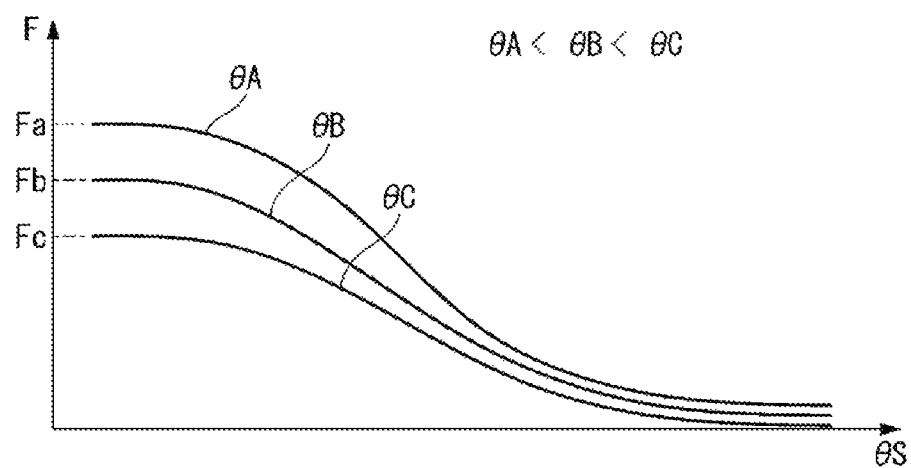

With reference to FIGS. 45 and 46, a connection of the right rod 870a to a protrusion 914a is shown. The protrusion 914a may be referred to as a connection portion 914a.

An angle formed by the right rod 870a and the base 31 may vary depending on a location of the connection portion. An angle formed by the second arm 912a and the base 31 may be denoted as an angle θS. When the right slider 860a is positioned closest to the motor assembly 810 within a movable range, the second arm 912a may lie completely on the base 31. When the second arm 912a lies completely on the base 31, the angle θS may have a minimum value. For example, when the second arm 912a lies completely on the base 31, the angle θS may have a value close to 0°.

When the right slider 860a moves in the +x-axis direction, the angle θS may gradually increase. Alternatively, when the right slider 860a moves in the +x-axis direction, the second arm 912a may stand up with respect to the base 31. Alternatively, when the angle θS gradually increases, the second arm 912a may stand up with respect to the base 31.

When the right slider 860a is positioned farthest from the motor assembly 810 within a movable range, the second arm 912a may completely stand up with respect to the base 31. When the second arm 912a completely stands up with respect to the base 31, the angle θS may have a maximum value. For example, when the second arm 912a completely stands up with respect to the base 31, the second arm 912a may be positioned perpendicular to the base 31. Alternatively, when the second arm 912a completely stands up with respect to the base 31, an angle formed by the second arm 912a and the base 31 may have a value close to 90°.

A direction in which an angle (angle θS) between the second arm 912a of the right link 910a and the base 31 increases may be referred to as a standing direction S. Alternatively, a direction in which an angle between the second arm 912b of the left link 910b and the base 31 increases may be referred to as a standing direction S.

When a rod mount 862a" is positioned on an upper side of the body 861a, an angle formed by a right rod 870a" and the base 31 may be denoted as θA, and a minimum force required for the right rod 870a" to stand up the second arm 912a may be denoted as Fa.

When a rod mount 862a' is positioned at a middle height of the body 861a, an angle formed by a right rod 870a' and the base 31 may be denoted as θB, and a minimum force required for the right rod 870a' to stand up the second arm 912a may be denoted as Fb.

When a rod mount 862a is positioned on a lower side of the body 861a, an angle formed by a right rod 870a and the base 31 may be denoted as θC, and a minimum force required for the right rod 870a to stand up the second arm 912a may be denoted as Fc.

In this case, a relationship of θA<θB<θC may be established for the same angle θS. Further, a relationship of Fc<Fb<Fa may be established for the same angle θS.

That is, if an angle formed by the second arm 912a and the base 31 is the same, a force required to stand up the second arm 912a may decrease as the angle formed by the right rod 870a and the base 31 increases.

The cover 872a (see FIG. 43) of the right rod 870a provides a space Si (see FIG. 43) capable of accommodating the right lead screw 840*a* and thus can allow the load mount 862*a* to be coupled close to a lower side of a body 861*b* or the right lead screw 840*a*.

The lead screws 840*a* and 840*b* may be driven by one motor assembly 810. The second arms 912*a* and 912*b* may stand up while being symmetrical to each other by driving the lead screws 840*a* and 840*b* by one motor assembly 810. However, when the lead screws 840*a* and 840*b* are driven by one motor assembly 810, a load on the motor assembly 810 may excessively increase to stand up the second arms 912*a* and 912*b*. In this instance, the load on the motor assembly 810 in order to stand up the second arm 912*a* can decrease by increasing the angle formed by the right rod 870*a* and the base 31.

A structure formed by the left lead screw 840*b*, the left slider 860*b*, the left rod 870*b*, and the second arm 912*b* may be symmetrical to the structure formed by the right lead screw 840*a*, the right slider 860*a*, the right rod 870*a*, and the second arm 912*a*. In this instance, a symmetry axis may be the symmetry axis ys of the motor assembly 810.

Figure 47:
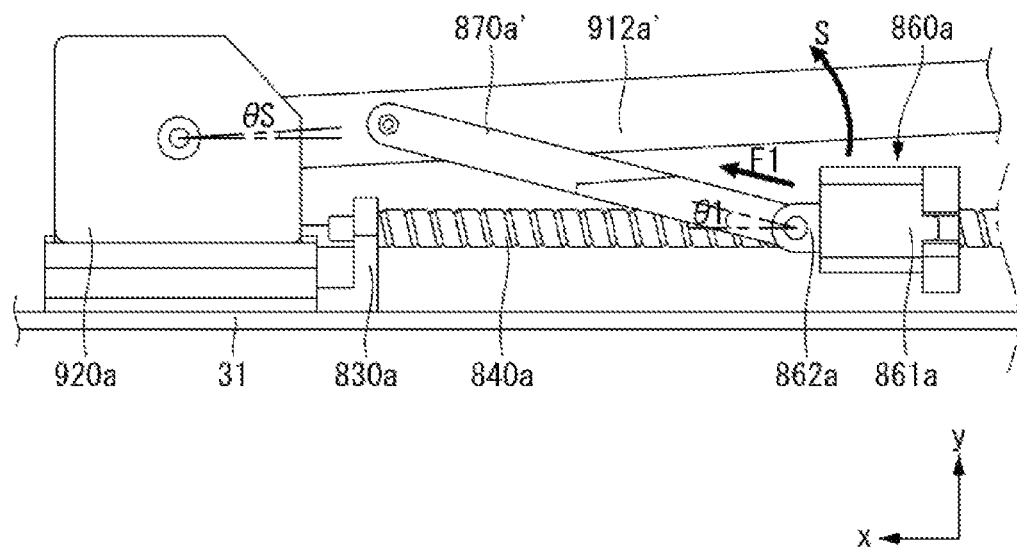
Figure 48:
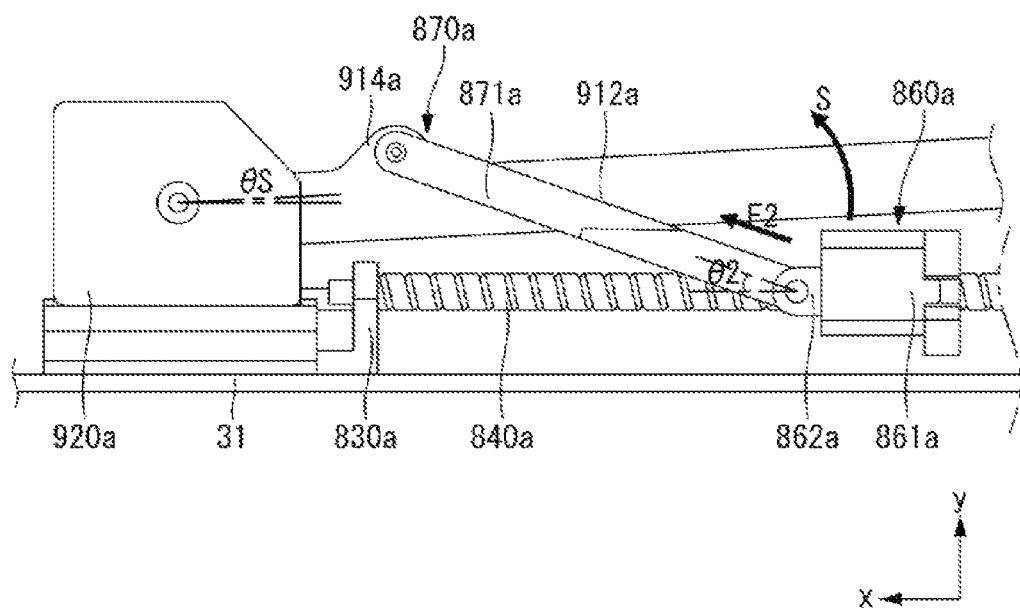
Figure 49:
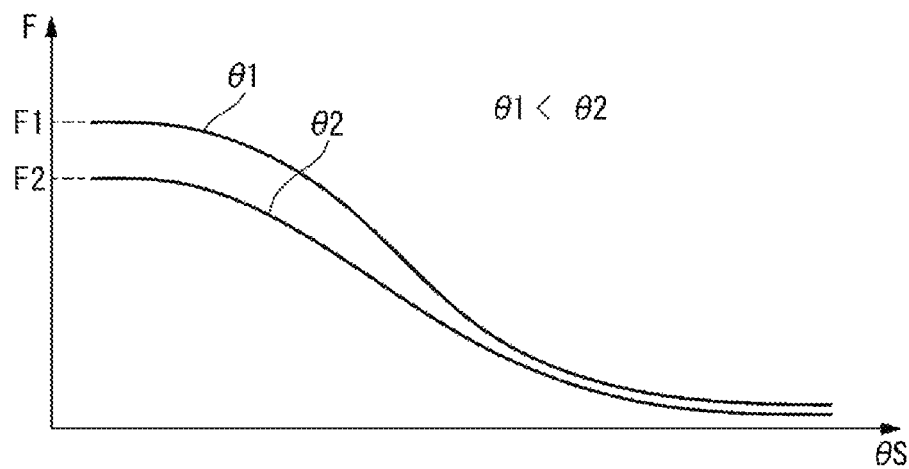

Referring to FIGS. 47 to 49, the second arm 912*a* may include a bar 915*a* and a protrusion 914*a*. FIG. 47 illustrates that the right rod 870*a* is connected to the bar 915*a*, and FIG. 48 illustrates that the right rod 870*a* is connected to the protrusion 914*a*. The protrusion 914*a* may be referred to as a connection portion 914*a*.

An angle formed by the second arm 912*a* and the base 31 may be denoted as θS. When the right slider 860*a* is positioned closest to the motor assembly 810 within a movable range, the second arm 912*a* may lie completely on the base 31. When the second arm 912*a* lies completely on the base 31, the angle θS may have a minimum value. For example, when the second arm 912*a* lies completely on the base 31, the angle θS may have a value close to 0°.

When the right slider 860*a* moves in the +x-axis direction, the angle θS may gradually increase. Alternatively, when the right slider 860*a* moves in the +x-axis direction, the second arm 912*a* may stand up with respect to the base 31. Alternatively, when the angle θS gradually increases, the second arm 912*a* may stand up with respect to the base 31.

When the right slider 860*a* is positioned farthest from the motor assembly 810 within a movable range, the second arm 912*a* may completely stand up with respect to the base 31. When the second arm 912*a* completely stands up with respect to the base 31, the angle θS may have a maximum value. For example, when the second arm 912*a* completely stands up with respect to the base 31, the second arm 912*a* may be positioned perpendicular to the base 31. Alternatively, when the second arm 912*a* completely stands up with respect to the base 31, an angle formed by the second arm 912*a* and the base 31 may have a value close to 90°.

A direction in which an angle (angle θS) between the second arm 912*a* of the right link 910*a* and the base 31 increases may be referred to as a standing direction S. Alternatively, a direction in which an angle between the second arm 912*b* of the left link 910*b* and the base 31 increases may be referred to as a standing direction S.

Referring to FIG. 47, an angle formed by the right rod 870*a* and the right lead screw 840*a* may be denoted as θ1. When the second arm 912*a* lies completely on the base 31, the angle θ1 may have a minimum value.

To stand up the second arm 912*a*, the motor assembly 810 may drive the drive shaft. When the drive shaft rotates, the right slider 860*a* may move in the +x-axis direction. The right slider 860*a* may apply a force to the right rod 870*a*, and the rod 870*a* may transfer the force to the bar 915*a* of the second arm 912*a*. The second arm 912*a* may receive the force from the right rod 870*a* and rotate in the standing direction S. When the right link 910*a* stands up, the angles θS and θ1 may increase.

When the second arm 912*a* lies completely on the base 31, a minimum force for standing up the second arm 912*a* may be denoted as F1. That is, the F1 may mean a minimum force that the right rod 870*a* has to transfer to the bar 915*a* of the second arm 912*a* in order to stand up the second arm 912*a*.

Referring to FIG. 48, an angle formed by the right rod 870*a* and the right lead screw 840*a* may be denoted as θ2. When the second arm 912*a* lies completely on the base 31, the angle θ2 may have a minimum value.

To stand up the second arm 912*a*, the motor assembly 810 may drive the drive shaft. When the drive shaft rotates, the right slider 860*a* may move in the +x-axis direction, and the left slider 860*b* may move in the −x-axis direction. The sliders 860*a* and 860*b* may apply a force to the rods 870*a* and 870*b*, and the rods 870*a* and 870*b* may transfer the force to the bar 915*a* of the second arm 912*a*. The second arm 912*a* may receive the force from the rods 870*a* and 870*b* and rotate in the standing direction S. When the links 910*a* and 910*b* stand up, the angles θS and θ2 may increase.

When the second arm 912*a* lies completely on the base 31, a minimum force for standing up the second arm 912*a* may be denoted as F2. That is, the F2 may mean a minimum force that the right rod 870*a* has to transfer to the bar 915*a* of the second arm 912*a* in order to stand up the second arm 912*a*.

With reference to FIGS. 47 and 48, in preparation for the case where the right rod 870*a* is connected to the bar 915*a* of the second arm 912*a* and the case where the right rod 870*a* is connected to the protrusion 914*a* of the second arm 912*a*, when an angle θS formed by the second arm 912*a* and the base 31 is the same, an angle θ2 formed by the right rod 870*a* connected to the protrusion 914*a* of the second arm 912*a* and the right lead screw 840*a* may be greater than an angle θ1 formed by the right rod 870*a* connected to the bar 915*a* of the second arm 912*a* and the right lead screw 840*a*.

Further, when the angle θS formed by the second arm 912*a* and the base 31 is the same, the force F1 required to stand up the second arm 912*a* when the right rod 870*a* is connected to the bar 915*a* of the second arm 912*a* may be greater than the force F2 required to stand up the second arm 912*a* when the right rod 870*a* is connected to the protrusion 914*a* of the second arm 912*a*.

That is, if an angle formed by the second arm 912*a* and the base 31 is the same, a force required to stand up the second arm 912*a* may decrease as an angle formed by the right rod 870*a* and the right lead screw 840*a* increases. Alternatively, the second arm 912*a* can stand up by less force than the force required when the right rod 870*a* is connected to the bar 915*a*, by connecting the right rod 870*a* to the protrusion 914*a*.

The lead screws 840*a* and 840*b* may be driven by one motor assembly 810. The second arms 912*a* and 912*b* may stand up while being symmetrical to each other by driving the lead screws 840*a* and 840*b* by one motor assembly 810. However, when the lead screws 840*a* and 840*b* are driven by one motor assembly 810, a load on the motor assembly 810 may excessively increase to stand up the second arms 912*a* and 912*b*. In this instance, by connecting the right rod 870*a* to the protrusion 914*a* of the second arm 912*a*, an angle formed by the right rod 870*a* and the base 31 may increase, and the load on the motor assembly 810 in order to stand up the second arm 912*a* can decrease.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this instance, a symmetry axis may be the symmetry axis ys of the motor assembly 810.

Figure 50:
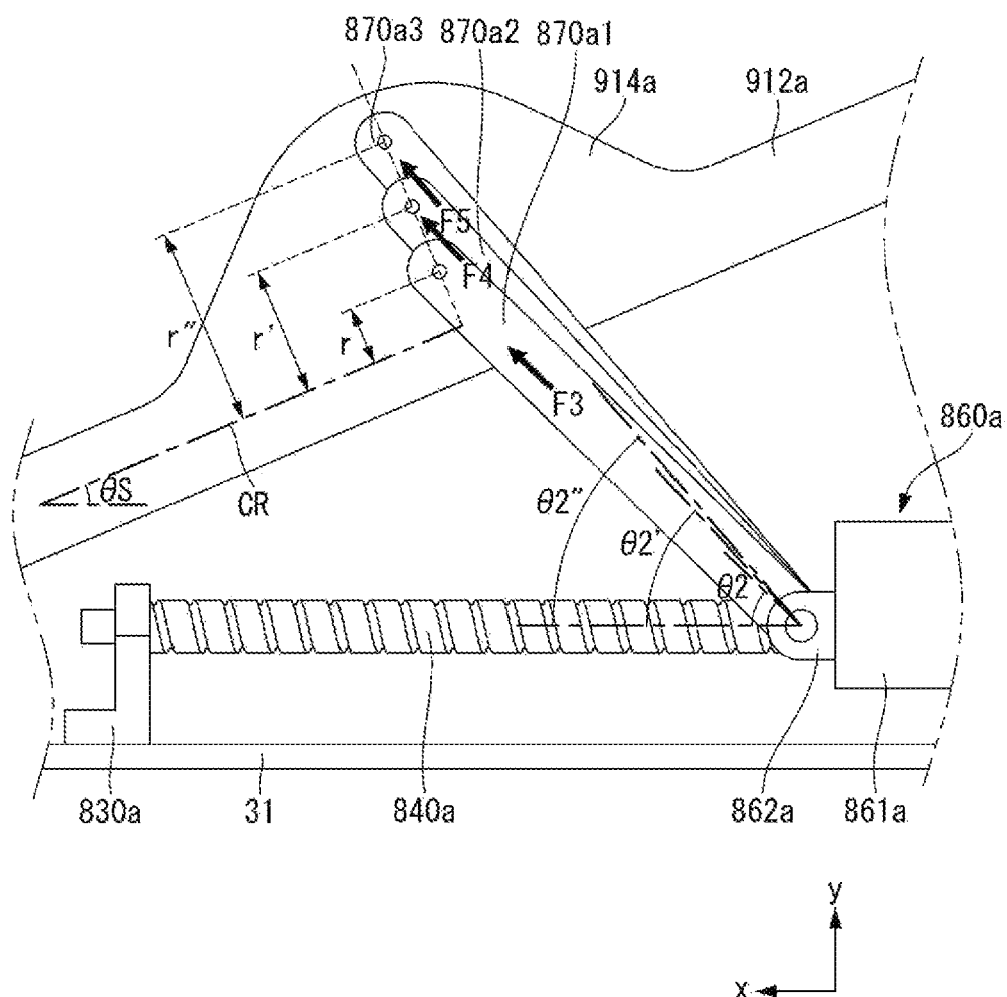
Figure 51:
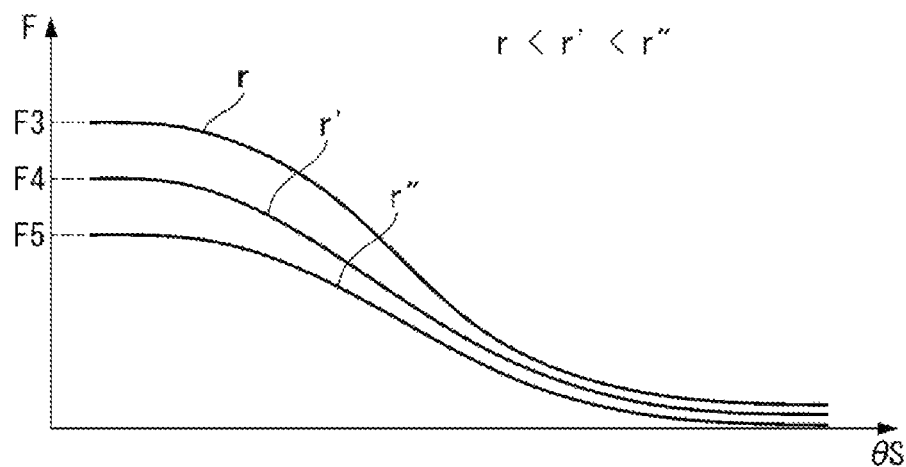

With reference to FIGS. 50 and 51, a connection of the right rod 870a to the protrusion 914a is shown. The protrusion 914a may be referred to as a connection portion 914a.

An angle formed by the right rod 870a and the base 31 may vary depending on a connection location of the protrusion 914a and the right rod 870a. An angle formed by the second arm 912a and the base 31 may be denoted as θS. When the right slider 860a is positioned closest to the motor assembly 810 within a movable range, the second arm 912a may lie completely on the base 31. When the second arm 912a lies completely on the base 31, the angle θS may have a minimum value. For example, when the second arm 912a lies completely on the base 31, the angle θS may have a value close to 0°.

When the right slider 860a moves in the +x-axis direction, the angle θS may gradually increase. Alternatively, when the right slider 860a moves in the +x-axis direction, the second arm 912a may stand up with respect to the base 31. Alternatively, when the angle θS gradually increases, the second arm 912a may stand up with respect to the base 31.

When the right slider 860a is positioned farthest from the motor assembly 810 within a movable range, the second arm 912a may completely stand up with respect to the base 31. When the second arm 912a completely stands up with respect to the base 31, the angle θS may have a maximum value. For example, when the second arm 912a completely stands up with respect to the base 31, the second arm 912a may be positioned perpendicular to the base 31. Alternatively, when the second arm 912a completely stands up with respect to the base 31, an angle formed by the second arm 912a and the base 31 may have a value close to 90°.

A direction in which an angle (angle θS) between the second arm 912a of the right link 910a and the base 31 increases may be referred to as a standing direction S. Alternatively, a direction in which an angle between the second arm 912b of the left link 910b and the base 31 increases may be referred to as a standing direction S.

When a right rod 870a1 and the protrusion 914a are fastened to be spaced apart from a central axis CR of the second arm 912a by a distance r, an angle formed by the right rod 870a1 and the base 31 may be denoted as θ2, and a minimum force required for the right rod 870a1 to stand up the second arm 912a may be denoted as F3.

When a right rod 870a2 and the protrusion 914a are fastened to be spaced apart from the central axis CR of the second arm 912a by a distance r', an angle formed by the right rod 870a2 and the base 31 may be denoted as θ2', and a minimum force required for the right rod 870a2 to stand up the second arm 912a may be denoted as F4.

When a right rod 870a3 and the protrusion 914a are fastened to be spaced apart from the central axis CR of the second arm 912a by a distance r", an angle formed by the right rod 870a3 and the base 31 may be denoted as θ2", and a minimum force required for the right rod 870a3 to stand up the second arm 912a may be denoted as F5.

In this case, a relationship of θ2<θ2'<θ2" may be established for the same angle θS. Further, a relationship of F5<F4<F3 may be established for the same angle θS.

That is, if an angle formed by the second arm 912a and the base 31 is the same, a force required to stand up the second arm 912a may decrease as the angle formed by the right rod 870a and the base 31 increases.

A structure formed by the left lead screw 840b, the left slider 860b, the left rod 870b, and the second arm 912b may be symmetrical to the structure formed by the right lead screw 840a, the right slider 860a, the right rod 870a, and the second arm 912a. In this instance, a symmetry axis may be the symmetry axis ys of the motor assembly 810.

Figure 52:
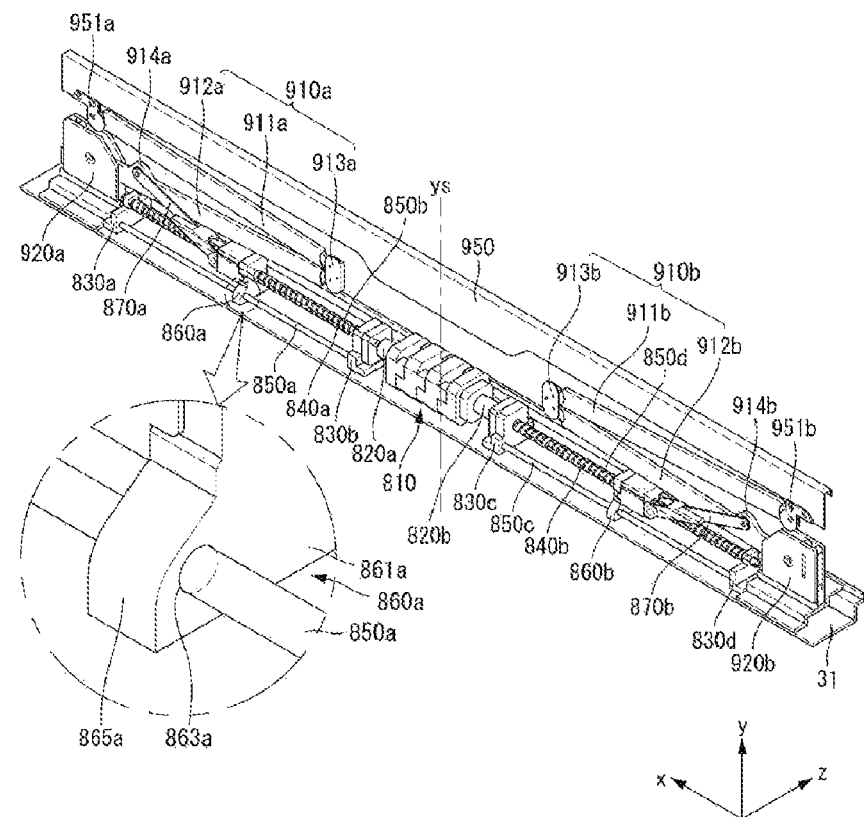

Referring to FIG. 52, guides 850a, 850b, 850c and 850d may be connected to bearings 830a, 830b, 830c and 830d. The guides 850a, 850b, 850c and 850d may include right guides 850a and 850b disposed on the right side of the motor assembly 810 and left guides 850c and 850d disposed on the left side of the motor assembly 810.

One sides of the right guides 850a and 850b may be connected to the first right bearing 830a, and other sides of the right guides 850a and 850b may be connected to the second right bearing 830b. The right guides 850a and 850b may be positioned parallel to the right lead screw 840a. Alternatively, the right guides 850a and 850b may be spaced apart from the right lead screw 840a.

The right guides 850a and 850b may include a first right guide 850a and a second right guide 850b. The first right guide 850a and the second right guide 850b may be spaced apart from each other. The right lead screw 840a may be positioned between the first right guide 850a and the second right guide 850b.

The right slider 860a may include a protrusion. Alternatively, the display device may include a protrusion formed in the right slider 860a. The protrusion may be formed on the body of the slider. The protrusion may include a front protrusion (not shown) that protrudes from the body 861a of the right slider 860a in the +z-axis direction, and a rear protrusion 865a that protrudes from the body of the slider in the −z-axis direction.

The first right guide 850a may pass through the rear protrusion 865a. Alternatively, a first hole 863a may be formed in the rear protrusion 865a, and the first right guide 850a may pass through the first hole 863a. The first hole 863a may be formed in the x-axis direction. The first hole 863a may be referred to as a hole 863a.

The second right guide 850b may pass through the front protrusion (not shown). Alternatively, a second hole (not shown) may be formed in the front protrusion (not shown), and the second right guide 850b may pass through the second hole. The second hole may be formed in the x-axis direction.

The right guides 850a and 850b may guide the right slider 860a to move more stably when the right slider 860a moves back and forth along the right lead screw 840a. Since the right guides 850a and 850b stably guide the right slider 860a, the right slider 860a does not rotate about the right lead screw 840a and may move back and forth along the right lead screw 840a.

A structure formed by the left guides 850c and 850d, the left bearings 830a, 830b, 830c and 830d, the left slider 860b, and the left lead screw 840b may be symmetrical to the above-described structure formed by the right guides 850a and 850b, the right bearings 830a, 830b, 830c and 830d, the right slider 860a, and the right lead screw 840a. In this instance, a symmetry axis may be the symmetry axis ys of the motor assembly 810.

Figure 53:
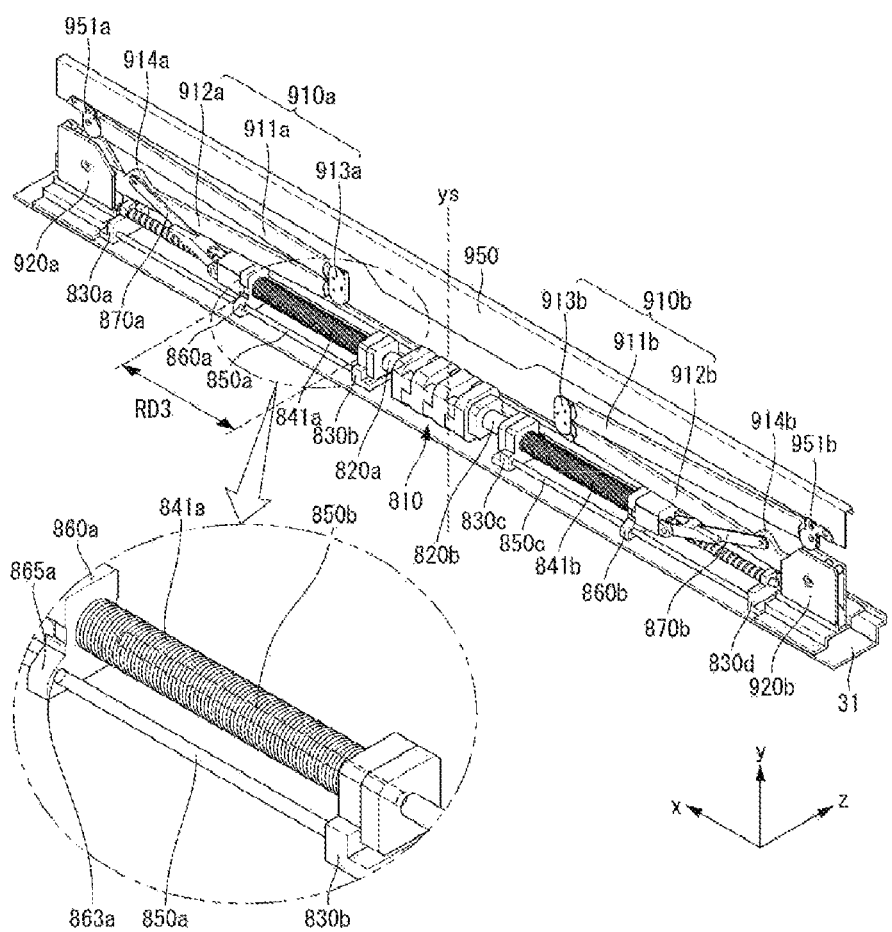

Referring to FIG. 53, first springs 841a and 841b may be inserted into the lead screws 840a and 840b. Alternatively, the lead screws 840a and 840b may pass through the first springs 841a and 841b. The first springs 841a and 841b may include a first right spring 841a disposed on the right side of the motor assembly 810 and a first left spring 841b disposed on the left side of the motor assembly 810.

The first right spring 841a may be disposed between the right slider 860a and the second right bearing 830b. One end of the first right spring 841a may contact or be separated from the right slider 860a, and other end of the first right spring 841a may contact or be separated from the second right bearing 830b.

When the second arm 912a lies completely on the base 31, a distance between the right slider 860a and the second right bearing 830b may be denoted as RD3. The first right spring 841a may have a length greater than the distance RD3 in a non-compressed or non-tensioned state. Thus, when the second arm 912a lies completely on the base 31, the first right spring 841a may be compressed between the right slider 860a and the second right bearing 830b. Further, the first right spring 841a may provide a restoring force of the +x-axis direction to the right slider 860a.

When the second arm 912a changes from a state of lying completely on the base 31 to a state of standing up with respect to the base 31, the restoring force provided by the first right spring 841a may assist the second arm 912a to stand up. The first right spring 841a assists the second arm 912a to stand up, and thus the load of the motor assembly 810 can be reduced.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, the first right spring 841a can assist the second arm 912a to stand up, thereby reducing the load of the motor assembly 810 and reducing the load on the motor assembly 810 in order to stand up the second arm 912a.

Alternatively, when the second arm 912a changes from a state of standing up with respect to the base 31 to a state of lying completely on the base 31, the restoring force provided by the first right spring 841a can alleviate an impact generated when the second arm 912a lies on the base 31. That is, the first right spring 841a may serve as a damper when the second arm 912a lies on the base 31. The first right spring 841a serves as the damper, and thus the load of the motor assembly 810 can be reduced.

A structure formed by the first left spring 841b, the left bearings 830a, 830b, 830c and 830d, the left slider 860b, the left lead screw 840b, and the second arm 912a may be symmetrical to the above-described structure formed by the first right spring 841a, the right bearings 830a, 830b, 830c and 830d, the right slider 860a, the right lead screw 840a, and the second arm 912a. In this instance, a symmetry axis may be the symmetry axis ys of the motor assembly 810.

Figure 54:
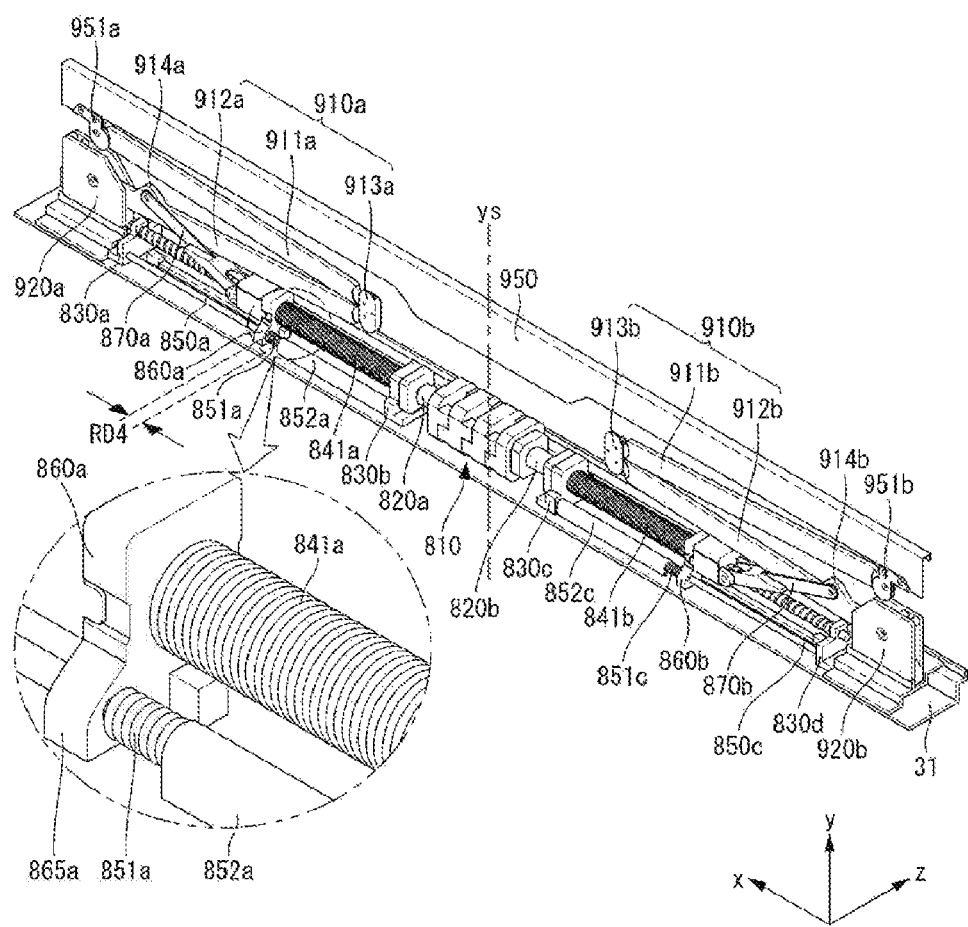

Referring to FIG. 54, second springs 851a and 851b may be inserted into the guides 850a, 850b, 850c and 850d. Alternatively, the guides 850a, 850b, 850c and 850d may pass through the second springs 851a and 851b. The second springs 851a and 851b may include a second right spring 851a disposed on the right side of the motor assembly 810 and a second left spring 851b disposed on the left side of the motor assembly 810.

The second right spring 851a may be provided as a plurality of springs. The second right spring 851a may include springs 940a and 940b inserted into the first right guide 850a and springs 940a and 940b inserted into the second right guide 850b. Alternatively, the second right spring 851a may include springs 940a and 940b through which the first right guide 850a passes, and springs 940a and 940b through which the second right guide 850b passes.

The guides 850a, 850b, 850c and 850d may include locking jaws 852a and 852b. The locking jaws 852a and 852b may include a right locking jaw 852a disposed on the right side of the motor assembly 810 and a left locking jaw 852b disposed on the left side of the motor assembly 810.

The right locking jaw 852a may be disposed between the right slider 860a and the second right bearing 830b. The second right spring 851a may be disposed between the right slider 860a and the second right bearing 830b. One end of the second right spring 851a may contact or be separated from the right slider 860a, and other end of the second right spring 851a may contact or be separated from the right locking jaw 852a.

When the second arm 912a lies completely on the base 31, a distance between the right slider 860a and the right locking jaw 852a may be denoted as RD4. The second right spring 851a may have a length greater than the distance RD4 in a non-compressed or non-tensioned state. Thus, when the second arm 912a lies completely on the base 31, the second right spring 851a may be compressed between the right slider 860a and the right locking jaw 852a. Further, the second right spring 851a may provide a restoring force of the +x-axis direction to the right slider 860a.

When the second arm 912a changes from a state of lying completely on the base 31 to a state of standing up with respect to the base 31, the restoring force provided by the second right spring 851a may assist the second arm 912a to stand up. The second right spring 851a assists the second arm 912a to stand up, and thus the load of the motor assembly 810 can be reduced.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, a load on the motor assembly 810 may excessively increase to stand up the second arms 912a and 912b. In this instance, the second right spring 851a assists the second arm 912a to stand up and thus can reduce the load of the motor assembly 810 and reduce the load on the motor assembly 810 in order to stand up the second arm 912a.

Alternatively, when the second arm 912a changes from a state of standing up with respect to the base 31 to a state of lying completely on the base 31, the restoring force provided by the second right spring 851a can alleviate an impact generated when the second arm 912a lies on the base 31. That is, the second right spring 851a may serve as a damper when the second arm 912a lies on the base 31. The second right spring 851a serves as the damper, and thus the load of the motor assembly 810 can be reduced.

A structure formed by the second left spring 851b, the left locking jaw 852b, the left slider 860b, the left guides 850c and 850d, and the second arm 912a may be symmetrical to the above-described structure formed by the second right spring 851a, the right locking jaw 852a, the right slider 860a, the right guides 850a and 850b, and the second arm 912a. In this instance, a symmetry axis may be the symmetry axis ys of the motor assembly 810.

Figure 55:
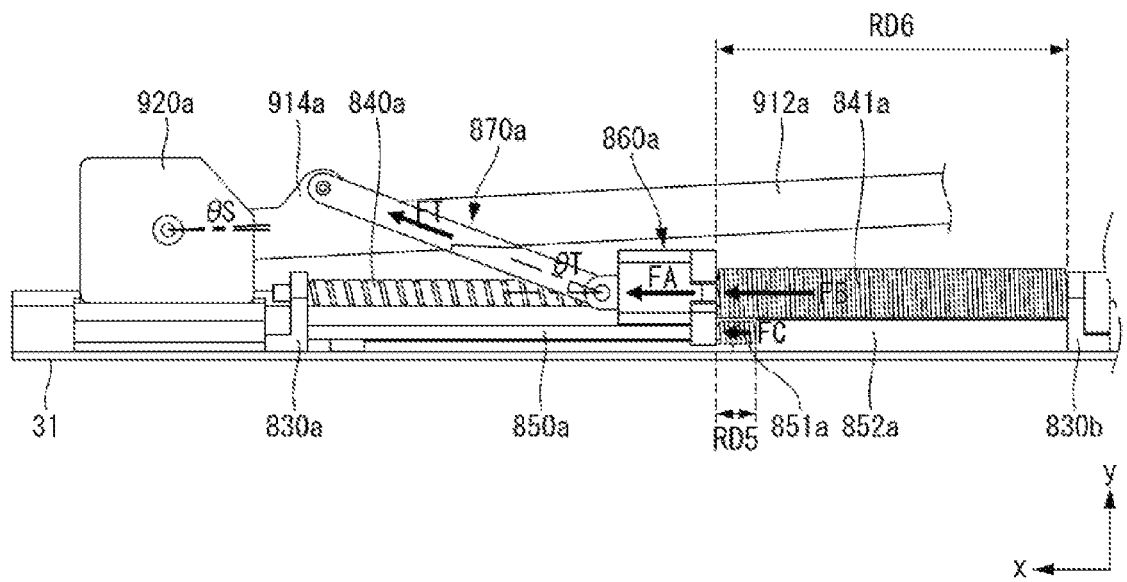
Figure 56:
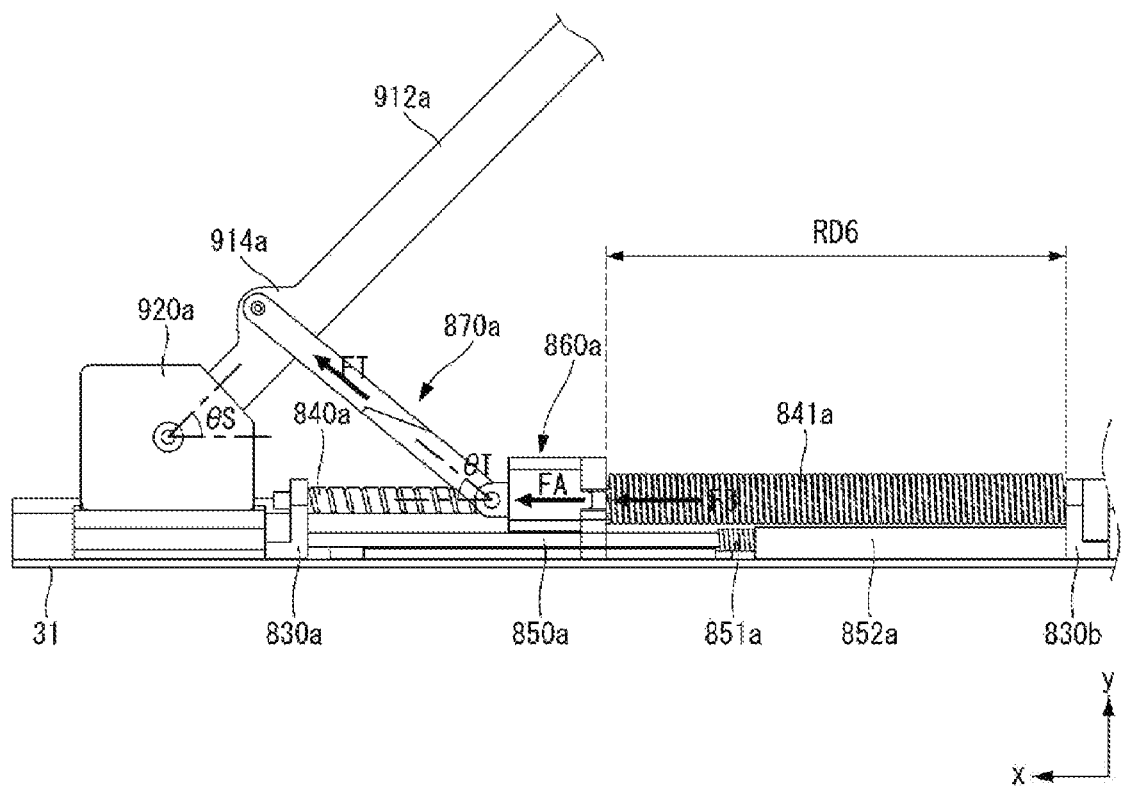
Figure 57:
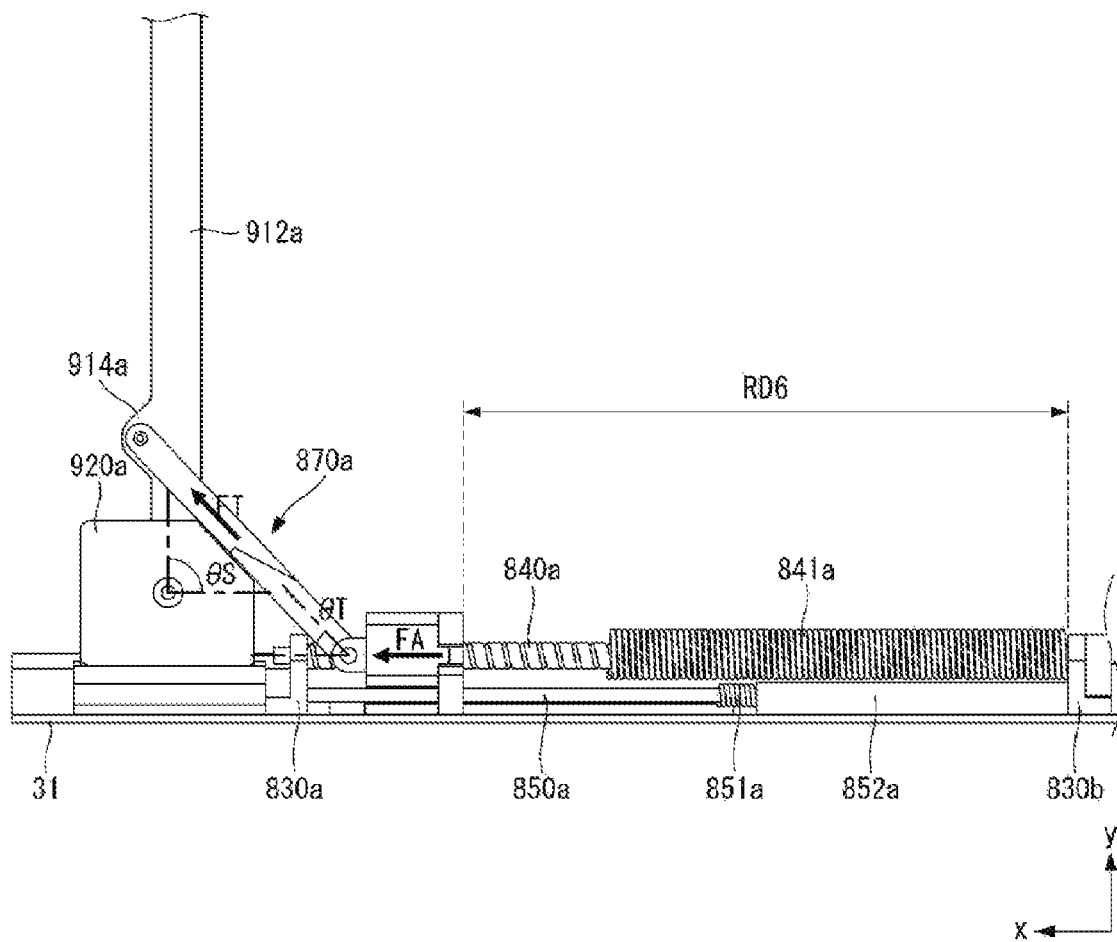

Referring to FIGS. 55 to 57, the second arm 912a may receive the restoring force from the first right spring 841a and the second right spring 851a and may stand up.

An angle formed by the second arm 912a and the base 31 may be denoted as θS. An angle formed by the right rod

870a and the base 31 may be denoted as θT. A force required for the motor assembly 810 to move the right slider 860a in the +x-axis direction may be denoted as FA. A force that the first right spring 841a applies to the right slider 860a may be denoted as FB. A force that the second right spring 851a applies to the right slider 860a may be denoted as FC. A force that the right rod 870a transfers to the second arm 912a may be denoted as FT.

When the second arm 912a lies completely on the base 31, the angles θS and θT may have a minimum value. When the second arm 912a changes from a state of lying completely on the base 31 to a state of standing up with respect to the base 31, the angles θS and θT may gradually increase.

When the second arm 912a lies completely on the base 31, the first right spring 841a may be compressed. The compressed first right spring 841a may provide a restoring force FB to the right slider 860a. The restoring force FB may act in the +x-axis direction. When the second arm 912a lies completely on the base 31, a compression displacement amount of the first right spring 841a may have a maximum value, and a magnitude of the restoring force FB may have a maximum value. When the second arm 912a changes from a state of lying completely on the base 31 to a state of standing up with respect to the base 31, the compression displacement amount of the first right spring 841a may gradually decrease, and the magnitude of the restoring force FB may gradually decrease.

When the second arm 912a lies completely on the base 31, the second right spring 851a may be compressed. The compressed second right spring 851a may provide a restoring force FC to the right slider 860a. The restoring force FC may act in the +x-axis direction. When the second arm 912a lies completely on the base 31, a compression displacement amount of the second right spring 851a may have a maximum value, and a magnitude of the restoring force FC may have a maximum value. When the second arm 912a changes from a state of lying completely on the base 31 to a state of standing up with respect to the base 31, the compression displacement amount of the second right spring 851a may gradually decrease, and the magnitude of the restoring force FC may gradually decrease.

The force FT that the right rod 870a transfers to the second arm 912a may be a sum of the force FA required for the motor assembly 810 to move the right slider 860a in the +x-axis direction, the restoring force FB of the first right spring 841a, and the restoring force FC of the second right spring 851a.

When the second arm 912a starts to stand up with respect to the base 31 in the state of lying completely on the base 31, the load of the motor assembly 810 may be a maximum load. In this instance, the restoring force FB provided by the first right spring 841a may have a maximum magnitude, and the restoring force FC provided by the second springs 851a and 851b may have a maximum magnitude.

When the second arm 912a changes from the state of lying completely on the base 31 to the state of standing up with respect to the base 31, the restoring forces provided by the first right spring 841a and the second right spring 851a may assist the second arm 912a to stand up. The first right spring 841a and the second right spring 851a assist the second arm 912a to stand up, and thus the load of the motor assembly 810 can be reduced.

The first right spring 841a and the second right spring 851a may simultaneously provide a restoring force (a sum of the restoring force FB and the restoring force FC) to the right slider 860a. The restoring force (a sum of the restoring force FB and the restoring force FC) may be provided to the right slider 860a until a distance RD5 between the right slider 860a and the right locking jaw 852a is equal to a length of the second right spring 851a.

When the distance RD5 between the right slider 860a and the right locking jaw 852a is equal to the length of the second right spring 851a, the compression displacement amount of the second right spring 851a may be zero. When the compression displacement amount of the second right spring 851a is zero, the restoring force FC that the second right spring 851a provides to the right slider 860a may be zero.

When the distance RD5 between the right slider 860a and the right locking jaw 852a is greater than the length of the second right spring 851a, only the first right spring 841a may provide the restoring force FB to the right slider 860a. The restoring force FB may be provided to the right slider 860a until a distance RD6 between the right slider 860a and the second right bearing 830b is equal to a length of the first right spring 841a.

When the distance RD6 between the right slider 860a and the second right bearing 830b is equal to the length of the first right spring 841a, the compression displacement amount of the first right spring 841a may be zero. When the compression displacement amount of the first right spring 841a is zero, the restoring force FB that the first right spring 841a provides to the right slider 860a may be zero.

When the distance RD6 between the right slider 860a and the second right bearing 830b is greater than the length of the first right spring 841a, the motor assembly 810 does not receive the restoring force from the first right spring 841a or the second right spring 851a and can stand up the second arm 912a.

A structure formed by the first left spring 841b, the second left spring 851b, the left locking jaw 852b, the left slider 860b, the left guides 850c and 850d, the left lead screw 840b, the left rod 870b, and the second arm 912a may be symmetrical to the above-described structure formed by the first right spring 841a, the second right spring 851a, the right locking jaw 852a, the right slider 860a, the right guides 850a and 850b, the right lead screw 840a, the right rod 870a, and the second arm 912a. In this instance, a symmetry axis may be the symmetry axis ys of the motor assembly 810.

Figure 58:
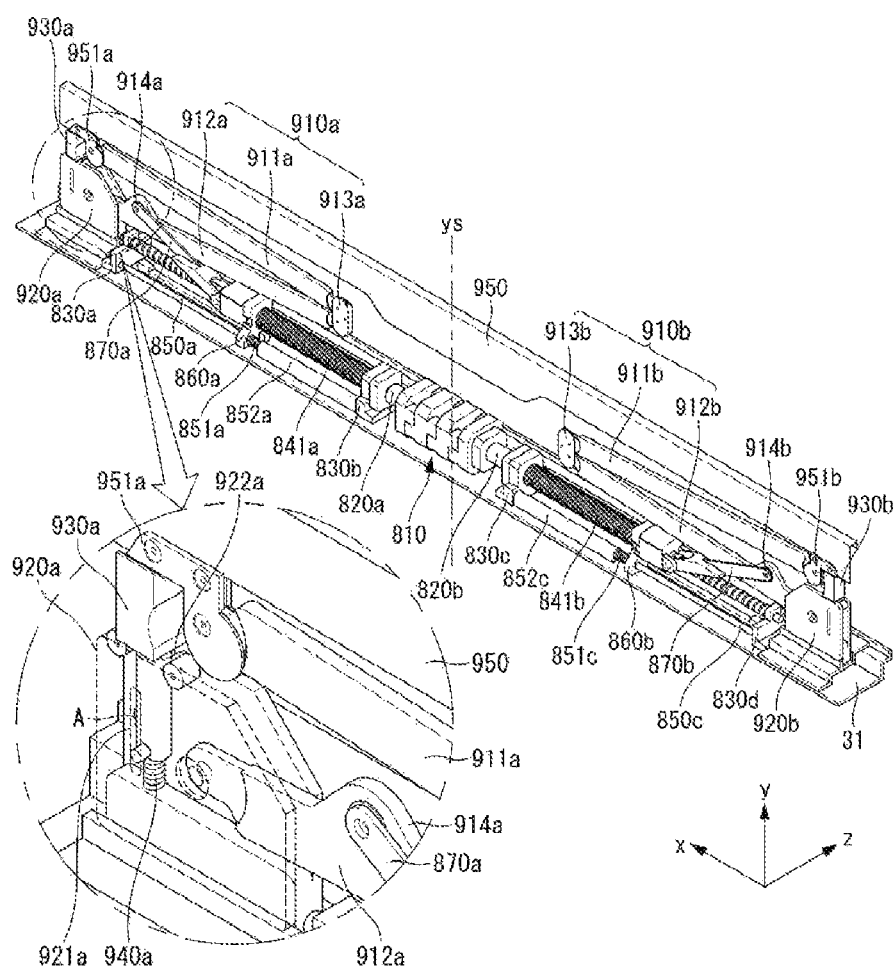

Referring to FIG. 58, pushers 930a and 930b may be connected to the link mounts 920a and 920b. The pushers 930a and 930b may include a right pusher 930a disposed on the right side of the motor assembly 810 and a left pusher 930b disposed on the left side of the motor assembly 810.

The link mounts 920a and 920b may form an accommodation space A. The accommodation space A may accommodate the springs 940a and 940b and the pushers 930a and 930b. The springs 940a and 940b may include a right spring 940a disposed on the right side of the motor assembly 810 and a left spring 940b disposed on the left side of the motor assembly 810. The accommodation space A may be referred to an inner space A.

The link mounts 920a and 920b may include a first hole 922a connecting the accommodation space A and an outer space (first hole corresponding to the link mount 920b is not shown). The first hole 922a may be formed in the upper surfaces of the link mounts 920a and 920b. The first hole 922a may be referred to as a hole 922a.

The pushers 930a and 930b may be positioned perpendicular to the base 31. Alternatively, the pushers 930a and 930b may be disposed parallel to the y-axis. The springs 940a and 940b may be positioned perpendicular to the base 31. Alternatively, the springs 940a and 940b may be disposed parallel to the y-axis.

The pushers 930a and 930b may include first parts 931a and 931b and second parts 932a and 932b. The second parts 932a and 932b may be connected to lower sides of the first parts 931a and 931b. Lower ends of the second parts 932a and 932b may be connected to the springs 940a and 940b. The second parts 932a and 932b may be entirely or partially accommodated in the accommodation space A formed by the link mounts 920a and 920b. The second parts 932a and 932b may have a diameter equal to a diameter of the first hole 922a or a diameter less than the diameter of the first hole 922a. The second parts 932a and 932b may pass through the first hole 922a.

The first parts 931a and 931b may be positioned outside the link mounts 920a and 920b. Alternatively, the first parts 931a and 931b may be positioned outside the accommodation space A of the link mounts 920a and 920b. The first parts 931a and 931b may have a diameter greater than the diameter of the first hole 922a.

The first parts 931a and 931b may contact or be separated from the link brackets 951a and 951b. For example, when the second arms 912a and 912b lie completely on the base 31, the first parts 931a and 931b may contact the link brackets 951a and 951b. Alternatively, when the second arms 912a and 912b completely stand up with respect to the base 31, the first parts 931a and 931b may be spaced apart from the link brackets 951a and 951b.

When the first parts 931a and 931b contact the link brackets 951a and 951b, the pushers 930a and 930b may receive a force from the link brackets 951a and 951b. The force received by the pushers 930a and 930b may be in a downward direction. Alternatively, the force received by the pushers 930a and 930b may be in the -y-axis direction. Alternatively, the link brackets 951a and 951b may pressurize the pushers 930a and 930b. A direction in which the link brackets 951a and 951b pressurize the pushers 930a and 930b may be a downward direction. Alternatively, a direction in which the link brackets 951a and 951b pressurize the pushers 930a and 930b may be the -y-axis direction.

When the first parts 931a and 931b receive a force, the springs 940a and 940b may be compressed. The compressed springs 940a and 940b may provide a restoring force to the pushers 930a and 930b. The restoring force may be in a direction opposite to a direction of the force applied to the first parts 931a and 931b. Alternatively, the restoring force may act in the +y-axis direction.

The link mounts 920a and 920b may include a second hole 921a (second hole corresponding to the link mount 920b is not shown). The second hole 921a may communicate the accommodation space A with an outer space. The springs 940a and 940b may be entirely or partially exposed to the outside through the second hole 921a. The pushers 930a and 930b may be entirely or partially exposed to the outside through the second hole 921a. During maintenance or repair of the display device, a service provider may check operation states of the pushers 930a and 930b through the second hole 921a. The second hole 921a may provide the convenience of maintenance or repair to the service provider.

Figure 59:
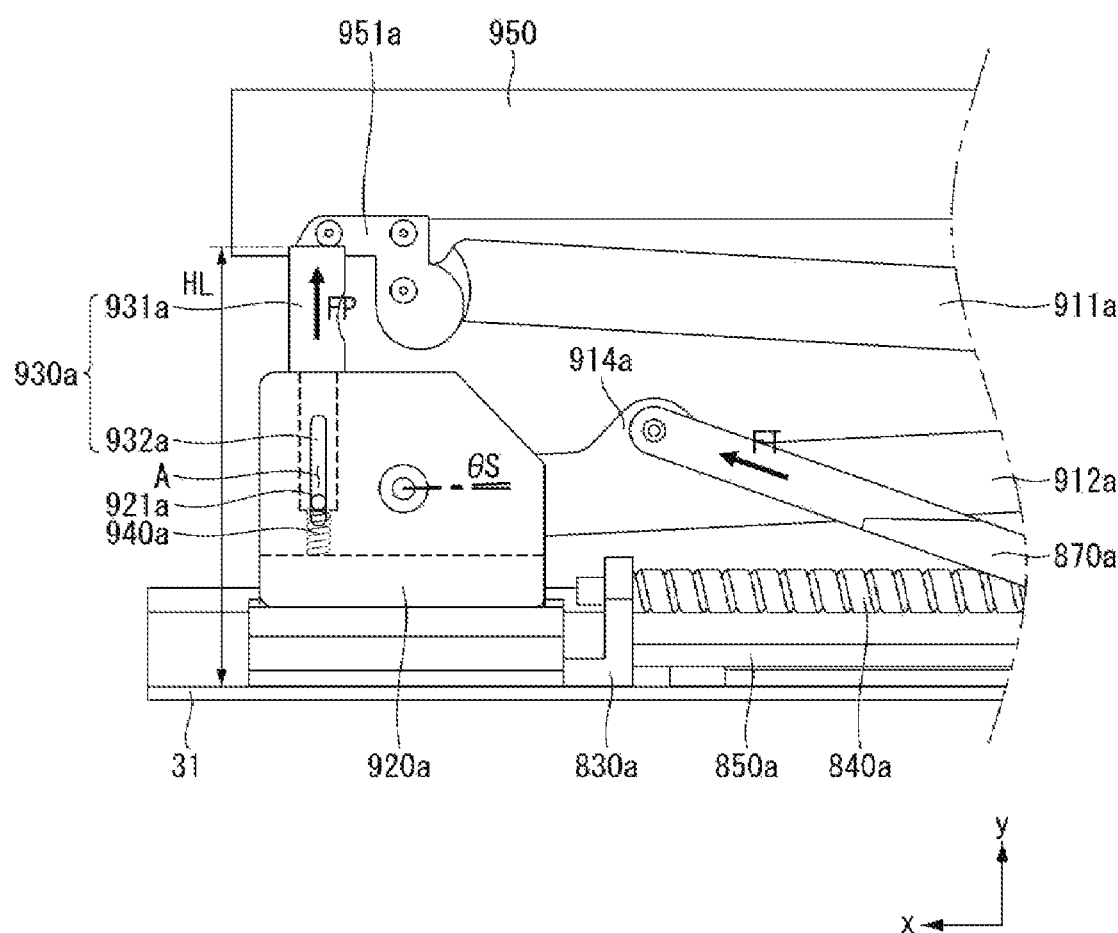
Figure 60:
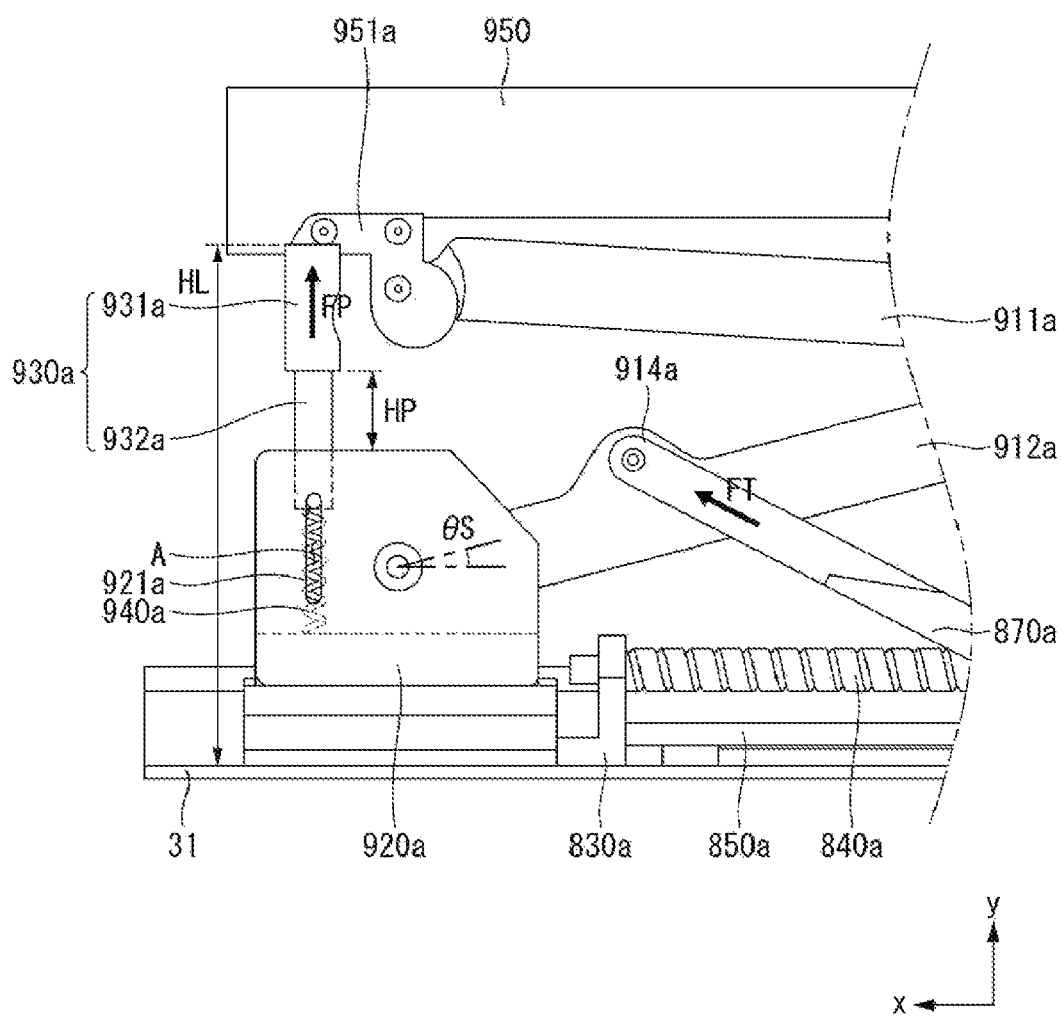
Figure 61:
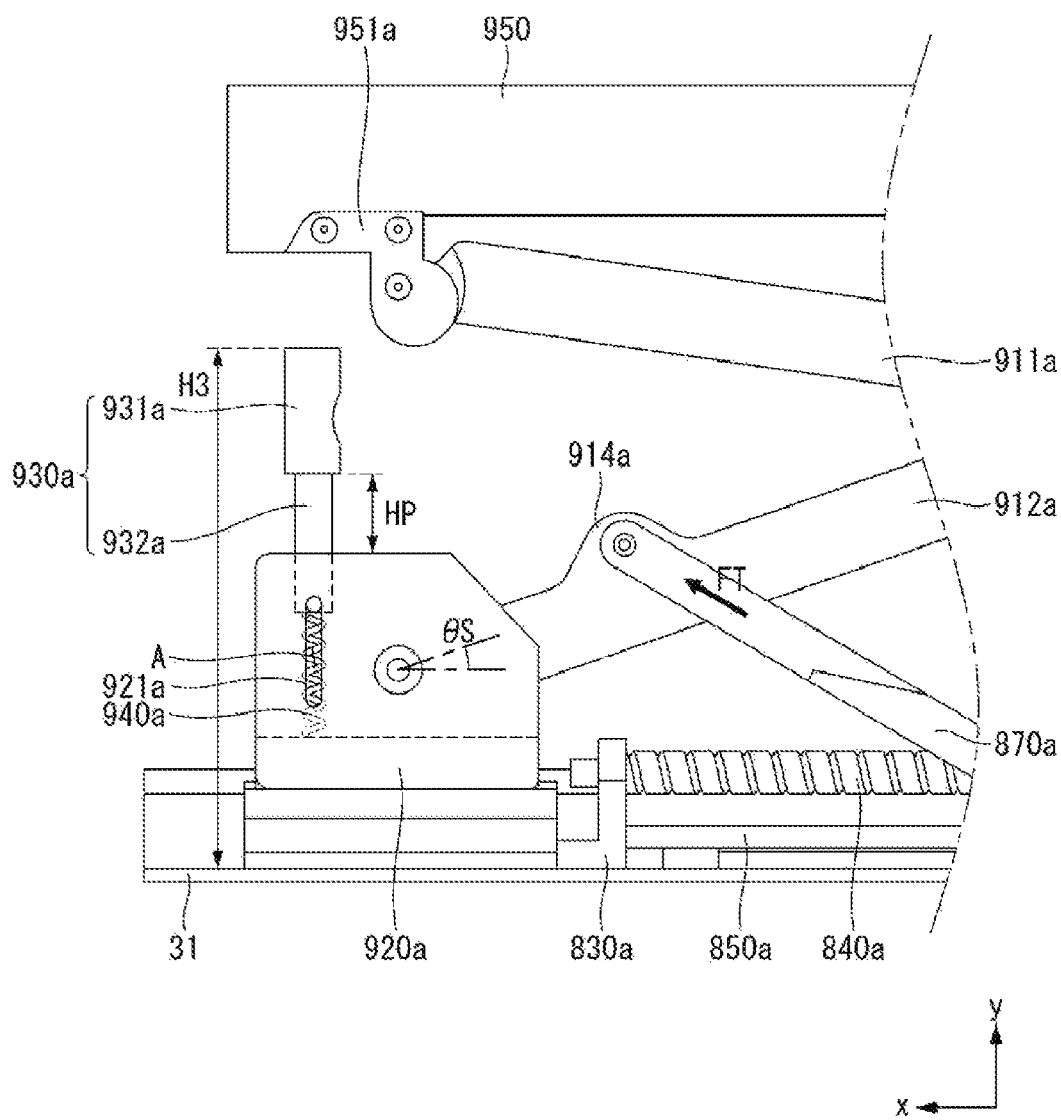

Referring to FIGS. 59 to 61, the right link 910a may receive a restoring force from the right pusher 930a and stand up. The following description is given based on the right link 910a.

An angle formed by the second arm 912a and the base 31 may be denoted as θS. A force that the right rod 870a transfers to the second arm 912a may be denoted as FT. A force that the right pusher 930a transfers to the right link bracket 951a may be denoted as FP.

Referring to FIG. 59, when the second arm 912a lies completely on the base 31, the angle θS may have a minimum value. The right spring 940a connected to the right pusher 930a may be compressed to the maximum, and a magnitude of the restoring force FP may have a maximum value. The compressed right spring 940a may provide the restoring force FP to the right pusher 930a. The right pusher 930a may transfer the restoring force FP to the right link bracket 951a. The restoring force FP may act in the +y-axis direction.

When the second arm 912a lies completely on the base 31, a distance HL from the base 31 to an upper end of the right pusher 930a may have a minimum value. The first part 931a of the right pusher 930a may protrude to the outside of the right link mount 920a, and the second part 932a of the right pusher 930a may be entirely accommodated in an accommodation space 923a of the right link mount 920a.

Referring to FIG. 60, when the second arm 912a changes from a state of lying completely on the base 31 to a state of standing up with respect to the base 31, the angle θS may gradually increase. In addition, a compression displacement amount of the right spring 940a may gradually decrease, and a magnitude of the restoring force FP may gradually decrease.

As the angle OS gradually increases, at least a portion of the second part 932a of the right pusher 930a may protrude to the outside of the right link mount 920a. A length of the second part 932a of the right pusher 930a protruding to the outside of the right link mount 920a may be denoted as HP. The distance HL from the base 31 to the upper end of the right pusher 930a may be increased by HP, compared to when the second arm 912a lies completely on the base 31.

Referring to FIG. 61, when the standing up of the second arm 912a with respect to the base 31 is performed, the right pusher 930a and the right link bracket 951a may be separated from each other. A compression displacement amount of the right spring 940a may be zero. When the compression displacement amount of the right spring 940a is zero, the restoring force FP that the right pusher 930a provides to the right link bracket 951a may be zero.

Further, the length HP of the second part 932a of the right pusher 930a protruding to the outside of the right link mount 920a may have a maximum value. The distance HL from the base 31 to the upper end of the right pusher 930a may have a maximum value.

That is, the right pusher 930a applies the restoring force to the right link bracket 951a while contacting the right link bracket 951a, and thus can assist the second arm 912a to stand up and reduce the load of the motor assembly 810.

The lead screws 840a and 840b may be driven by one motor assembly 810. The second arms 912a and 912b may stand up while being symmetrical to each other by driving the lead screws 840a and 840b by one motor assembly 810. However, when the lead screws 840a and 840b are driven by one motor assembly 810, the load on the motor assembly 810 may excessively increase to stand up the second arms 912a and 912b. In this instance, the right pusher 930a applies the restoring force to the right link bracket 951a and thus can assist the second arm 912a to stand up and reduce the load of the motor assembly 810.

Alternatively, when the second arm 912a changes from a state of standing up with respect to the base 31 to a state of lying completely on the base 31, the restoring force that the right pusher 930a provides to the right link bracket 951a can alleviate an impact generated when the link 910a lies on the base 31. That is, that the right pusher 930a providing the restoring force to the right link bracket 951a may serve as a damper when the link 910a lies on the base 31. The right pusher 930a serves as the damper, and thus the load of the motor assembly 810 can be reduced.

A structure formed by the left pusher 930b, the left spring 940b, the left link bracket 951b, the left link mount 920b, and the left rod 870b may be symmetrical to the above-described structure formed by the right pusher 930a, the right spring 940a, the right link bracket 951a, the right link mount 920a, and the right rod 870a. In this instance, a symmetry axis may be the symmetry axis ys of the motor assembly 810.

Figure 62:
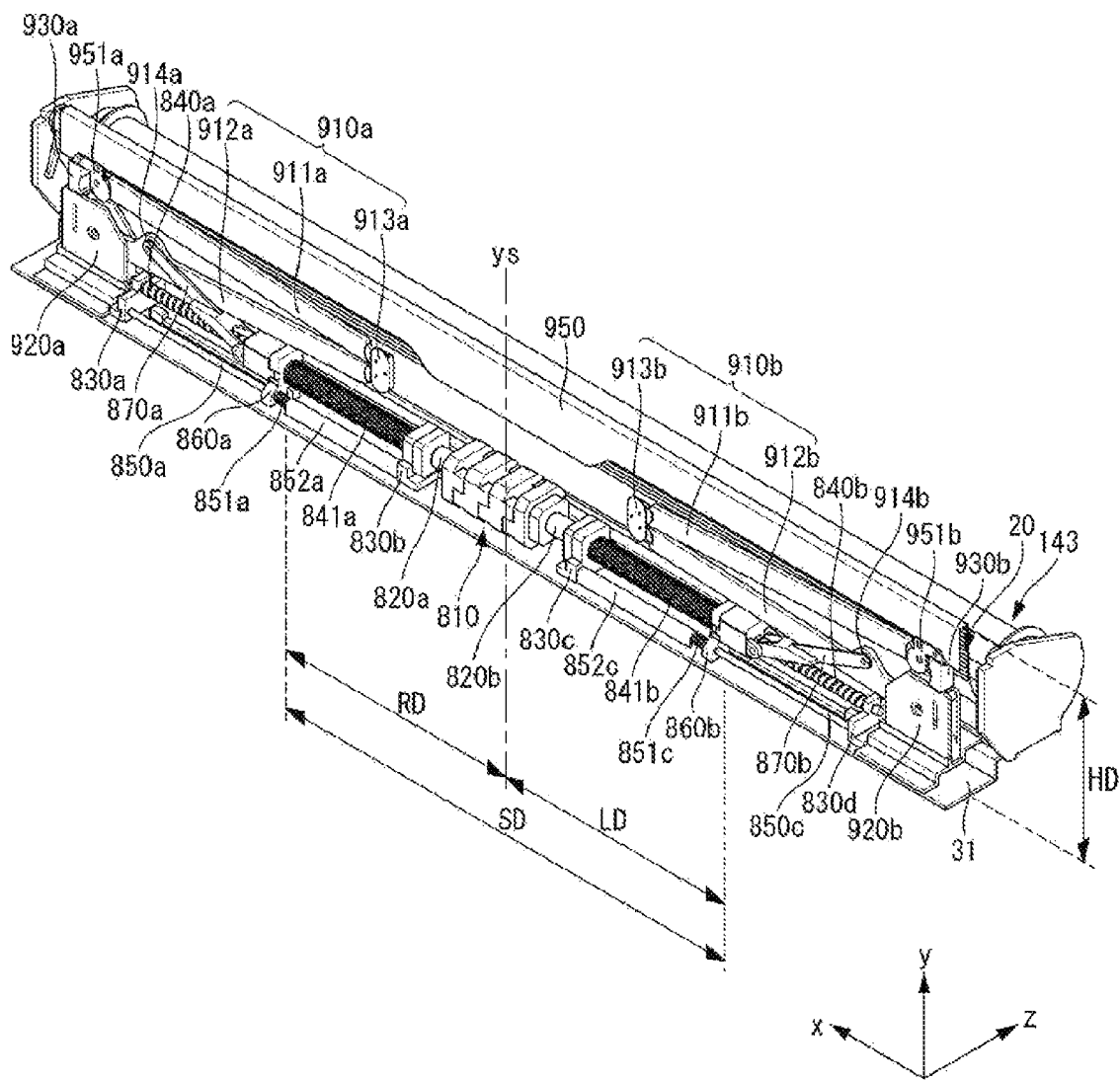
Figure 63:
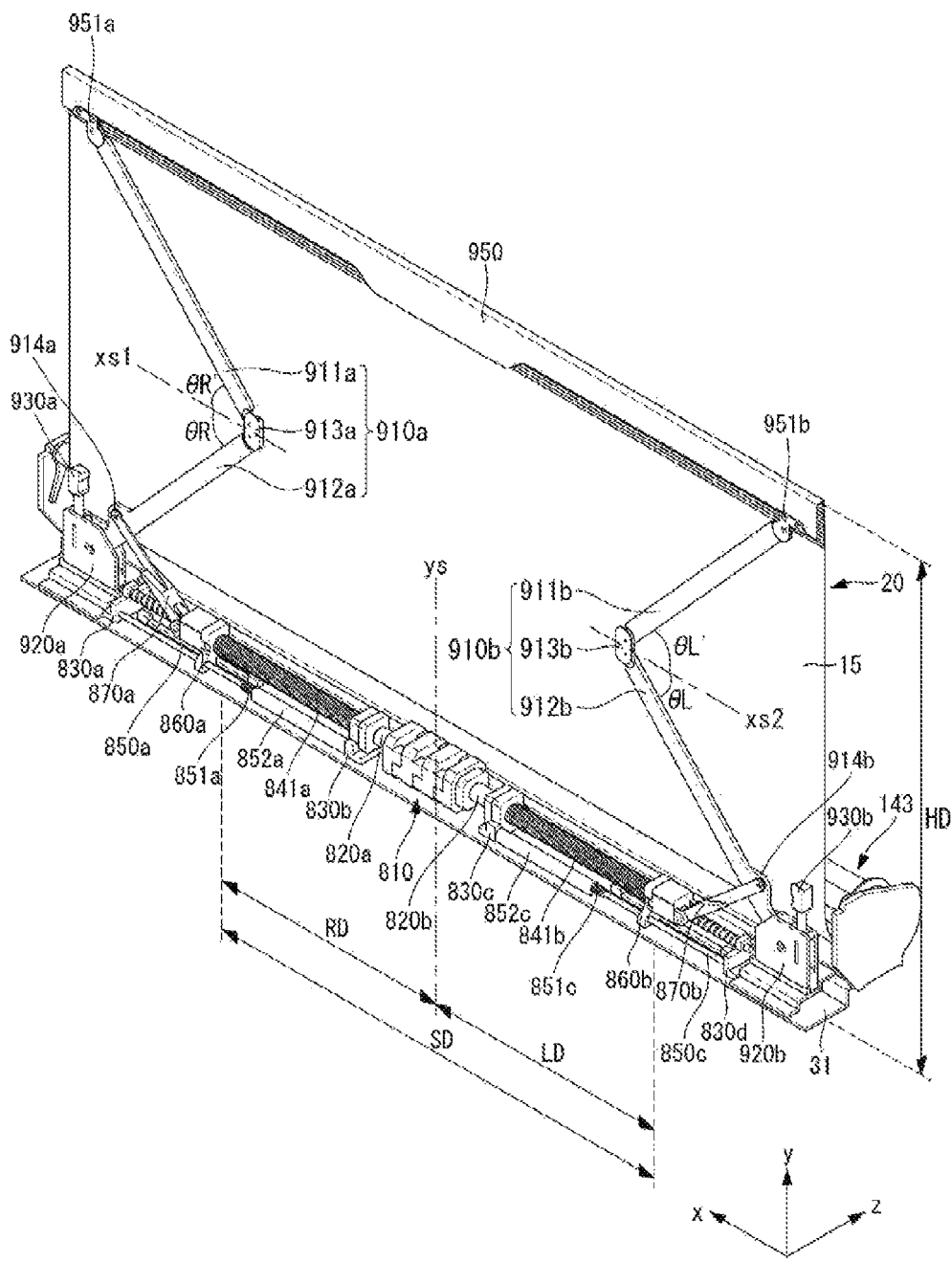
Figure 64:
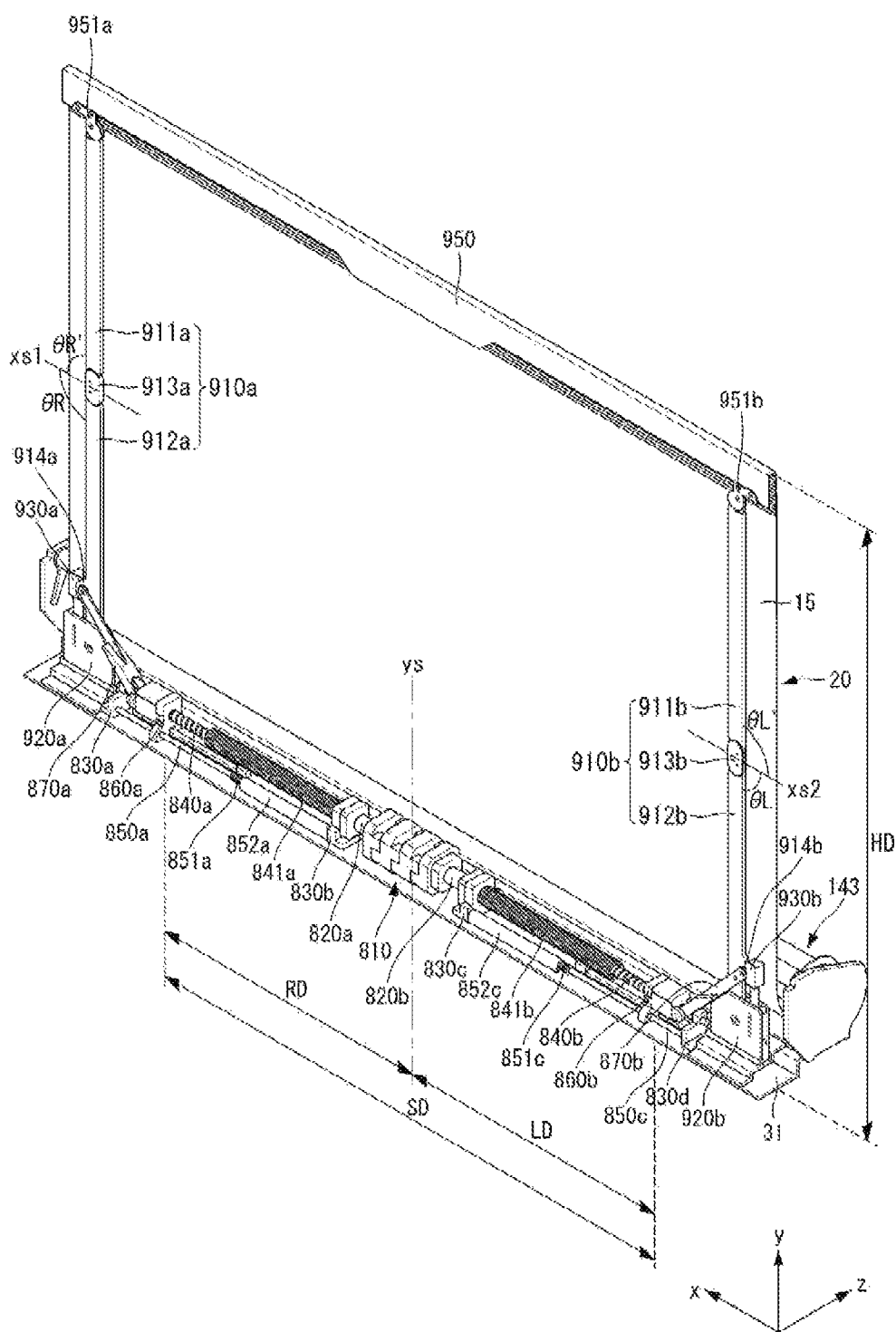

Referring to FIGS. 62 to 64, the panel roller 143 may be installed on the base 31. The panel roller 143 may be installed in front of the lead screws 840a and 840b. Alternatively, the panel roller 143 may be disposed parallel to the longitudinal direction of the lead screws 840a and 840b. Alternatively, the panel roller 143 may be spaced apart from the lead screws 840a and 840b.

The display unit 20 may include the display panel 10 and the module cover 15. The lower side of the display unit 20 may be connected to the panel roller 143, and the upper side of the display unit 20 may be connected to the upper bar 75. The display unit 20 may be rolled or unrolled from the panel roller 143.

A distance from the symmetry axis ys of the motor assembly 810 to the right slider 860a may be denoted as RD. A distance from the symmetry axis ys of the motor assembly 810 to the left slider 860b may be denoted as LD. A distance between the right slider 860a and the left slider 860b may be denoted as SD. The distance SD may be a sum of the distance RD and the distance LD. A distance from the base 31 to the upper end of the display unit 20 may be denoted as HD.

Referring to FIG. 62, when the second arms 912a and 912b lie completely on the base 31, the distance SD between the right slider 860a and the left slider 860b may have a minimum value. The distance RD from the symmetry axis ys of the motor assembly 810 to the right slider 860a and the distance LD from the symmetry axis ys of the motor assembly 810 to the left slider 860b may be equal to each other.

When the second arms 912a and 912b lie completely on the base 31, the distance HD from the base 31 to the upper end of the display unit 20 may have a minimum value.

When the second arms 912a and 912b lie completely on the base 31, the first springs 841a and 841b may contact the sliders 860a and 860b. Further, the second springs 851a and 851b may contact the sliders 860a and 860b, and the pushers 930a and 930b may contact the link brackets 951a and 951b.

When the second arms 912a and 912b lie completely on the base 31, an amount of compression of the first springs 841a and 841b may have a maximum value, and a magnitude of a restoring force that the first springs 841a and 841b provide to the sliders 860a and 860b may have a maximum value.

When the second arms 912a and 912b lie completely on the base 31, an amount of compression of the second springs 851a and 851b may have a maximum value, and a magnitude of a restoring force that the second springs 851a and 851b provide to the sliders 860a and 860b may have a maximum value.

When the second arms 912a and 912b lie completely on the base 31, an amount of compression of the springs 940a and 940b may have a maximum value, and a magnitude of a restoring force that the springs 940a and 940b provide to the pushers 930a and 930b may have a maximum value.

When the second arms 912a and 912b start to stand up with respect to the base 31, the second arms 912a and 912b may receive the restoring force from the first springs 841a and 841b, the second springs 851a and 851b, and the springs 940a and 940b to stand up. Hence, a load on the motor assembly 810 can be reduced.

Referring to FIG. 63, as the standing up of the second arms 912a and 912b with respect to the base 31 is performed, the distance SD between the right slider 860a and the left slider 860b may gradually increase. Even if the distance SD increases, the distance RD and the distance LD can be equal to each other. That is, the right slider 860a and the left slider 860b may be positioned to be symmetrical to each other with respect to the symmetry axis ys of the motor assembly 810. Further, a degree to which the second arms 912a and 912b of the right link 910a stand up with respect to the base 31 and a degree to which the second arms 912a and 912b of the left link 910b stand up with respect to the base 31 may be the same as each other.

As the standing up of the second arms 912a and 912b with respect to the base 31 is performed, the distance HD from the base 31 to the upper end of the display unit 20 may gradually increase. The display unit 20 may be unrolled from the panel roller 143. Alternatively, the display unit 20 may be deployed from the panel roller 143.

When the second arms 912a and 912b sufficiently stand up with respect to the base 31, the first springs 841a and 841b may be separated from the sliders 860a and 860b. Further, when the second arms 912a and 912b sufficiently stand up with respect to the base 31, the second springs 851a and 851b may be separated from the sliders 860a and 860b. Further, when the second arms 912a and 912b sufficiently stand up with respect to the base 31, the pushers 930a and 930b may be separated from the link brackets 951a and 951b.

The separation of the first springs 841a and 841b from the sliders 860a and 860b, the separation of the second springs 851a and 851b from the sliders 860a and 860b, and the separation of the pushers 930a and 930b from the link brackets 951a and 951b may be performed independently of each other. That is, the order of the separation of the first springs 841a and 841b from the sliders 860a and 860b, the separation of the second springs 851a and 851b from the sliders 860a and 860b, and the separation of the pushers 930a and 930b from the link brackets 951a and 951b may be mutually variable.

An angle formed by an axis xs1 parallel to the base 31 and the second arm 912a may be denoted as $\theta R$, and an angle formed by the axis xs1 parallel to the base 31 and the first arm 911a may be denoted as $\theta R'$. The axis xs1 may be parallel to the x-axis.

When the second arm 912a lies completely on the base 31, or while the second arm 912a stands up with respect to the base 31, or when the standing up of the second arm 912a with respect to the base 31 is completed, the angle $\theta R$ and the angle $\theta R'$ may be maintained to be the same.

An angle formed by an axis xs2 parallel to the base 31 and the second arm 912b may be denoted as $\theta L$, and an angle formed by the axis xs2 parallel to the base 31 and the first arm 911b may be denoted as $\theta L'$. The axis xs2 may be parallel to the x-axis.

When the second arm 912b lies completely on the base 31, or while the second arm 912b stands up with respect to the base 31, or when the standing up of the second arm 912b with respect to the base 31 is completed, the angle $\theta L$ and the angle $\theta L'$ may be maintained to be the same.

The axis xs1 and the axis xs2 may be the same axis.

Referring to FIG. 64, when the second arms 912a and 912b completely stand up with respect to the base 31, the distance SD between the right slider 860a and the left slider 860b may have a maximum value. Even if the distance SD has the maximum value, the distance RD and the distance LD can be equal to each other.

When the second arms 912a and 912b completely stand up with respect to the base 31, the distance HD from the base 31 to the upper end of the display unit 20 may have a maximum value.

Figure 65:
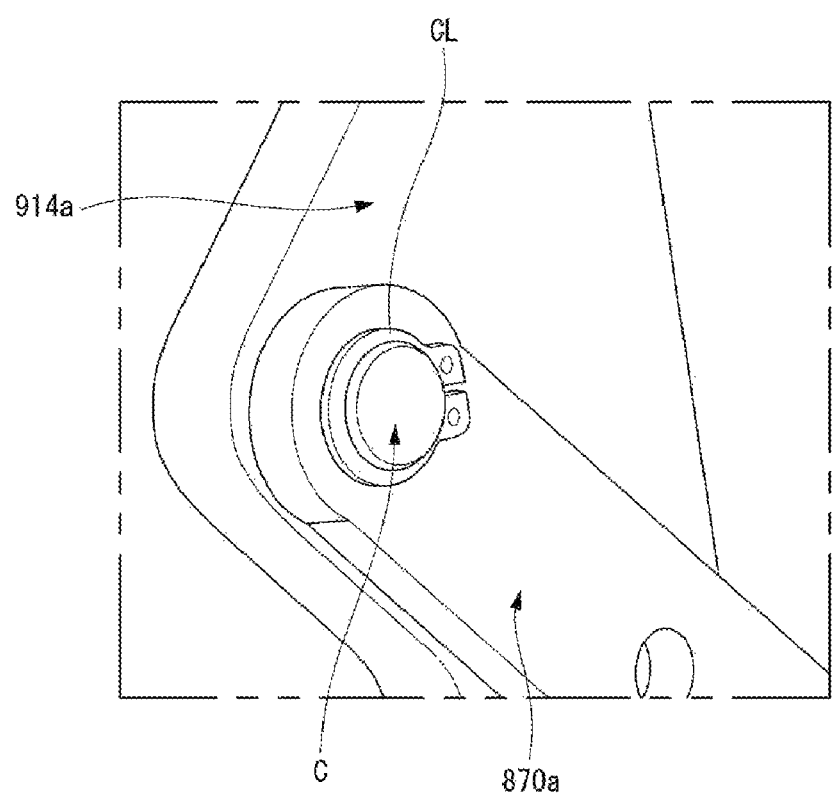
FIGS. 65 to 70 illustrate a display device according to another embodiment of the disclosure.
Figure 66:
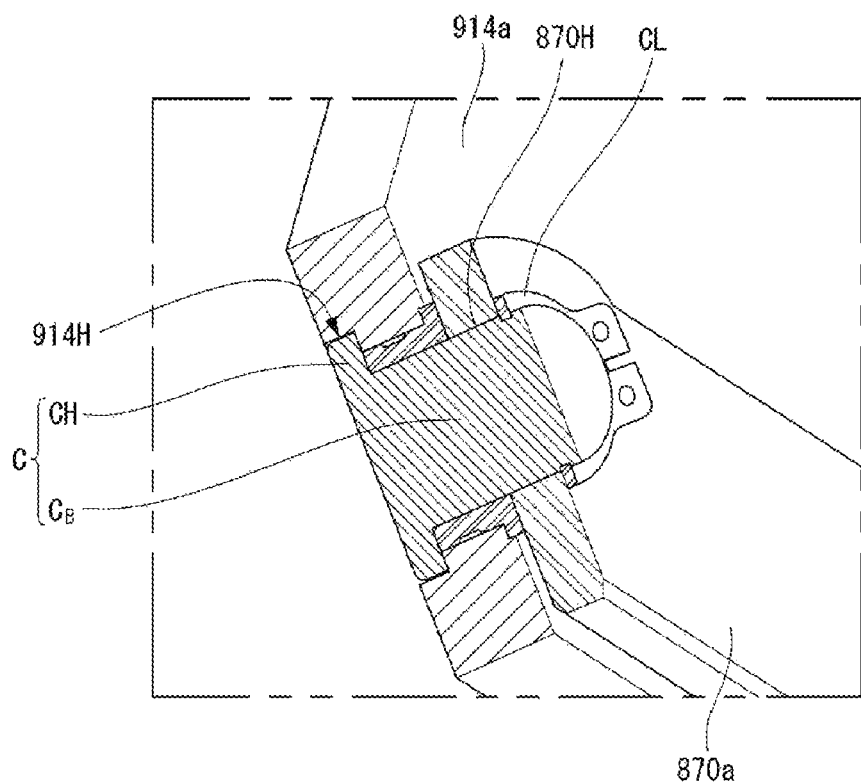
Figure 67:
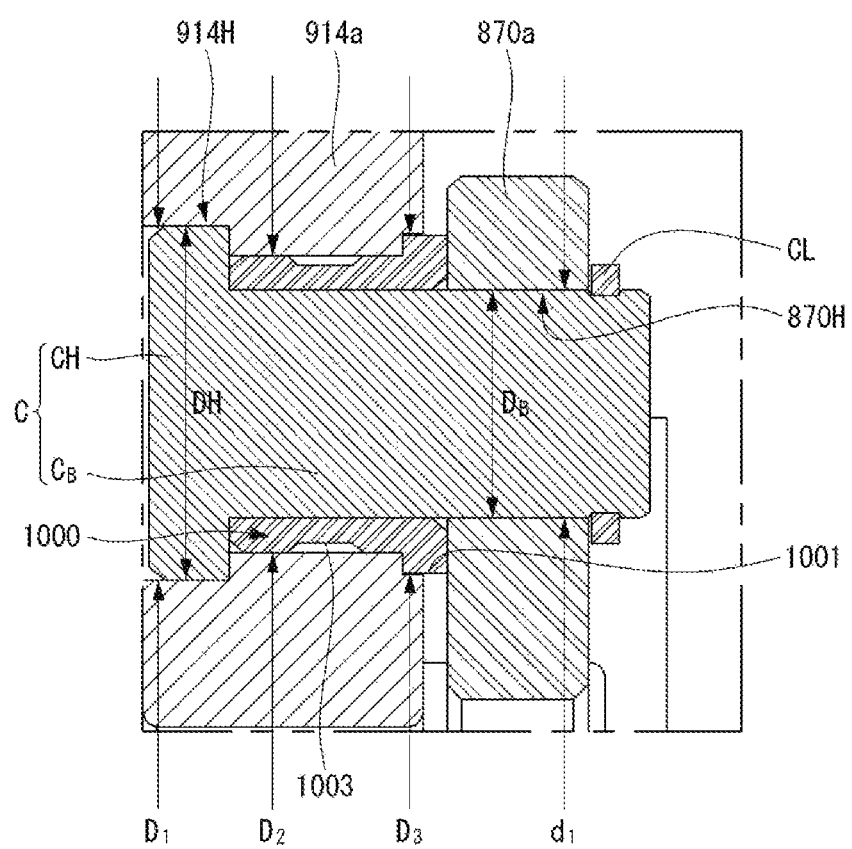

Referring to FIGS. 65 to 67, the connection portion 914a of the second arm 912a may be pivotally connected to the right rod 870a. The connection portion 914a of the second arm 912a may include a hole 914H, and the right rod 870a may include a hole 870H at a location corresponding to the hole 914H of the connection portion 914a. Diameters D1, D2 and D3 of the hole 914H of the connection portion 914a of the second arm 912a may be greater than a diameter d1 of the hole 870H of the right rod 870a.

A connection member C may be inserted into the hole 914H of the connection portion 914a of the second arm 912a and the hole 870H of the right rod 870a. For example, the connection member C may be a pin. The connection member C may include a body CB and a head CH, and a diameter DH of the head CH may be greater than a diameter DB of the body CB.

The diameter D1 of the hole 914H corresponding to the head CH of the connection member C may be greater than the diameter D2 of the hole 914H corresponding to the body CB of the connection member C. The diameter DH of the head CH of the connection member C may be substantially equal to the diameter D1 of the hole 914H. A gap may be positioned between the body CB of the connection member C and the hole 914H. For example, the gap may entirely have a ring shape. The diameter DB of the body CB of the connection member C may be substantially equal to the diameter d1 of the hole 870H of the right rod 870a.

A fixing member CL may be inserted into a portion of the connection member C protruding to the outside of the right rod 870a. For example, the fixing member CL may be a clip.

The connection member C to which the connection portion 914a of the second arm 912a and the right rod 870a are pivotally connected may be subjected to a high load during a pivot drive. In addition, the connection portion 914a of the second arm 912a and the right rod 870a may be made of different kinds of materials. Hence, abrasion of the material or noise may occur when the connection portion 914a of the second arm 912a and the right rod 870a are pivotally driven.

An intermediate member 1000 may surround an outer diameter of the body CB of the connection member C. The intermediate member 1000 may have a ring shape, and the body CB of the connection member C may be inserted into the intermediate member 1000. An inner diameter of the intermediate member 1000 may be substantially equal to or greater than the outer diameter of the body CB of the connection member C, and an outer diameter of the intermediate member 1000 may be substantially equal to or less than the diameter D2 of the hole 914H. The intermediate member 1000 may include a flange 1001. The flange 1001 of the intermediate member 1000 may be positioned between the connection portion 914a of the second arm 912a and the right rod 870a. The intermediate member 1000 may include a groove 1003 at its outer diameter. The groove 1003 of the intermediate member 1000 may have a ring shape formed by recessing an outer surface of the intermediate member 1000. A lubricant may be accommodated in the groove 1003 of the intermediate member 1000. Hence, the lubricant may not require intermediate refueling.

Accordingly, the present disclosure can reduce and prevent abrasion of the material or noise generated when the connection portion 914a of the second arm 912a and the right rod 870a are pivotally driven.

Figure 68:
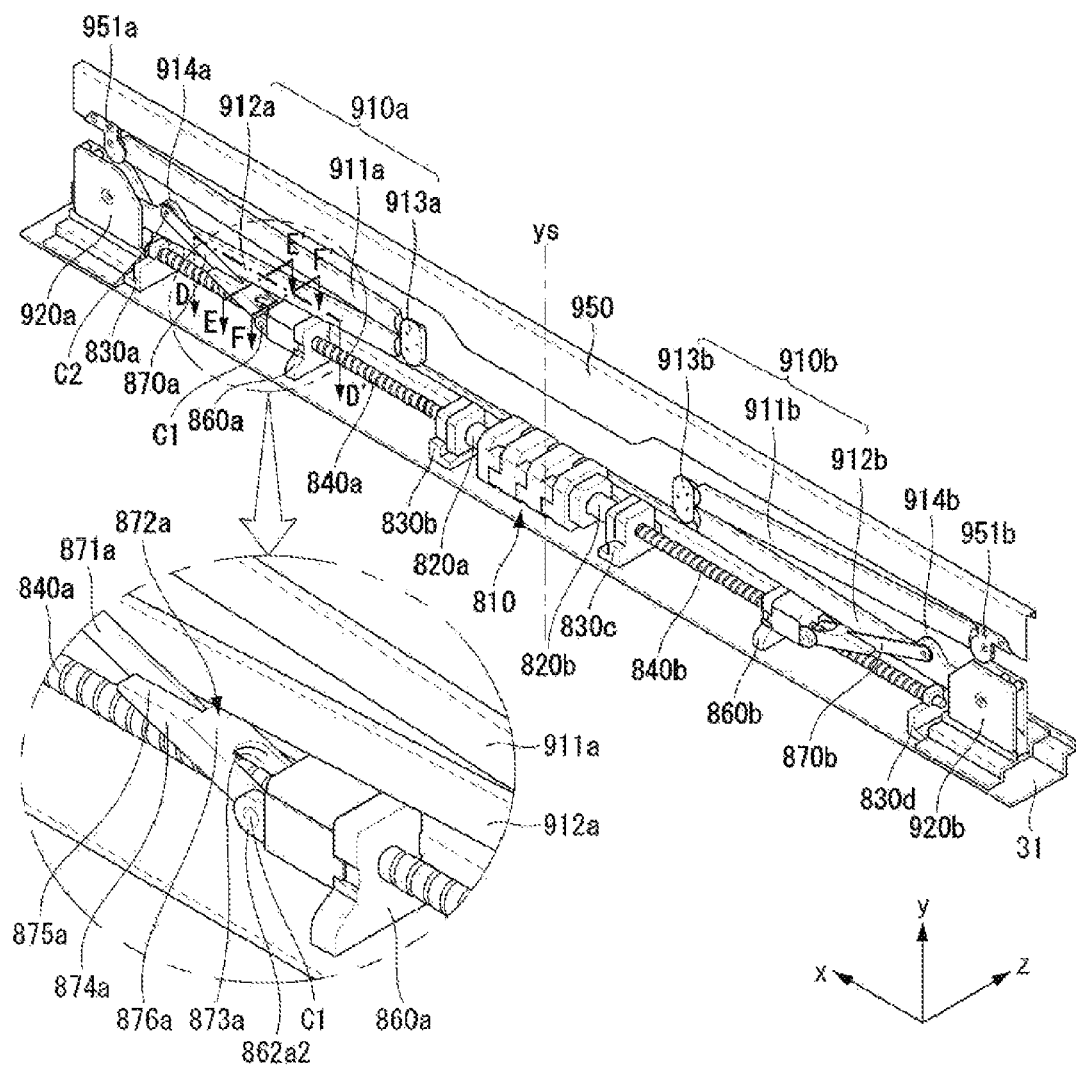
Figure 69:
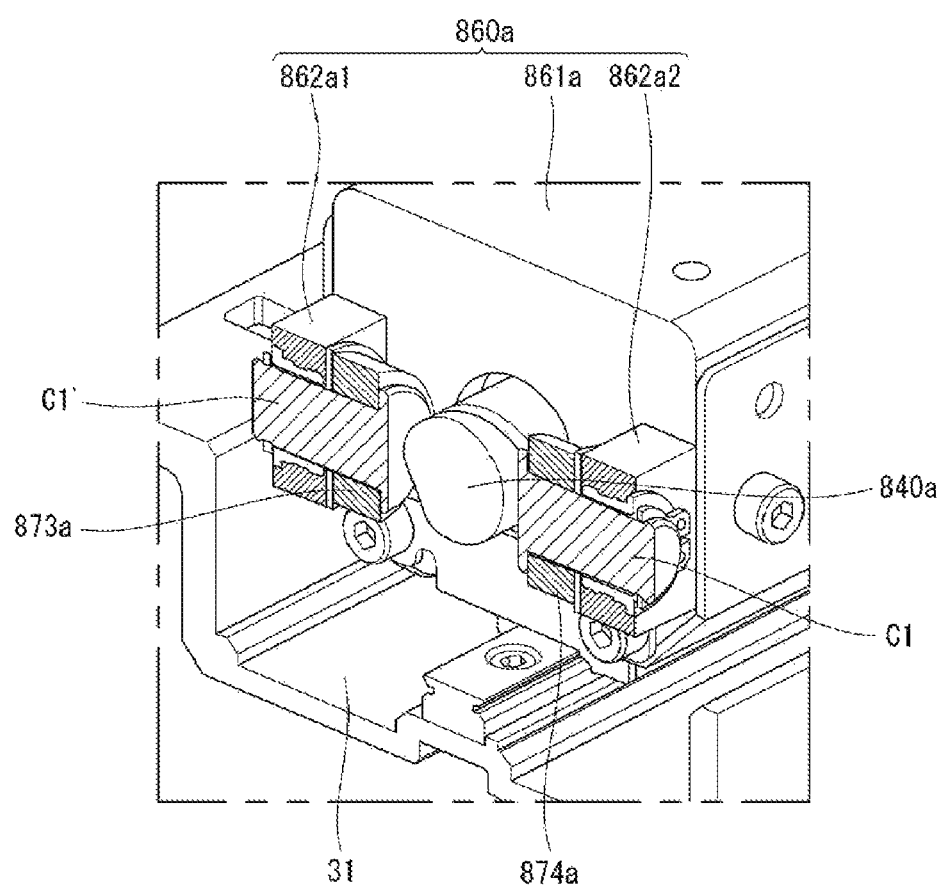
Figure 70:
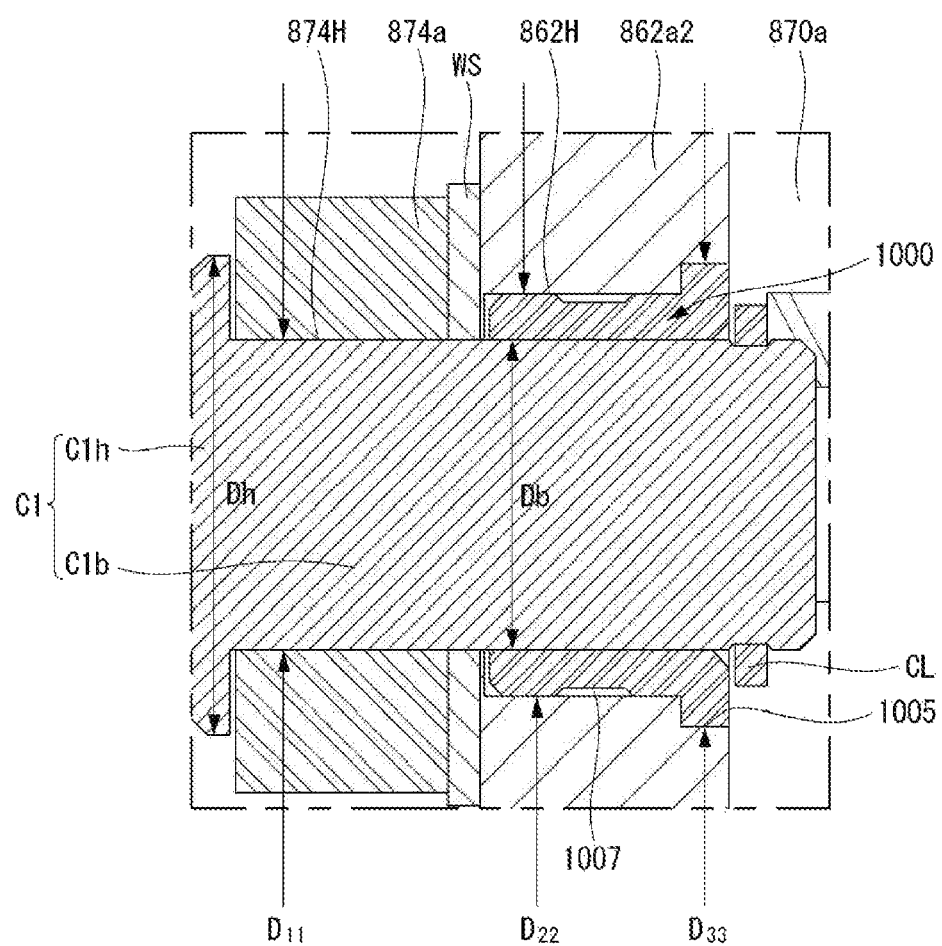

Referring to FIGS. 68 to 70, the cover 872a of the right rod 870a may be pivotally connected to the slider 860a. The first plate 873a of the cover 872a may be pivotally connected to the first rod mount 862a1 of the slider 860a, and the second plate 874a of the cover 872a may be pivotally connected to the second rod mount 862a2 of the slider 860a.

A connection member C1' may be inserted into a pivot connection portion of the first plate 873a of the cover 872a and the first rod mount 862a1 of the slider 860a. A connection member C1 may be inserted into a pivot connection portion of the second plate 874a of the cover 872a and the second rod mount 862a2 of the slider 860a.

The connection members C1 and C1' may be subjected to a high load during a pivot drive. In addition, the first plate 873a of the cover 872a and the first rod mount 862a1 of the slider 860a may be made of different kinds of materials. Further, the second plate 874a of the cover 872a and the second rod mount 862a2 of the slider 860a may be made of different kinds of materials. Hence, abrasion or noise may occur in the pivot connection portion or the connection members C1 and C1' during the pivot drive.

The connection member C1 may include a body C1b and a head C1h. A diameter Dh of the head C1h may be greater than a diameter Db of the body C1b. A diameter D11 of a hole 874H of the second plate 874a of the cover 872a may be slightly greater than or substantially equal to the diameter Db of the body C1b of the connection member C1. A diameter D22 of a hole 862H of the second rod mount 862a2 may be greater than the diameter Db of the body C1b of the connection member C1. A gap may be formed between the body C1b of the connection member C1 and the hole 862H of the second rod mount 862a2. The gap may have entirely a ring-shape.

An intermediate member 1000 may be inserted into the gap between the second rod mount 862a2 and the body C1b of the connection member C1. The intermediate member 1000 may entirely have a ring shape. An inner diameter of the intermediate member 1000 may be slightly greater than or substantially equal to an outer diameter of the body C1b of the connection member C1. An outer diameter of the intermediate member 1000 may be slightly less than or substantially equal to an inner diameter of the hole 862H of the second rod mount 862a2.

The intermediate member 1000 may include a flange 1005. The flange 1005 of the intermediate member 1000 may be inserted into the second rod mount 862a2. An outer diameter of the flange 1005 may be slightly less than or substantially equal to the diameter of the hole 862H of the second rod mount 862a2.

A fixing member CL may be inserted into a portion of the connection member C1 protruding to the outside. For example, the fixing member CL may be a clip.

The intermediate member 1000 may include a groove 1007 at its outer diameter. The groove 1007 of the intermediate member 1000 may have a ring shape formed by recessing an outer surface of the intermediate member 1000. A lubricant may be accommodated in the groove 1007 of the intermediate member 1000. Hence, the lubricant may not require intermediate refueling.

Accordingly, the present disclosure can reduce and prevent abrasion of the material or noise generated when the rod mounts 862*a*1 and 862*a*2 of the slider 860*a* and the plates 873*a* and 874*a* of the cover 872*a* are pivotally driven.

Embodiments of the disclosure described above are not mutually exclusive or distinct from each other. Configurations or functions of embodiments of the disclosure described above may be used together or combined with each other.

Embodiments of the disclosure described and illustrated the structure of the display device in which the display unit is rolled up from the inside of the housing, but are not limited thereto. Embodiments of the disclosure can be applied to a structure of the display device in which the display unit is rolled down from the inside of the housing.

Although embodiments have been described with reference to a number of illustrative embodiments thereof, it should be understood that numerous other modifications and embodiments can be devised by those skilled in the art that will fall within the scope of the principles of the disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a housing;
   a roller disposed inside the housing;
   a display unit configured to be rolled around the roller;
   a first arm and a second arm, wherein one end of the first arm is rotatably coupled to the display unit and another end of the first arm is rotatably coupled to the second arm;
   a lead screw disposed inside the housing;
   a slider configured to move along the lead screw according to a rotation of the lead screw; and
   a rod comprising one end rotatably coupled to the slider and another end rotatably coupled to the second arm such that the second arm is raised and lowered based on movement of the slider along the lead screw;
   wherein the rod and the second arm are rotatably coupled via at least a first connection member and a first intermediate member,
   wherein the first connection member is configured to pass through the second arm and the rod and the first intermediate member is configured to surround a portion of the first connection member which passes through the second arm.

2. The display device of claim 1, wherein the rod and the slider are rotatably coupled via at least a second connection member and a second intermediate member,
   wherein the second connection member is configured to pass through the rod and a portion of the slider and the second intermediate member is configured to surround a portion of the second connection member which passes through the portion of the slider.

3. The display device of claim 2, wherein the portion of the slider is a rod mount extending from a body of the slider, wherein the second connection member comprises:

a second connection member body configured to pass through a second opening at the rod and an opening at the rod mount; and
   a second connection member head connected to the second connection member body and having a diameter greater than a diameter of the second connection member body,
   wherein the second intermediate member has a ring shape,
   wherein an inner circumferential surface of the second intermediate member contacts an outer circumferential surface of the second connection member body, and
   wherein an outer circumferential surface of the second intermediate member contacts an inner circumferential surface of the opening at the rod mount.

4. The display device of claim 3, wherein the second intermediate member comprises:
   a second flange positioned at an end of the second intermediate member away from the second connection member head and the rod; and
   a second groove formed at the outer circumferential surface of the second intermediate member and positioned to face the inner circumferential surface of the opening at the rod mount.

5. The display device of claim 4, wherein the second groove is configured to accommodate a lubricant.

6. The display device of claim 4, wherein the second flange is accommodated within the opening at the rod mount.

7. The display device of claim 3, further comprising a second fixing member configured to pass through an end of the second connection member body opposite the second connection member head.

8. The display device of claim 1, wherein the first connection member comprises:
   a body configured to pass through an opening at the second arm and a first opening at the rod; and
   a head connected to the body and having a diameter greater than a diameter of the body,
   wherein the first intermediate member has a ring shape,
   wherein an inner circumferential surface of the first intermediate member contacts an outer circumferential surface of the body of the first connection member, and
   wherein an outer circumferential surface of the first intermediate member contacts an inner circumferential surface of the opening at the second arm.

9. The display device of claim 8, wherein the first intermediate member comprises:
   a first flange positioned between the second arm and the rod; and
   a first groove formed at the outer circumferential surface and positioned to face the inner circumferential surface of the opening at the second arm.

10. The display device of claim 9, wherein the first groove is configured to accommodate a lubricant.

11. The display device of claim 9, wherein the first flange is accommodated within the opening at the second arm.

12. The display device of claim 9, further comprising a first fixing member configured to pass through an end of the body of the first connection member opposite the head.

\* \* \* \* \*